(12) United States Patent
Nishiki et al.

(10) Patent No.: US 7,339,192 B2
(45) Date of Patent: *Mar. 4, 2008

(54) FUNCTION LINE AND TRANSISTOR ARRAY USING THE SAME

(75) Inventors: Hirohiko Nishiki, Kashiba (JP); Osamu Sakai, Otsu (JP); Akitsugu Hatano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 14 days.

This patent is subject to a terminal disclaimer.

(21) Appl. No.: 10/496,801

(22) PCT Filed: Nov. 8, 2002

(86) PCT No.: PCT/JP02/11710

§ 371 (c)(1),
(2), (4) Date: Dec. 29, 2004

(87) PCT Pub. No.: WO03/049194

PCT Pub. Date: Jun. 12, 2003

(65) Prior Publication Data

US 2005/0127363 A1 Jun. 16, 2005

(30) Foreign Application Priority Data

Dec. 6, 2001 (JP) ............................. 2001-372902

(51) Int. Cl.
*H01L 27/00* (2006.01)
(52) U.S. Cl. .................. 257/72; 257/E27.131; 349/43; 438/34
(58) Field of Classification Search .................. 257/59, 257/72, E27.13, E27.131; 349/41, 43; 438/34

See application file for complete search history.

(56) References Cited

U.S. PATENT DOCUMENTS 5,286,659 A * 2/1994 Mitani et al. .................. 438/30

(Continued)

FOREIGN PATENT DOCUMENTS

JP 62-165368 7/1987

(Continued)

OTHER PUBLICATIONS

Wu et al. "Integration of Organic LED's and Amorphous Si TFT's onto Flexible and Lightweight Metal Foil Substrates", Dec. 1997, IEEE Electron Device Letters, vol. 18, No. 12, pp. 609-612.*

(Continued)

*Primary Examiner*—Eugene Lee
*Assistant Examiner*—William Kraig
(74) *Attorney, Agent, or Firm*—Keating & Bennet, LLP

(57) ABSTRACT

An active-matrix substrate 30 includes multiple function lines 31, a structure for fixing up the arrangement of the function lines, a first conductive layer 43, a second conductive layer 42, multiple transistors 32 and multiple pixel electrodes 33. Each of the function lines 31 includes: a core 36, at least the surface of which has electrical conductivity; an insulating layer 37 that covers the surface of the core; and a semiconductor layer 38 that covers the insulating layer. Some portions of the first and second conductive layers 43 and 42 overlap with the respective semiconductor layers of the function lines but the others not. The transistors 32 are provided so as to have their channel defined as a region 44 in the semiconductor layer by the first and second conductive layers. The pixel electrodes 33 are electrically connected to the first conductive layer 43.

39 Claims, 35 Drawing Sheets

U.S. PATENT DOCUMENTS

| | | | |
|---|---|---|---|
| 5,798,806 A * | 8/1998 | Tsutsui et al. | 349/29 |
| 5,892,558 A * | 4/1999 | Ge et al. | 349/43 |
| 6,690,438 B2 * | 2/2004 | Sekiguchi | 349/114 |
| 6,885,028 B2 * | 4/2005 | Nishiki et al. | 257/59 |
| 7,019,727 B2 * | 3/2006 | Yokoyama | 345/98 |
| 2004/0170288 A1 | 9/2004 | Maeda | |

FOREIGN PATENT DOCUMENTS

| | | |
|---|---|---|
| JP | 04-219735 | 8/1992 |
| JP | 06-096631 | 4/1994 |
| JP | 07-092493 | 4/1995 |
| JP | 09-0829967 | 3/1997 |
| JP | 09-203910 | 8/1997 |
| JP | 09-266315 | 10/1997 |
| JP | 10-091097 | 4/1998 |
| JP | 11-024106 | 1/1999 |
| JP | 11-052419 | 2/1999 |

OTHER PUBLICATIONS

Serikawa et al., "High-Mobility Poly-Si TFT's Fabricated on Flexible Stainless-Steel Substrates", IEEE Elec. Device Let., Vol. 20, No. 11, Nov. 1999.*

* cited by examiner

FUNCTION LINE AND TRANSISTOR ARRAY USING THE SAME

BACKGROUND OF THE INVENTION

1. Field of the Invention

The present invention relates to a transistor array for use in a liquid crystal display, an organic EL display, an x-ray sensor, a memory and other electronic apparatuses, and also relates to an active-matrix substrate including such a transistor array and methods for fabricating the transistor array and the active-matrix substrate. The present invention further relates to a function line for use to fabricate the transistor array, a semiconductor device including the transistor array, and a display device including the active-matrix substrate.

2. Description of the Related Art

An active-matrix-addressed liquid crystal display (LCD), which uses thin-film transistors (TFTs) as its switching elements, achieves a display quality that is at least comparable to, and often superior to, that of the conventional cathode-ray tube (CRT) display. Also, an active-matrix-addressed LCD is a thin and lightweight display device that realizes a high resolution with significantly reduced power dissipation. Furthermore, an active-matrix-addressed LCD is also implementable as a display device with a huge screen. Having all of these advantageous features, the active-matrix-addressed LCD is currently being popularized rapidly in various fields of applications and is expected to be a next-generation image display device that replaces the conventional CRT in the very near future. Meanwhile, an organic EL display, which uses an organic electroluminescent material as a display medium, has also attracted much attention in the art recently and is also considered to be among potential next-generation image display devices.

Recently, these next-generation image display devices are not just used as alternatives to the conventional CRTs but are also the objects of vigorous research and development to realize so-called "electronic paper". That is to say, these display devices are currently under modification so as to provide replacements for conventional paper-printed materials. For that purpose, those image display devices should be made as "flexible displays", which never experience failure even when folded or rolled and which are readily portable at any time.

To make such a flexible display by conventional manufacturing technologies that have been applied to fabricate an LCD or an organic EL display, glass, which has been used extensively as a substrate material, needs to be replaced with some elastic substrate material that is deformable even at room temperature (e.g., plastic or stainless steel).

However, such an elastic material poorly resists the heat. For example, when exposed to intense heat, a plastic substrate may deteriorate, emit a toxic gas, or be deformed or warped excessively. Also, even if a heat-resistant plastic or stainless steel is used as a substrate material, the substrate made of such a material is also deformed or warped due to a non-negligible difference in thermal expansion coefficients between that substrate and a thin film to be deposited on the substrate. Accordingly, to avoid these unwanted situations, a substrate made of such a poorly heat resistant material should not be exposed to heat in excess of about 200° C.

However, some of the conventional manufacturing and processing steps that have been carried out to fabricate an image display device require a processing temperature that exceeds about 200° C. For example, in the manufacturing and processing step of making an amorphous silicon TFT, which is used as a switching element for an image display device, the gate insulating film and amorphous silicon film of the TFT are normally formed at temperatures exceeding about 300° C. Accordingly, if the heat resistant plastic or stainless steel is used as a substrate material, the conventional manufacturing process cannot be used as it is.

Stated otherwise, the plastic or stainless steel may be used as a substrate material for an image display device if the gate insulating film and amorphous silicon film of the amorphous silicon TFT can be formed at temperatures of less than about 200° C. In that case, however, a high quality gate insulating film or amorphous silicon film (e.g., a film exhibiting good dielectric strength, in particular) is very hard to obtain. Also, when a TFT is made of those poor quality films, the threshold value of the TFT will change significantly after long hours of operation.

Recently, an LCD that uses polysilicon TFTs as its switching elements has been researched and developed vigorously. An image display device of this type is partly characterized by providing a circuit for controlling a drive signal for the display device on a glass substrate. Thus, compared to the LCD that uses amorphous silicon TFTs as its switching elements, the LCD including the polysilicon TFTs achieves a higher resolution.

In an LCD including polysilicon TFTs, however, the driver thereof (e.g., a CMOS inverter) needs to be made of a polysilicon with an electron mobility typically exceeding about 100 $cm^2/V \cdot s$. It is not easy to deposit such a polysilicon on a glass substrate. For example, the silicon on the glass substrate should be fused with the temperature of the glass substrate maintained at about 600° C. or less by some special technique such as a laser annealing process. Accordingly, it is difficult to apply the technique requiring such a high-temperature process to an image display device that uses plastic or stainless steel as a substrate material.

To overcome these problems, Japanese Laid-Open Publication No. 10-91097 discloses a display device including a string of transistors. In the transistor string, a number of transistors are arranged along the length of a conductor core on which an insulating film, a silicon film and an $n^+$-type ohmic contact layer are stacked in this order. In this technique, the gate insulating film and the silicon film that require high-temperature processing are included in the transistor string, which is bonded onto a substrate after those films have been stacked on the conductor core. Thus, the substrate is never exposed to heat. For that reason, a substrate having a low distortion point (e.g., a plastic substrate) may be used.

Japanese Laid-Open Publication No. 9-203910 also discloses a similar technique of making a display device by using a string of transistors that are arranged along the length of a metal line.

In this conventional technique, first, an insulating film and a semiconductor film are deposited in this order all over a metal core and then an $n^+$ film is further deposited thereon so as to cover the semiconductor film. Next, the $n^+$ film is patterned by a normal photolithographic process, thereby defining source/drain regions of the $n^+$ layer and arranging a number of transistors along the metal line. Thereafter, the metal line is bonded onto a substrate such that the source/drain regions are connected to the source and pixel electrodes, respectively.

In this case, the patterned $n^+$ layer on the metal line all needs to be connected with metal interconnects. To connect the patterned $n^+$ layer on the metal line in its entirety just as intended, at least approximately 1,000 metal interconnects need to be arranged on the substrate with no misalignment at all, which is rather difficult to realize in an actual manufacturing process.

For example, suppose a metal line 504, in which a transistor 503 is defined so as to have source/drain regions ($n^+$ layer 501) and a channel region 502, needs to be arranged with respect to a source line 505 and a drain electrode 506 as shown in FIG. 73. Also, suppose the $n^+$ layer 501 has a length of 20 µm, the distance from the end of the source line 505 or the end of the drain electrode 506 to the channel region 502 is 5 µm each, and the channel length is 5 µm. These dimensions are just as defined by the design rules of a typical conventional TFT and are approximately equal to the exemplary design values disclosed in Japanese Laid-Open Publication No. 9-203910.

If the metal line 504 could be arranged exactly at the intended location with no shifting at all, then the source line 505 and drain electrode 506 would be located over the $n^+$ layer 501 of the metal line 504 with a margin of 5 µm provided on each side of the channel region 502 as shown in FIG. 73. However, if just one of approximately 1,000 metal lines 504 shifted from its intended location by 5 µm or more, then all of the transistors on the metal line 504 would have their effective channel length changed and exhibit a different characteristic from that of the transistors on the other metal lines 504. Also, if the metal line 504 shifted from its intended location by 10 µm or more as shown in FIG. 74, then leakage failure would occur between the source/drain regions to make all of the transistors on the metal line 504 defective (i.e., to cause a line defect). Such a problem may occur even when the technique disclosed in Japanese Laid-Open Publication No. 10-91097 is adopted.

In this manner, according to the conventional technique described above, even the shift of just one metal line should affect all of the transistors on that metal line to cause a line defect. Then, the display device itself could become a non-repairable defective product.

Furthermore, Japanese Laid-Open Publication No. 9-203910 discloses that the entire surface be covered with an organic insulating film except portions of the source lines and drain electrodes for the purpose of planarization, for example. More specifically, as shown in FIG. 75, an organic insulating film 508 is provided so as to cover the source lines 505 and drain electrodes 506 and have contact holes 507 that expose portions of the source lines 505 and portions of the drain electrodes 506. The metal line 504 is arranged such that the $n^+$ layer 501 of the transistor 503 is connected to the source line 505 and drain electrode 506 by way of those contact holes 507. In that case, once the contact holes 507 have shifted from their intended locations, even if the source line 505 and drain electrode 506 are arranged appropriately with respect to the metal line 504, the metal line 504 cannot be electrically connected to the source line 505 or drain electrode 506 anymore as shown in FIG. 76. In other words, alignment must be carried out in this case among the contact holes 507 of the metal line 504, source line 505 and drain electrode 506.

As for a liquid crystal display device including conventional TFTs to be provided on a glass substrate by a thin film technology, such alignment is sometimes not so difficult. However, if a thick organic insulating film 508 is provided for the purpose of planarization or if a plastic substrate to be deformed significantly when absorbing water or heat is used, it is very difficult to carry out the alignment highly accurately.

In order to overcome the problems described above, an object of the present invention is to provide an active-matrix substrate, in which a plurality of transistors are arranged with no misalignment at all on a base substrate that is deformable elastically at an ordinary temperature, and a display device including such an active-matrix substrate. Another object of the present invention is to provide a transistor array, in which a plurality of transistors are arranged with no misalignment at all, and a semiconductor device including such a transistor array. Still another object of the present invention is to provide a method for fabricating such a transistor array, a method for fabricating such an active-matrix substrate, and a function line for use in such a transistor array.

SUMMARY OF THE INVENTION

A function line according to the present invention includes: a core, at least the surface of which has electrical conductivity; a first insulating layer covering the surface of the core; a semiconductor layer covering the first insulating layer; and a second insulating layer covering the semiconductor layer.

In one preferred embodiment, the first insulating layer, the semiconductor layer and the second insulating layer cover the core substantially entirely.

In another preferred embodiment, the core may be made of a metal. Alternatively, the core may include: an electrically insulating fine wire; and a conductive layer covering the fine wire.

In another preferred embodiment, the core preferably has a diameter of 5 µm to 1,000 µm and the second insulating layer preferably has a thickness of at least 10 nm. The semiconductor layer is preferably made of a transparent semiconductor.

In another preferred embodiment, the function line further includes an opaque layer, which is provided so as to cover the second insulating layer. The second insulating layer may have light blocking ability.

A transistor array according to the present invention includes: a plurality of function lines, each including a core, at least the surface of which has electrical conductivity, an insulating layer covering the surface of the core, and a semiconductor layer covering the insulating layer; a fixing structure for fixing up the relative arrangement of the function lines; and a plurality of transistors, each including a first conductive layer and a second conductive layer. Some portions of the first and second conductive layers overlap with the respective semiconductor layers of the function lines but the others not, and the transistors are provided so as to have their channel defined as a region in the semiconductor layer by the first and second conductive layers. The function line of the transistor array may have any of the features of the function line described above.

In one preferred embodiment, the fixing structure may include a planarizing layer that fills in gaps between the function lines. The core preferably has a tensile strength of 100 MPa to 1,000 MPa along its length.

After the insulating layer and the semiconductor layer have been deposited so as to cover the core, the function lines are preferably fixed up with the fixing structure.

In another preferred embodiment, each said transistor may further include a third conductive layer, which is connected to the second conductive layer. Some portions of the third conductive layer may overlap with the semiconductor layer but the others not. The first conductive layer may be sandwiched between the second and third conductive layers. Also, each of the function lines may have a plurality of grooves to divide the semiconductor layer into multiple sections such that the grooves crosses the length of the function line.

An active-matrix substrate according to the present invention includes: a plurality of function lines, each including a core, at least the surface of which has electrical conductivity, an insulating layer covering the surface of the core, and a semiconductor layer covering the insulating layer; a fixing structure for fixing up the relative arrangement of the function lines; a plurality of transistors, each including a first conductive layer and a second conductive layer, where some portions of the first and second conductive layers overlap with the respective semiconductor layers of the function lines but the others not, and where the transistors are provided so as to have their channel defined as a region in the semiconductor layer by the first and second conductive layers; and a plurality of pixel electrodes, which are electrically connected to the first conductive layer.

In one preferred embodiment, the active-matrix substrate includes any of the features of the transistor array described above.

In another preferred embodiment, the fixing structure includes a base substrate and an adhesive layer, and the function lines are bonded onto the base substrate with the adhesive layer.

In another preferred embodiment, the base substrate has a plurality of grooves on the surface thereof, and at least some of the function lines are bonded onto the base substrate with the adhesive layer so as to be embedded in the grooves. The adhesive layer may include a light blocking substance. The planarizing layer may also include a light blocking substance.

In another preferred embodiment, the active-matrix substrate further includes a plurality of storage capacitor lines, each including a core, the surface of which is electrically conductive, and an insulating layer covering the surface of the core, and the storage capacitor lines overlap with each other under the pixel electrodes.

In another preferred embodiment, the base substrate is made of a plastic with elasticity. The second conductive layer may be a data line. Alternatively, the second conductive layer may also be a reference potential supply line.

An active-matrix substrate according to the present invention includes a pixel region including a plurality of pixel electrodes and a driver circuit for driving the pixels. The driver circuit includes a p-type function line with a PMOS transistor, an n-type function line with an NMOS transistor, a fixing structure for fixing up the relative arrangement of the p-type and n-type function lines, and an interconnect for connecting the PMOS and NMOS transistors together so as to make a CMOS device. The PMOS transistor includes a core, a semiconductor layer covering, the surface of the core, an insulating layer covering the semiconductor layer, and at least one gate electrode on the surface of the insulating layer and has a p-channel defined in the semiconductor layer by the gate electrode. The NMOS transistor includes a core, a semiconductor layer covering the surface of the core, an insulating layer covering the semiconductor layer, and at least one gate electrode on the surface of the insulating layer and has an n-channel defined in the semiconductor layer by the gate electrode.

Another active-matrix substrate according to the present invention includes a pixel region including a plurality of pixel electrodes and a driver circuit for driving the pixels. The driver circuit includes a foil substrate and an NMOS transistor and a PMOS transistor, which are held on the foil substrate and connected together so as to make a CMOS device.

In one preferred embodiment, the pixel region includes: a plurality of function lines, each including a core, at least the surface of which has electrical conductivity, an insulating layer covering the surface of the core, and a semiconductor layer covering the insulating layer; a fixing structure for fixing up the relative arrangement of the function lines; a plurality of transistors, each including a first conductive layer and a second conductive layer, where some portions of the first and second conductive layers overlap with the respective semiconductor layers of the function lines but the others not, and where the transistors are provided so as to have their channel defined as a region in the semiconductor layer by the first and second conductive layers; and a plurality of pixel electrodes, which are electrically connected to the first conductive layer.

A semiconductor device according to the present invention includes the transistor array described above.

A display device according to the present invention includes: the active-matrix substrate described above; a counter substrate; and a display medium layer sandwiched between the substrates.

A method for fabricating a transistor array according to the present invention includes the steps of: preparing a plurality of function lines, each including a core, at least the surface of which has electrical conductivity, an insulating layer covering the surface of the core, and a semiconductor layer covering the insulating layer; fixing up the relative arrangement of the function lines with a fixing structure; and providing a first conductive layer and a second conductive layer such that some portions of the first and second conductive layers overlap with the respective semiconductor layers of the function lines but the others not, thereby forming a plurality of transistors having their channel defined as a region in the semiconductor layer by the first and second conductive layers.

A method for fabricating an active-matrix substrate according to the present invention includes the steps of: preparing a plurality of function lines, each including a core, at least the surface of which has electrical conductivity, an insulating layer covering the surface of the core, and a semiconductor layer covering the insulating layer; fixing up the relative arrangement of the function lines with a fixing structure; providing a first conductive layer and a second conductive layer such that some portions of the first and second conductive layers overlap with the respective semiconductor layers of the function lines but the others not, thereby forming a plurality of transistors having their channel defined as a region in the semiconductor layer by the first and second conductive layers; and forming a plurality of pixel electrodes, which are electrically connected to the first conductive layer of the transistors.

In one preferred embodiment, the first conductive layer of the transistors and the pixel electrodes are formed simultaneously. Also, the step of fixing the arrangement includes the steps of: bonding the function lines onto the base substrate with an adhesive layer; and filling in gaps between the function lines with a planarizing layer at least partially.

In another preferred embodiment, the active-matrix substrate fabricating method of the present invention may further include the step of preparing a plurality of storage capacitor lines, each including a core, the surface of which is electrically conductive, and an insulating layer covering the surface of the core. The step of fixing the arrangement may include the steps of: pressing the function lines and the storage capacitor lines onto a plastically deformable layer, thereby embedding the function and storage capacitor lines to a predetermined depth in the plastically deformable layer; burying portions of the function and storage capacitor lines, which are exposed over the plastically deformable layer, in a curable resin on the base substrate; and curing the curable resin and then removing the plastically deformable layer.

Another method for fabricating an active-matrix substrate according to the present invention includes the step of preparing a p-type function line and an n-type function line and fixing up the relative arrangement of the p-type and n-type function lines. The p-type function line includes a PMOS transistor, which includes: a core; a semiconductor layer covering the surface of the core; an insulating layer covering the semiconductor layer; and at least one gate electrode on the surface of the insulating layer and which has a p-channel defined in the semiconductor layer by the gate electrode. The n-type function line includes an NMOS transistor, which includes: a core; a semiconductor layer covering the surface of the core; an insulating layer covering the semiconductor layer; and at least one gate electrode on the surface of the insulating layer and which has an n-channel defined in the semiconductor layer by the gate electrode. The method further includes the step of forming an interconnect that connects the PMOS and NMOS transistors together so as to make a CMOS device.

DETAILED DESCRIPTION OF PREFERRED EMBODIMENTS

Hereinafter, preferred embodiments of a function line, a transistor array, an active-matrix substrate, a semiconductor device, a display device, a method for fabricating the transistor array and a method for fabricating the active-matrix substrate according to the present invention will be described.

Embodiment 1

Hereinafter, a function line according to a preferred embodiment of the present invention will be described first.

Figure 1:
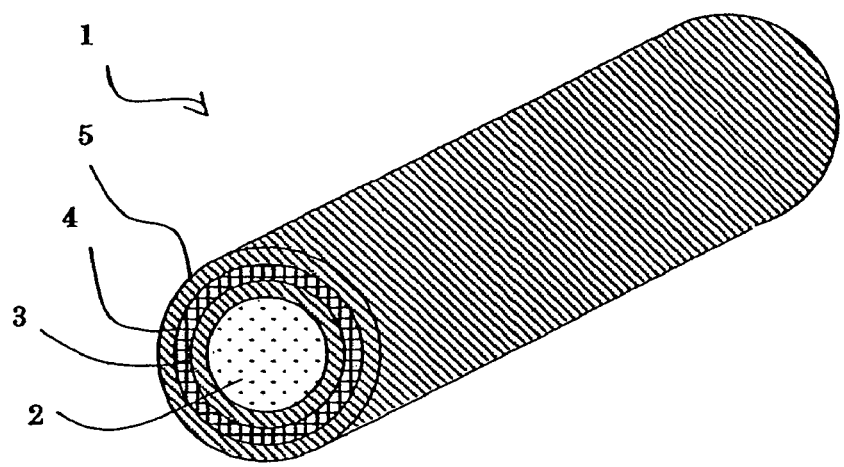
FIG. 1 is a perspective view illustrating a function line according to a first preferred embodiment.

As shown in FIG. 1, a function line 1 according to the present invention includes a core 2, a first insulating layer 3 covering the surface of the core, a semiconductor layer 4 covering the first insulating layer 3, and a second insulating layer 5 covering the semiconductor layer 4. In FIG. 1, the function line 1 is illustrated as having a concentric cross-sectional structure. Alternatively, the function line 1 may also have an eccentric structure. As used herein, "to cover" may refer to either a situation where a predetermined region is covered fully or a situation where the same region is covered just partially.

At least the surface of the core 2 needs to be electrically conductive. For instance, the core 2 may be made of a metal entirely or may consist of an electrically insulating fine wire and a conductive layer, which is made of a metal, for example, so as to cover the fine wire. The cross section of the core 2 may not only be circular as shown in FIG. 1 but also be elliptical, triangular, rectangular or polygonal, for example. The core preferably has a diameter of 5 μm to 1,000 μm and a tensile strength of 100 MPa to 1,000 MPa along its length.

The core 2 may be made of any of various materials. In any case, however, the material selected for the core 2 needs to show no deformation or degradation at temperatures at which the first insulating layer 3, semiconductor layer 4 and second insulating layer 5, covering the surface of the core 2, are formed. Also, the linear expansivities of the core 2, insulating layer 3, semiconductor layer 4 and second insulating layer 5 are preferably not different significantly from each other.

The first insulating layer 3 may be made of any of various insulating film materials (e.g., silicon dioxide or silicon nitride) for a semiconductor device. As will be described later, if the core 2 is used as a gate electrode, the first insulating layer 3 functions as a gate insulating film. In that case, the first insulating layer 3 preferably has high density and high dielectric strength.

The semiconductor layer 4 preferably has a thickness of 10 nm to 300 nm, for example. Also, the semiconductor layer 4 preferably has no grooves that divide itself along the length of the function line 1 so as to be continuous in the length direction. The semiconductor layer 4 may be made of any of various semiconductor materials including silicon and gallium arsenide. Optionally, the semiconductor layer 4 may also be made of a transparent semiconductor material (e.g., zinc oxide), which is transparent to visible radiation. Even when exposed to visible radiation, a transparent semiconductor causes just a slight variation in resistivity and hardly deteriorates. Accordingly, if the semiconductor layer 4 is made of such a transparent semiconductor, the function line 1 rarely causes a leakage failure or exhibits deteriorated semiconductor properties even when exposed to light.

The second insulating layer 5 is provided for the purpose of protecting the semiconductor layer 4. To protect the semiconductor layer 4 from oxygen or water in the air just as intended, the second insulating layer 5 preferably has a thickness of at least 10 nm.

Figure 2:
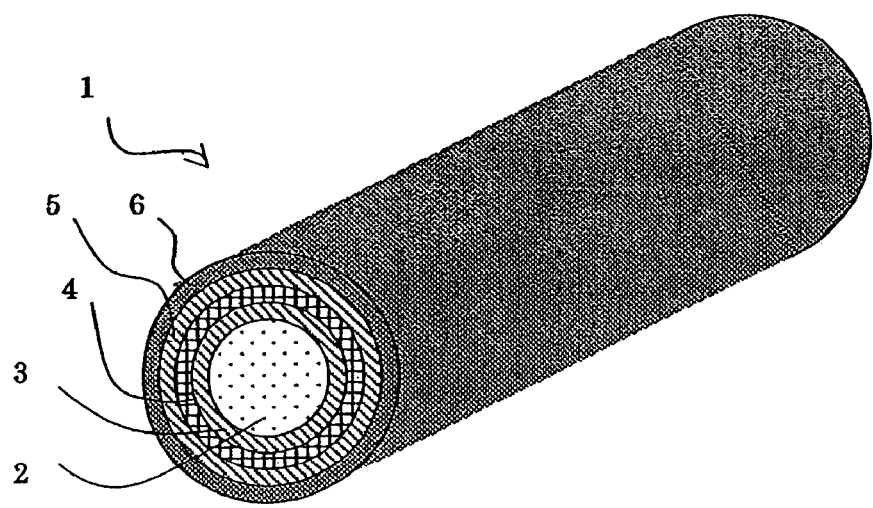
FIG. 2 is a perspective view illustrating a modified example of the first preferred embodiment.

As shown in FIG. 2, the function line 1 may further include an opaque layer 6 that further covers the second insulating layer 5. Alternatively, the second insulating layer 5 may be made opaque by adding a light blocking substance to the second insulating layer 5 of the function line 1 shown in FIG. 1.

In this structure, by choosing an appropriate material for the core 2, the second insulating layer 5 and semiconductor layer 4 can be formed at temperatures of 400° C. to 600° C., for example. Accordingly, a silicon dioxide or silicon nitride film with a high density and a high dielectric strength may be formed as the second insulating layer 5 and a polysilicon film with a high electron mobility may be formed as the semiconductor layer 4.

In the manufacturing process of a semiconductor device, if this function line 1 is fixed as a structure including a gate insulating film and a semiconductor layer onto a substrate, for example, then the substrate will not be exposed to a high-temperature process to be carried out to form the gate insulating film and semiconductor layer. Accordingly, the semiconductor device can be fabricated even if the substrate is made of a material that deforms at a high temperature.

Furthermore, no semiconductor device active regions to operate the semiconductor layer 4 as devices are defined in the semiconductor layer 4 of the function line 1 of the present invention. Accordingly, the semiconductor device active regions may be defined in the semiconductor layer 4 after the function line 1 has been fixed onto a substrate, for example. In other words, in fixing the function line 1 onto the substrate, there is no need to align the function line 1 with the substrate at least along the length of the function line 1. Consequently, no alignment is needed between semiconductor devices to be formed by the function line 1 and the substrate.

Also, the outer surface of the semiconductor layer 4 is coated with the second insulating layer 5, and therefore, the semiconductor layer 4 can exhibit stabilized properties without deteriorating or oxidizing. For that reason, the function line 1 can also be stored in the air.

Figure 3:
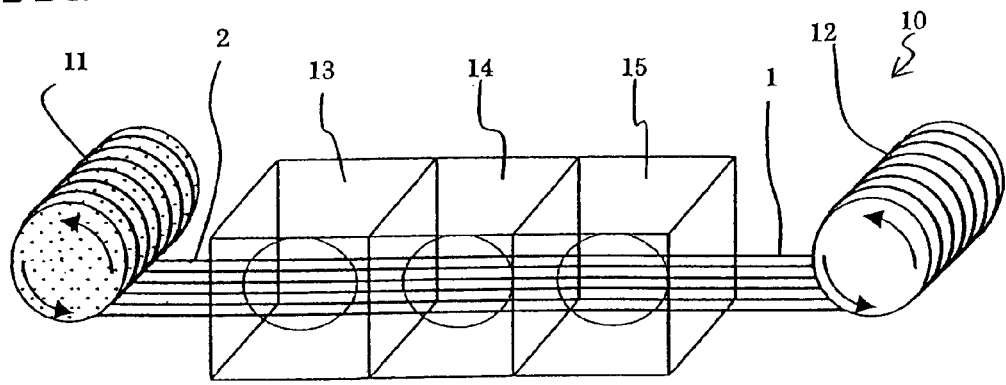
FIG. 3 is a schematic representation illustrating a roll-to-roll coater for use to make a function line.

The function line 1 may be produced with the roll-to-roll coater 10 shown in FIG. 3, for example. The roll-to-roll coater 10 includes a feed roll 11, around which the core 2 is wound, a take-up roll 12, and first, second and third deposition chambers 13, 14 and 15 provided between the feed and take-up rolls 11 and 12. In this preferred embodiment, a copper wire is used as the core 2 and a silicon nitride film, an amorphous silicon film and a silicon nitride film are deposited by a plasma-enhanced CVD (PECVD) process in the first, second and third chambers 13, 14 and 15, respectively. Alternatively, the films making up the function line 1 may also be formed by any other thin film deposition process such as a (low-pressure or atmospheric pressure) thermal CVD process, a vacuum evaporation process or a sputtering process, for example.

Although not shown in FIG. 3, the feed roll 11, take-up roll 12 and first, second and third deposition chambers 13, 14 and 15 are shut off from the external environment with boundary walls or doors and are connected to an exhaust pump, process gas tubes and so on as in a normal vacuum evaporation system. Also, roll chambers (not shown) in which the feed and take-up rolls 11 and 12 are stored are connected to the first, second and third deposition chambers 13, 14 and 15 by way of passages that are high enough (e.g., about 5 mm) for the core 2 or function line 1 to pass through. This coater 10 is designed so as to create a pressure difference between the roll chamber and the first and second deposition chambers 13 and 14 by a differential pumping technique. In the first, second and third deposition chambers 13, 14 and 15, a gas that reacts with water or oxygen in the air (e.g., a monosilane gas) is used as a process gas. Accordingly, the pressures in the first, second and third deposition chambers 13, 14 and 15 are preferably always kept lower than that in the roll chambers. Then, the process gas will neither remain in, nor leak into, the roll chambers. In addition, no films will be formed in the roll chambers, either.

The roll-to-roll coater 10 shown in FIG. 3 includes one feed roll 11 and one take-up roll 12. Alternatively, the cores 2 may be delivered from a plurality of feed rolls 11 and recovered on a plurality of take-up rolls 12.

In this preferred embodiment, a copper wire with a diameter of 10 μm is used as the core 2. A feed roll 11, around which 200 cores 2 are wound, is prepared. The cores 2 are arranged so as to pass the first, second and third deposition chambers 13, 14 and 15 while being substantially parallel to each other, and then the respective ends of the cores 2 are hooked on the take-up roll 12. Subsequently, after the roll-to-roll coater 10 has been evacuated, films are deposited on the cores 2 being fed into the first, second and third deposition chambers 13, 14 and 15 at a rate of 5 m/min. If the silicon nitride film, amorphous silicon film and silicon nitride film are deposited at deposition rates of 500 nm/min, 50 nm/min and 500 nm/min in the first, second and third deposition chambers 13, 14 and 15, respectively, and if the cores 2 being fed through the first, second and third deposition chambers 13, 14 and 15 have lengths of 3 m, 4 m and 2 m, respectively, along their lengths, then the first insulating layer 3, semiconductor layer 4 and second insulating layer 5 (see FIG. 1) will have thicknesses of 300 nm, 40 nm and 200 nm, respectively.

If a function line 1 is produced for 1,000 minutes a day with this roll-to-roll coater 10, then the function line 1 obtained by the single roll-to-roll coater 10 will have a length of 1,000 km. And when the function line 1 is used as switching elements for an LCD, one thousand 45-inch high-definition TV sets can be manufactured from the function line 1 with such a length.

The function line 1 made by the method described above may be fixed onto a substrate by the following method, for example.

In this preferred embodiment, the function lines 1 are bonded onto an adhesive film first, which is then attached onto the substrate. In the bonder 16 shown in FIG. 4, the function lines 1, which have been delivered from the roll 12, are pressed against, and bonded to, an adhesive film 17, which has been fed out from a roll 18, between two more rolls 19 and 20. In this process step, the gap between the function lines 1 is adjusted to a desired value. The adhesive film 17 onto which the function lines 1 have been bonded is reeled up on another roll 21. Such an apparatus is disclosed in Japanese Laid-Open Publication No. 6-96631, for example. Before the function lines 1 are bonded onto the adhesive film 17, a black resin may be applied thereto by a black resin coater 21, dried and then the opaque layer 6 (see FIG. 2) may be provided thereon so as to coat the second insulating layer 5 of the function lines 1.

Figure 5:
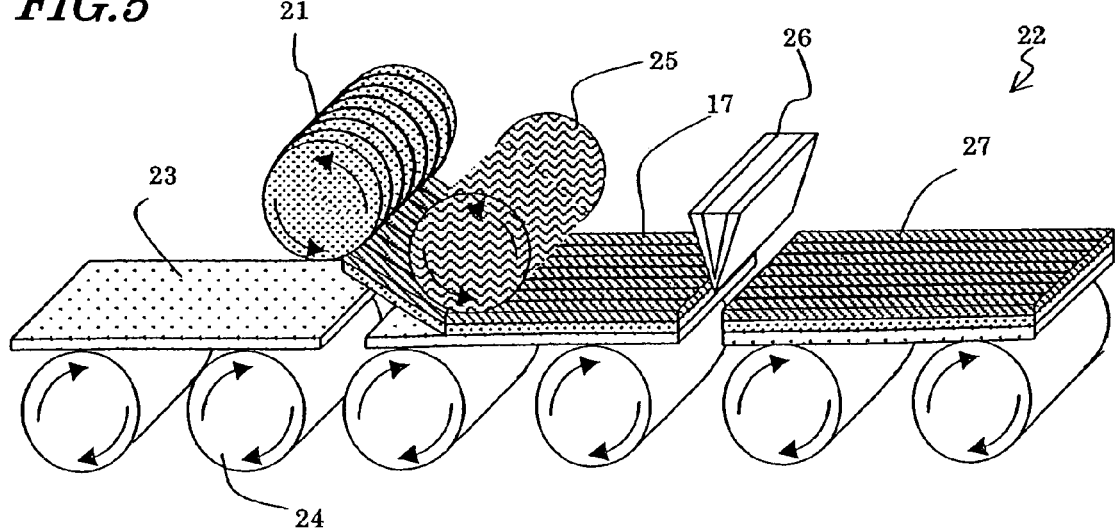
FIG. 5 is a schematic representation illustrating an apparatus for bonding the film with the function line onto a substrate.

The function lines 1 that have been bonded onto the film 17 is further bonded onto a heat resistant plastic substrate 23 using a laminator 22 as shown in FIG. 5. For example, a known dry film lamination technology may be applied to the laminator 22. In the laminator 22, as the film 17 with the function lines 1 bonded thereon is delivered from the roll 21, the heat resistant plastic substrate 23 is transported by rollers 24. The film 17 with the function lines 1 bonded thereon is pressed by a roller 25 against the heat resistant plastic substrate 23 so as to be bonded onto the substrate 23. Thereafter, the film 17 is cut with a cutter 26 to the sizes of the heat resistant plastic substrate 23, thereby completing a heat resistant plastic substrate 27 to which the function lines 1 have been fixed.

In the preferred embodiment described above, the function lines 1 are fixed onto the heat resistant plastic substrate 23 along with the film 17. However, the function lines 1 do not have to be fixed onto the substrate by this method. For example, in the laminator 22, the film 17 may be arranged such that the surface on which the function lines 1 have been bonded is opposed to the heat resistant plastic substrate 23 and then the function lines 1 may be transferred onto the heat resistant plastic substrate 23. Alternatively, after having reeled up on the roll 12 once, the function lines 1 may be re-delivered from the roll 12 and directly adhered onto the heat resistant plastic substrate 23, for example. Optionally, even the film 17 on which the function lines 1 were bonded may be used as a substrate to make a display device thereon.

Embodiment 2

Hereinafter, preferred embodiments of a transistor array and an active-matrix substrate according to the present invention will be described.

Figure 6:
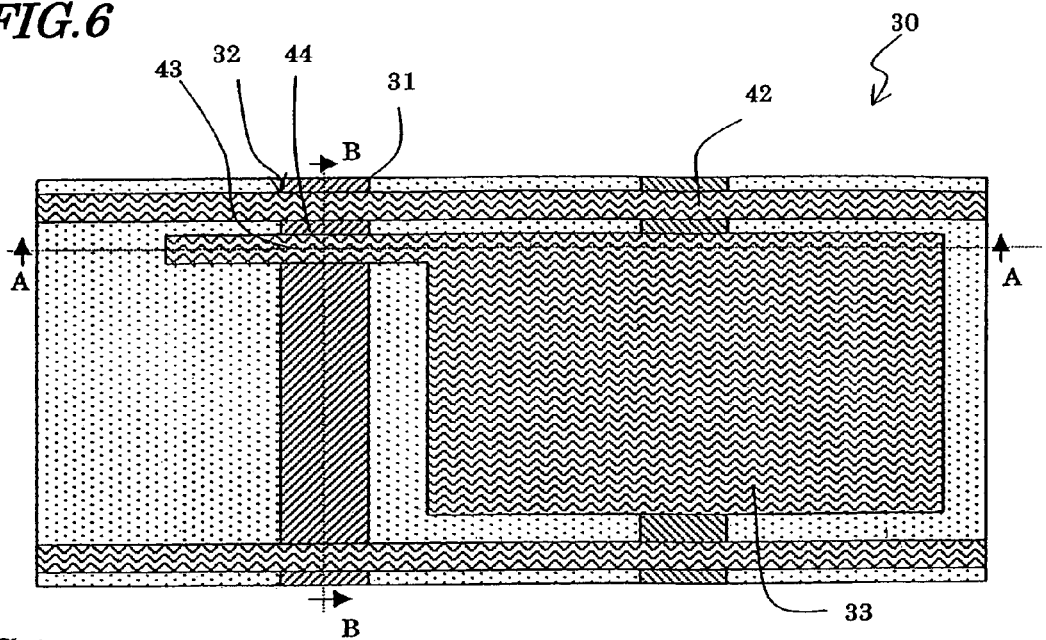
FIG. 6 is a plan view illustrating an active-matrix substrate according to a second preferred embodiment.
Figure 7:
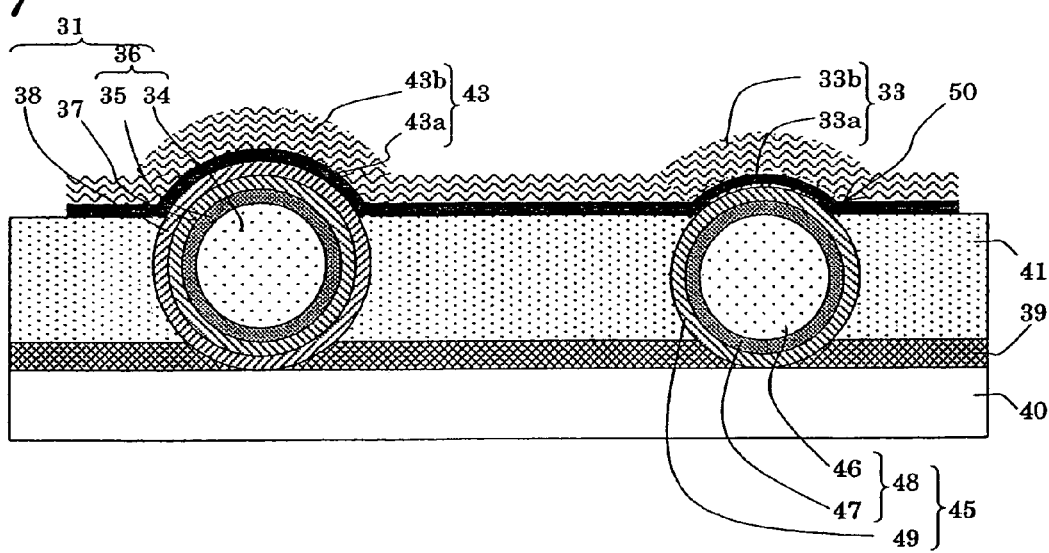
FIG. 7 is a cross-sectional view thereof taken on the plane A-A shown in FIG. 6.
Figure 8:
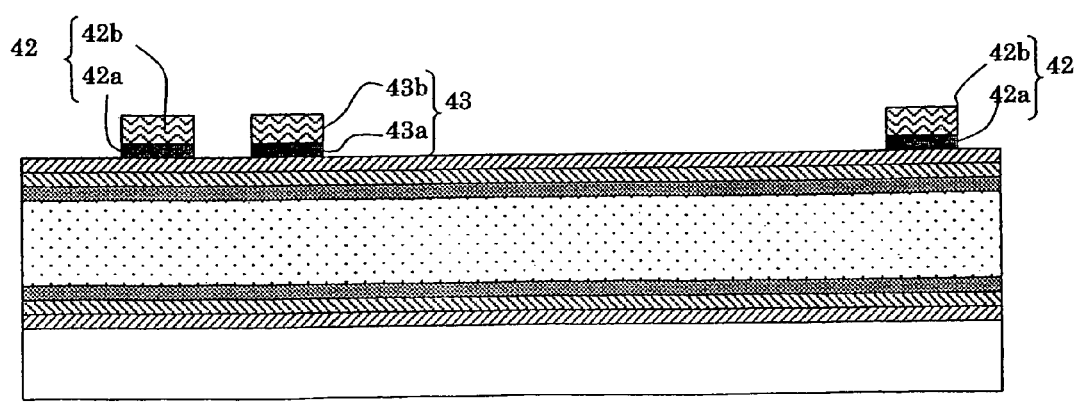
FIG. 8 is a cross-sectional view thereof taken on the plane B-B shown in FIG. 6.

An active-matrix substrate according to the present invention includes a transistor array, in which a number of transistors are arranged, and has a structure in which a pixel electrode is connected to each of those transistors. FIG. 6 is a plan view illustrating one pixel portion of an active-matrix substrate 30 according to the present invention. FIGS. 7 and 8 respectively illustrate cross sections thereof as taken on the planes A-A and B-B shown in FIG. 6. The active-matrix substrate 30 has a structure in which a number of the same unit elements are arranged repeatedly and regularly both horizontally and vertically.

Each pixel of the active-matrix substrate 30 includes a function line 31, a transistor 32 provided as a portion of the function line 31, and a pixel electrode 33 connected to the transistor 32.

The function line 31 is fixed onto a plastic base substrate 40 with an adhesive layer 39. Furthermore, the gap between the function lines 31 of two horizontally adjacent pixels in FIG. 7 is filled with a planarizing layer 41. In this manner, the arrangement of the function lines 31 is fixed. In addition, the level difference between the top of the function lines 31 and their surrounding portions can be reduced.

The function line 31 includes a core 36, consisting of a fine wire 34 of a carbon fiber and a conductive layer 35 of Ta that covers the fine wire 34, a first insulating layer 37 of silicon nitride, and a semiconductor layer 38 of amorphous silicon. The function line 31 preferably has the features as described for the first preferred embodiment. In this preferred embodiment, the second insulating layer is removed in advance from the function line 31. This structure of the function line 31 is completed before the arrangement of the function lines 31 is fixed (more specifically, before the function lines 31 are fixed onto the base substrate 40).

The transistor 32 includes a drain electrode 43 and a data line 42 as first and second conductive layers, respectively. The drain electrode 43 extends from, and is electrically connected to, the pixel electrode 33. The drain electrode 43 and pixel electrode 33 are combined together in this preferred embodiment but may be formed as separate members and electrically connected together. Each of the data line 42 and drain electrode 43 includes a portion, which overlaps with, and is electrically connected to, the exposed portion of the semiconductor layer 38 on the planarizing layer 41, and another portion, which is provided over, and supported by, the planarizing layer 41. The latter portion of the data line 42 and drain electrode 43, which is supported by the planarizing layer 41, does not overlap with the semiconductor layer 38.

Each of the data line 42, drain electrode 43 and pixel electrode 33 includes an $n^+$ layer 42$a$, 43$a$ or 33$a$ and a metal layer 42$b$, 43$b$ or 33$b$ of tantalum. The $n^+$ layers 42$a$ and 43$a$ are provided such that the semiconductor layer 38 can make a good ohmic contact with the data line 42 and drain electrode 43. However, if a low-resistance ohmic contact can be made by selecting appropriate materials for the data line 42, drain electrode 43 and semiconductor layer 38, the $n^+$ layers 42$a$ and 43$a$ are not necessary. For example, zinc oxide can make a low-resistance ohmic contact with a certain type of metal. Accordingly, if the semiconductor layer 38 is made of zinc oxide, then there is no need to provide the $n^+$ layers 42$a$ and 43$a$. Alternatively, a material that fuses at a temperature of less than 200° C. to make an alloy with the semiconductor layer 38 may be used instead of the $n^+$ layers 42$a$ and 43$a$.

The region 44 defined by the data line 42 and drain electrode 43 in the semiconductor layer 38 functions as a channel for the transistor 32. Also, the core 36 and first insulating layer 37 of the function line 31 function as a gate electrode and a gate insulating film, respectively.

Since the active-matrix substrate 30 has such a structure, the drain electrode 43 and data line 42 to function as the first and second conductive layers are not provided until the function lines 31 are fixed onto the base substrate 40 and the planarizing layer 41 is provided thereon. The channel of the transistor 32 is not defined, either, until then.

A storage capacitor line 45 is provided under the pixel electrode 33. The storage capacitor line 45 includes a core 48, consisting of a fine wire 46 of a carbon fiber and a Ta film 47 that covers the fine wire 46, and an insulating layer 49 of silicon nitride. And a storage capacitor 50 is formed by the insulating layer 49 that is sandwiched between the n+ layer 33$a$ of the pixel electrode 33 and the Ta film 47 of the storage capacitor line 45.

Figure 9:
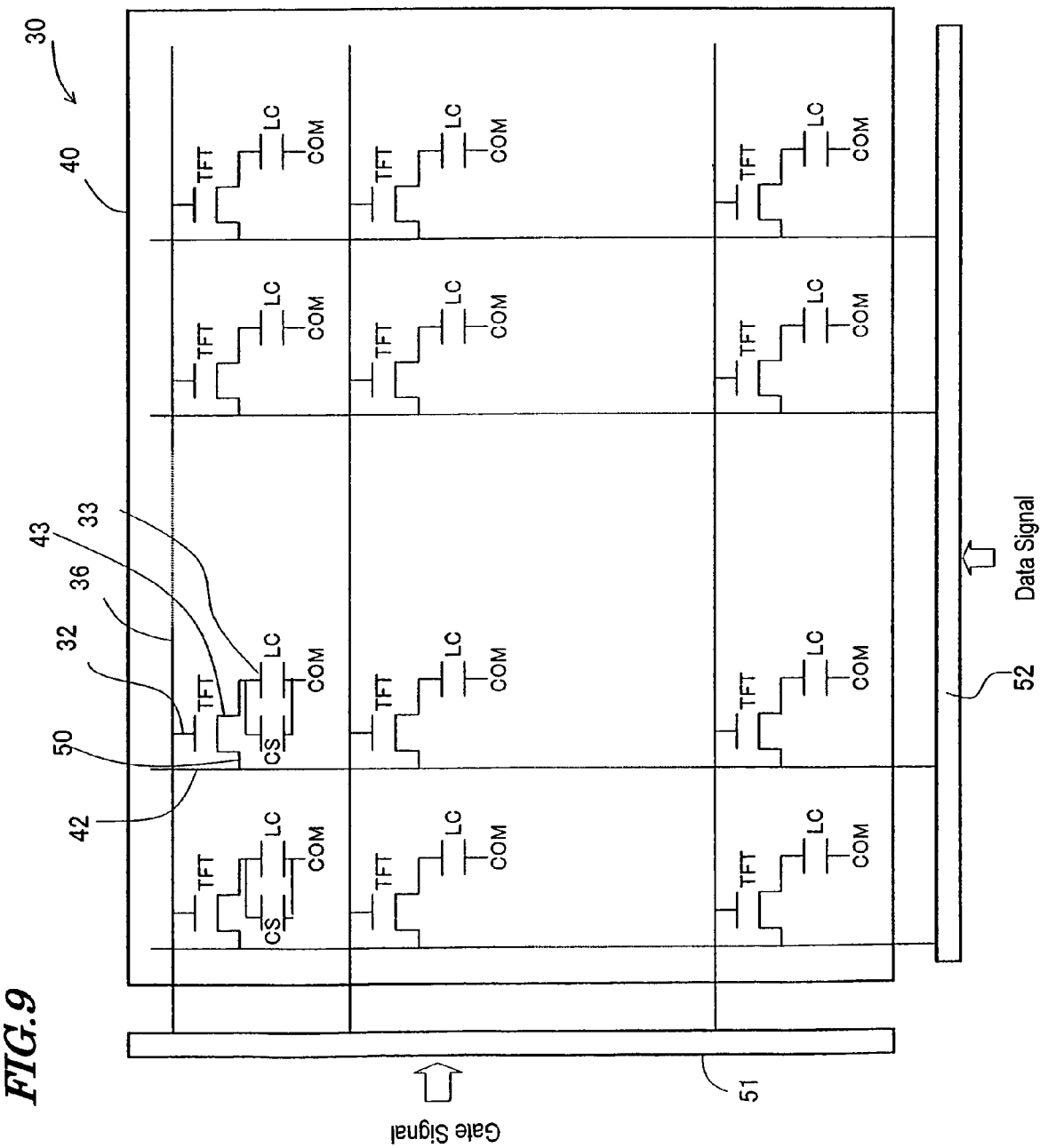
FIG. 9 shows an equivalent circuit of the active-matrix substrate illustrated in FIG. 6.

FIG. 9 shows an equivalent circuit diagram of the overall active-matrix substrate 30. Each of multiple pixel electrodes 33 is connected to the drain electrode 43 of its associated transistor 32. On the other hand, the data line 42 also functions as the source electrode of the transistor 32. Thus, multiple data lines 42 are connected to the source electrodes of the transistors 32. The core 36 of the function line 31 functions as the gate electrodes of the transistors 32. In this active-matrix substrate 30, the core 36 functions as a gate line. Also, the storage capacitor 50 is connected to each pixel electrode 33.

By connecting the cores 36 to function as gate lines and the data lines 42 to a gate line driver IC 51 and a data line driver IC 52, respectively, the transistors 32, which are connected to one of the cores 36 sequentially selected responsive to a gate signal, are turned ON, and a data signal is supplied through one of the data lines 42 and then written on the pixel electrode 33.

In the transistor array and active-matrix substrate of this preferred embodiment, the first insulating layer 37 (to be the gate insulating film of the transistor 32) and semiconductor layer 38 are provided for the function line 31 in advance. Accordingly, by forming the insulating layer 37 and semiconductor layer 38 at sufficiently high temperatures, the insulating layer 37 can have a high dielectric strength and the semiconductor layer 38 can exhibit a high mobility and a low defect density. However, the base substrate 40 is never exposed to the high temperatures at which the insulating layer 37 and semiconductor layer 38 are formed. For that reason, transistors, including a semiconductor layer and an insulating layer that were formed at high processing temperatures exceeding 1,000° C., can be formed on a plastic substrate with a low heat resistance of less than 200° C. Consequently, a bendable and flexible active-matrix substrate is realized, thus making it possible to fabricate a flexible TFT LCD or organic EL display.

Also, some portions of the drain electrode 43 and data line 42 functioning as the first and second conductive layers overlap with the semiconductor layer 38, but the others not. Such a structure can be obtained by forming the drain electrode 43 and data line 42 after the function lines 31 have been fixed onto the base substrate 40. That is to say, after the function lines 31, each including the insulating layer 37 and semiconductor layer 38 achieving high reliability and excellent characteristics, have been fixed onto the base substrate 40, the data line 42 and drain electrode 43 may be provided so as to define a channel for a transistor 32 and form the transistor 32 itself. Accordingly, in fixing the function lines 31 onto the base substrate 40, there is no concern about misalignment at least in its length direction. As a result, a transistor array and an active-matrix substrate, in which multiple transistors are arranged without causing any misalignment, can be obtained.

Furthermore, a substrate with low heat resistance expands when exposed to any high temperature process to be carried out at a temperature exceeding its heat resistance temperature. Once expanded, the substrate cannot recover its original shape but maintains increased sizes. Accordingly, when a conventional active-matrix substrate is made on a substrate with low heat resistance, the substrate expands so much through a high temperature process that it is very difficult to arrange lines, electrodes and other components on the substrate just as designed.

In contrast, in the transistor array and active-matrix substrate of the present invention, the base substrate 40 is never exposed to such a high temperature. Accordingly, such misalignment due to thermal expansion is avoidable and a pattern can be defined just as originally designed. As a result, the production yields of the transistor array and active-matrix substrate both increase. For example, even when a substrate with a great thermal expansion coefficient such as a plastic substrate is used, active-matrix substrates with a desired pattern can be obtained at a high yield.

Furthermore, in the transistor array and active-matrix substrate of the present invention, the exposed portions of the semiconductor layer 38 on the planarizing layer 41 are connected to the data line 42 and drain electrode 43. Thus, no patterning process needs to be carried out to define openings for connecting the semiconductor layer 38 to the data line 42 and drain electrode 43. As a result, the number of photolithographic processes can be reduced and eventually the manufacturing cost can be cut down.

In addition, the drain electrode 43 extends in the direction in which the data line 42 extends, and the drain electrode 43 and data line 42 intersect with the function line 31, thereby defining and forming the transistor 32. However, neither in the direction in which the drain electrode 43 and data line 42 extend nor in the direction in which the function line 31 extends, any transistor active regions are defined in advance. Accordingly, great alignment margins are allowed in these two directions and high production yields are achieved in the end.

Hereinafter, exemplary methods for fabricating the transistor array and active-matrix substrate will be described.

First, the function lines 31 and storage capacitor lines 45 are formed by the method that has already been described for the first preferred embodiment. In this case, the core 36 may consist of an electrically insulating fine wire 35 and a conductive layer 35 covering the fine wire 34 as in this preferred embodiment or may also be made of a metal.

Figure 10:
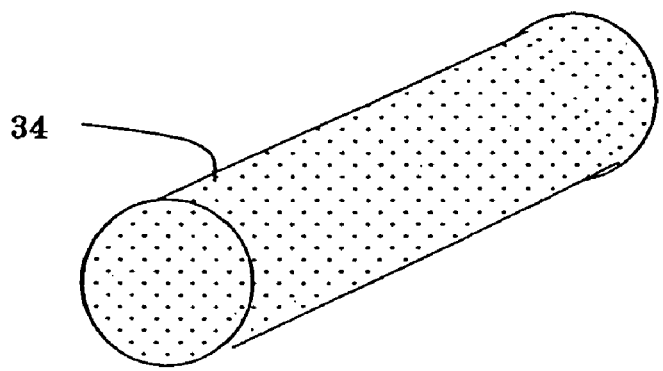
FIG. 10 is a perspective view showing a process step for making a function line to be used in the active-matrix substrate illustrated in FIG. 6.
Figure 11:
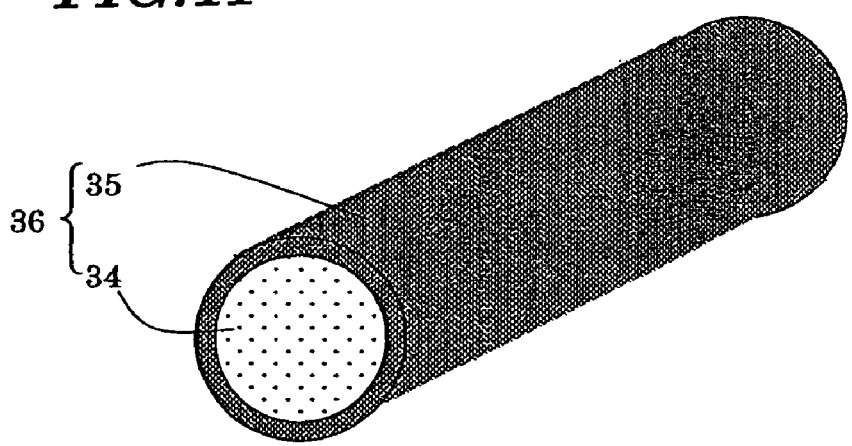
FIG. 11 is a perspective view showing another process step for making the function line to be used in the active-matrix substrate illustrated in FIG. 6.

As shown in FIGS. 10 and 11, a conductive layer 35 of tantalum is deposited in this preferred embodiment on the outer surface of a fine wire of a carbon fiber with a diameter of 20 μm by using the apparatus shown in FIG. 3. For example, a tantalum target (with sizes of 400 mm×500 mm) as a cathode electrode is placed in a film deposition chamber (with a volume of 200 liters) so as to be spaced apart from an anode electrode by 50 mm and the fine wire 34 is extended with tension so as to be 40 mm away from the target. Next, the film deposition chamber is filled with argon as an inert gas, the pressure inside of the chamber is reduced to 0.8 Pa, and then tantalum is deposited on the fine wire being heated to 300° C.

The fine wire 34 (or the core 36) preferably has thermal expansivity and heat resistance, which are approximately equal to those of the conductive layer, insulating layer and semiconductor layer covering the fine wire 34 (or the core 36). Also, the fine wire 34 (or core 36) preferably causes no contamination in the insulating layer or semiconductor layer covering itself and preferably makes a good contact with a thin film that directly covers itself. For example, if the transistor 32 is made of amorphous silicon, then the first insulating layer 37 to be the gate insulating film and the semiconductor layer 38 are deposited at a temperature of 300° C. to 400° C. and the silicon nitride film to be formed by a plasma enhanced CVD (PECVD) process has a linear expansivity α of 5 ppm/° C. In that case, the core 36 or fine wire 34 is preferably made of chromium (with α of 7 to 11 ppm/° C. and a melting point of 1,890° C.), tungsten (with α of 4.5 to 61 ppm/° C. and a melting point of 3,387° C.), tantalum (with α of 6.6 ppm/° C. and a melting point of 2,996° C.) or titanium (with α of 9 ppm/° C. and a melting point of 1,675° C.).

Also, if the fine wire 34 is made of a non-metallic material, one of various heat-resistant fibers such as a carbon fiber, an alumina fiber, a glass fiber, silicon carbide fiber and a fluorine fiber may be selected according to the desired thermal expansivity.

By making the core 36 of the fine wire 34 and conductive layer 35, excellent thermal expansivity, drawability and delayed metal fatigue, which could not be satisfied at the same time if the core 36 was made of a single metal, are achievable.

The conductive layer 35 does not have to be made of tantalum but may also be a film of an electrically conductive material such as aluminum, chromium, titanium, or an $n^+$-type semiconductor. Also, the conductive layer 35 may be formed by an evaporation process, an MOCVD process, an ion plating process or any other suitable process. If the fine wire 34 has sufficient heat resistance, then a metal may be deposited on the surface of the fine wire 34 by dipping the fine wire 34 in a molten metal.

Figure 12:
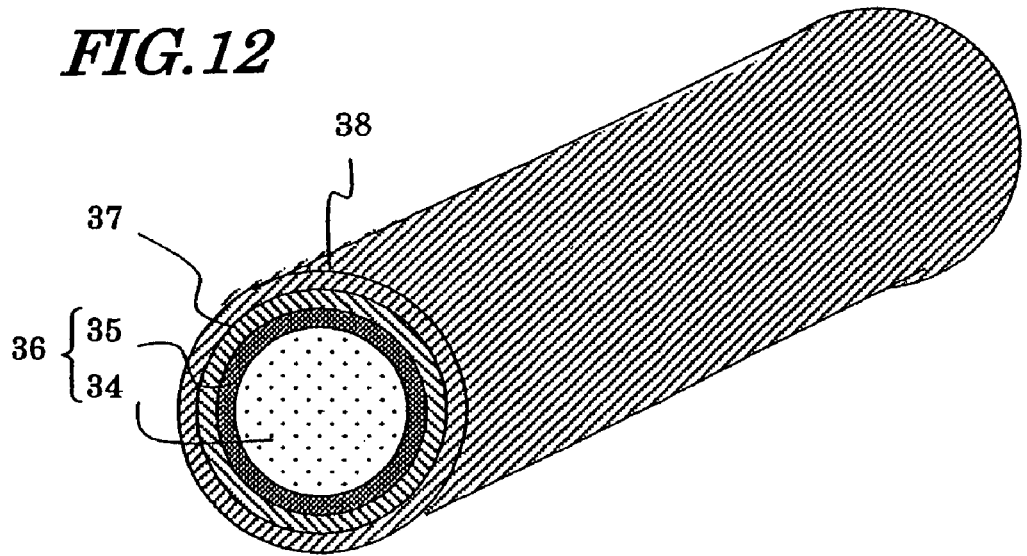
FIG. 12 is a perspective view showing another process step for making the function line to be used in the active-matrix substrate illustrated in FIG. 6.

Next, as shown in FIG. 12, a first insulating layer 37 of silicon nitride is deposited by a PECVD process so as to cover the core 36. For example, the film deposition chamber (with a volume of 200 liters) is supplied with nitrogen gas (at 1,000 sccm), ammonium gas (at 100 sccm) and silane gas (at 50 sccm), the pressure inside of the chamber is reduced to 150 Pa, the core 36 is extended with tension so as to be 20 mm away from the cathode electrode and then an RF power of 1,000 W is applied thereto, thereby forming the insulating layer 37.

Subsequently, a semiconductor layer 38 is further deposited on the insulating layer 37 by a PECVD process. For example, the film deposition chamber (with a volume of 200 liters) is supplied with hydrogen gas (at 2,000 sccm) and silane gas (at 200 sccm), the pressure inside of the chamber is reduced to 100 Pa, the core 36 is extended with tension so as to be 20 mm away from the cathode electrode, and then an RF power of 200 W is applied thereto, thereby forming the semiconductor layer 38.

The insulating layer 37 and semiconductor layer 38 are formed at 300° C., which is believed to be the best temperature for their processes. Although not shown in FIG. 12, a second insulating layer for protecting the surface of the semiconductor layer 38 may be further provided thereon as described for the first preferred embodiment.

The storage capacitor line 50 is also formed by a method similar to that of the function line 31. More specifically, a conductive layer 47 of tantalum is deposited on the surface of a fine wire 46 of a carbon fiber, and then an insulating layer 49 of silicon nitride is deposited thereon according to the conditions described above.

By preparing the function line 31 and storage capacitor line 50 separately in this manner, two different insulating layers, conductive layers or semiconductor layers may be formed so as to achieve the respective purposes. For example, the insulating layer of the function line 31 may be made of a silicon nitride film having a high dielectric strength and ensuring high reliability, while the insulating layer of the storage capacitor line 50 may be made of a material with a high dielectric constant such as strontium titanate.

Figure 13:
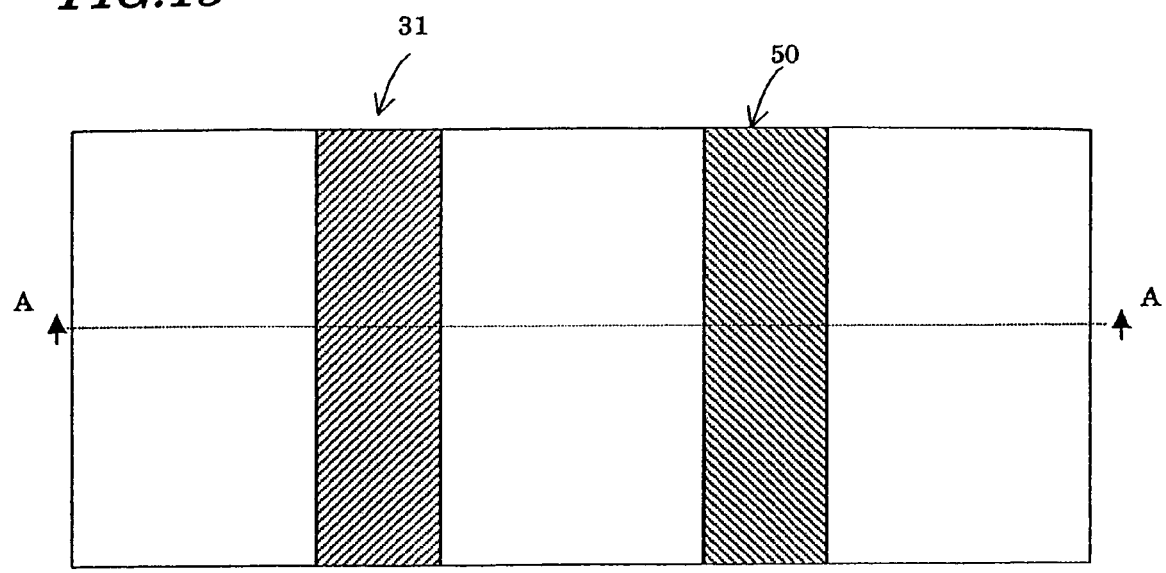
FIG. 13 is a plan view showing a process step for fabricating the active-matrix substrate illustrated in FIG. 6.
Figure 14:
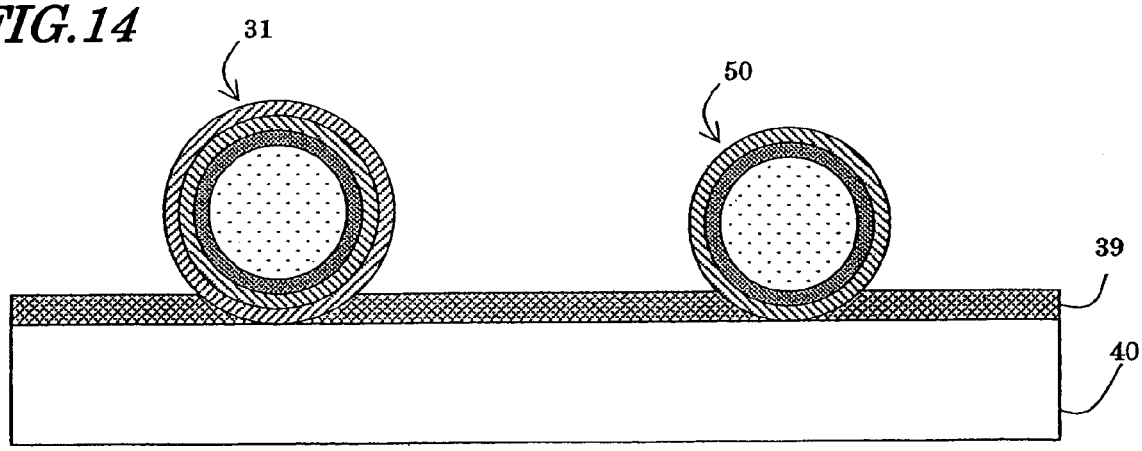
FIG. 14 is a cross-sectional view thereof taken on the plane A-A shown in FIG. 13.

Thereafter, the function line 31 and storage capacitor line 50 obtained in this manner are fixed onto a base substrate 40 with an adhesive layer 39 as shown in FIGS. 13 and 14. The base substrate 40 may be made of polyether sulfone (PES), for example, which is transparent, hardly deforms at about 200° C. and exhibits a small linear expansivity and little temperature dependence. Accordingly, the PES substrate 40 can maintain its size with good stability, and therefore, can be used effectively to make a flexible display device. Optionally, to make a reflective display device, the base substrate 40 may be made of a stainless steel. As another alternative, a glass substrate may also be used.

To secure the function line 31 and storage capacitor line 50 onto the base substrate 40, a plurality of function lines 31 and a plurality of storage capacitor lines 50 are wound around a roll with their gaps adjusted to their eventual arrangement pitches on the base substrate 40 and then bonded onto an adhesive film to be the adhesive layer 39. Thereafter, the adhesive film may be bonded onto the base substrate 40 just as already described for the first preferred embodiment.

To eliminate significant unevenness from under the data lines and pixel electrodes to be formed later, the level difference between the top of the function line 31 and storage capacitor line 50 and their surrounding areas is preferably at most 1 µm. For example, when the function line 31 has a diameter of 20 µm, an adhesive layer 39 with a thickness of about 19 µm is preferably prepared, and the force pressing the function line 31 onto the adhesive layer 39 is adjusted such that the function line 31 is exposed to a height of about 1 µm on the adhesive layer 39. In that case, the planarizing layer 41 shown in FIGS. 15 and 16 is not necessary and the adhesive layer 39 also functions as the planarizing layer.

Figure 15:
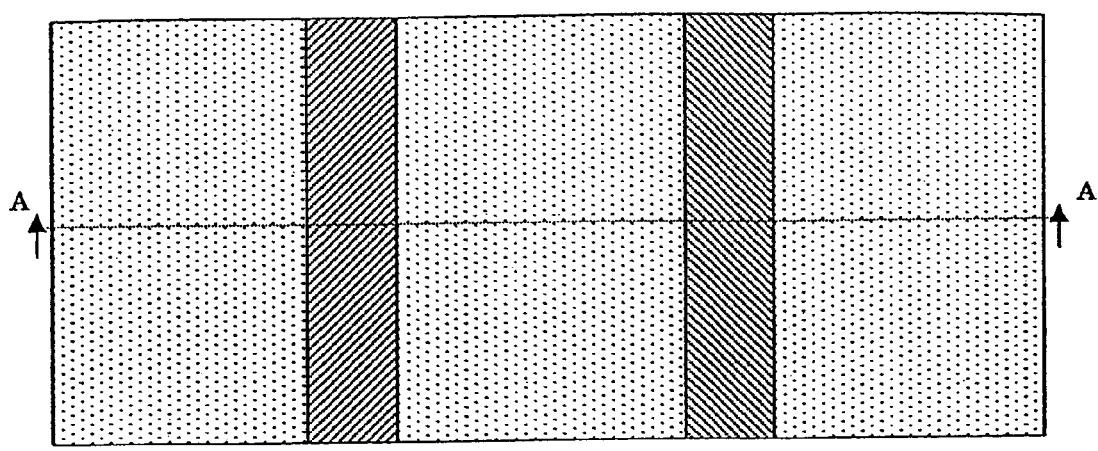
FIG. 15 is a plan view showing another process step for fabricating the active-matrix substrate illustrated in FIG. 6.
Figure 16:
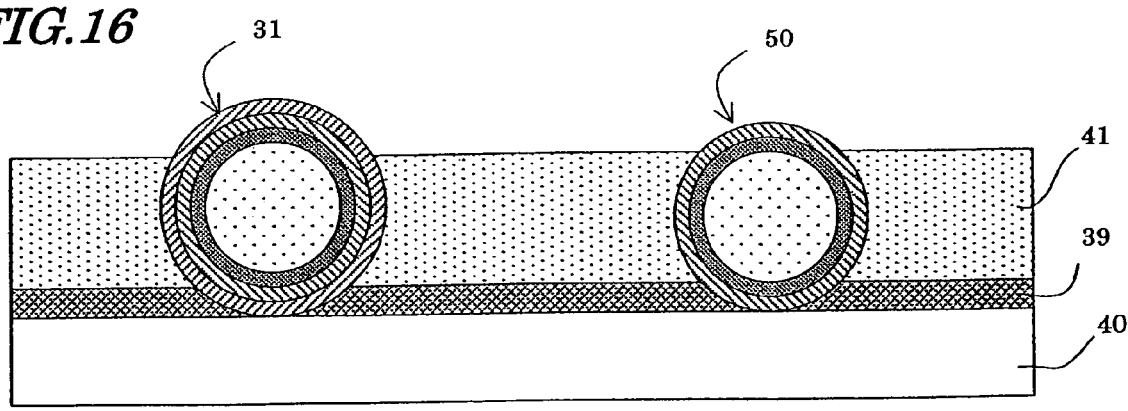
FIG. 16 is a cross-sectional view thereof taken on the plane A-A shown in FIG. 15.

If it is difficult to adjust the degree of exposure of the function line 31 and storage capacitor line 50 with the adhesive layer 39, then a planarizing layer 41 made of an acrylic resin,.- for example, is provided on the adhesive layer 39 as shown in FIGS. 15 and 16. Thereafter, excessive portions of the planarizing layer 41 are etched away by a chemical mechanical polishing (CMP) process, thereby exposing the top of the function line 31 and storage capacitor line 50.

Alternatively, the function line 31 and storage capacitor line 50 may also be exposed by a photolithographic process. For example, a negative photosensitive resin may be applied onto the adhesive layer 39 so as to cover the function line 31 and storage capacitor line 50 substantially entirely and then exposed to a radiation that has been emitted from under the base substrate 40. Then, the top of the function line 31 and storage capacitor line 50 and their surrounding portions are not exposed to the radiation. Accordingly, those non-exposed portions of the photosensitive resin around the top of the function line 31 and storage capacitor line 50 are removed during the following development process.

If the function line 31 and storage capacitor line 50 have different diameters, then their exposed portions on the planarizing layer may have different heights according to the method described above. Also, the area of the exposed portion of the function line 31 on the planarizing layer 41 defines the source/drain contact width of the transistor 32 (see FIG. 6). Accordingly, depending on the application, the height of the exposed portion of the function line 31 needs to be controlled more precisely.

Figure 17:
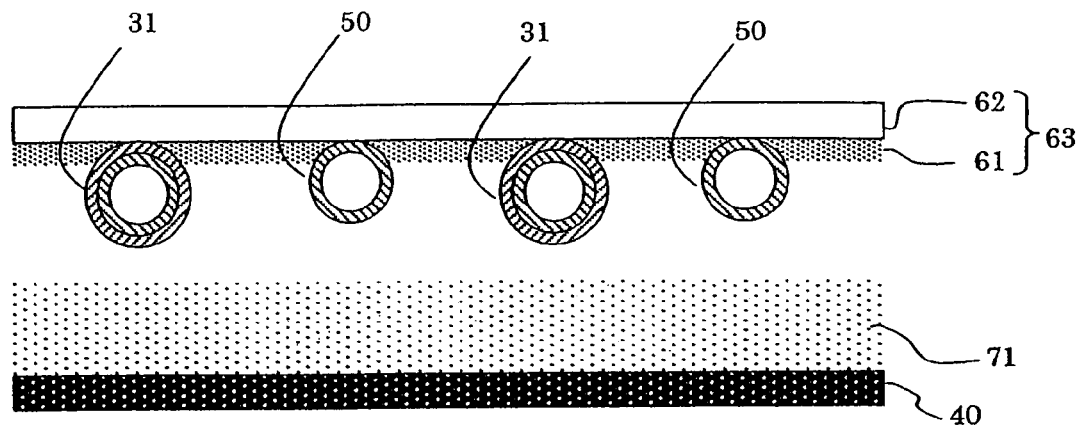
FIG. 17 is a cross-sectional view showing another process step for fabricating the active-matrix substrate illustrated in FIG. 6.

In that case, the function line 31 and storage capacitor line 50 may have their heights adjusted to each other and then transferred. For example, as shown in FIG. 17, a press plate 63, including a cushion layer 61 with a thickness of 1 µm as a plastically deformable layer on a substrate 62, is prepared and the function lines 31 and storage capacitor lines 50 are arranged at regular intervals and pressed against the press plate 63. As a result, the function lines 31 and storage capacitor lines 50 are embedded to a depth of 1 µm and held on the press plate 63.

Figure 18:
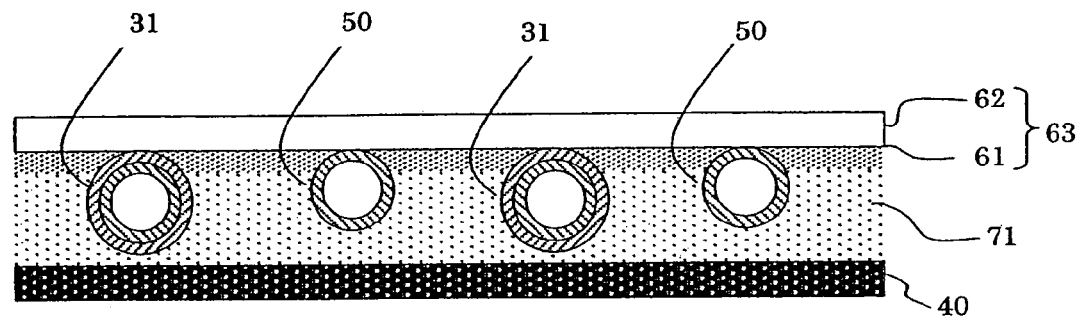
FIG. 18 is a cross-sectional view showing another process step for fabricating the active-matrix substrate illustrated in FIG. 6.

Next, as shown in FIG. 18, a base substrate 40, including an epoxy adhesive layer 71 with a thickness of 19 µm or more as a curable adhesive, is prepared, and then the press plate 63 is pressed against the adhesive layer 71 such that the exposed portions of the function lines 31 and storage capacitor lines 50 are buried in the adhesive layer 71 entirely. After the adhesive layer 71 has been cured, the press plate 63 is removed as shown in FIG. 19, thereby obtaining a structure in which the function lines 31 and storage capacitor lines 50 are exposed to a height of 1 µm on the adhesive layer 71.

Figure 4:
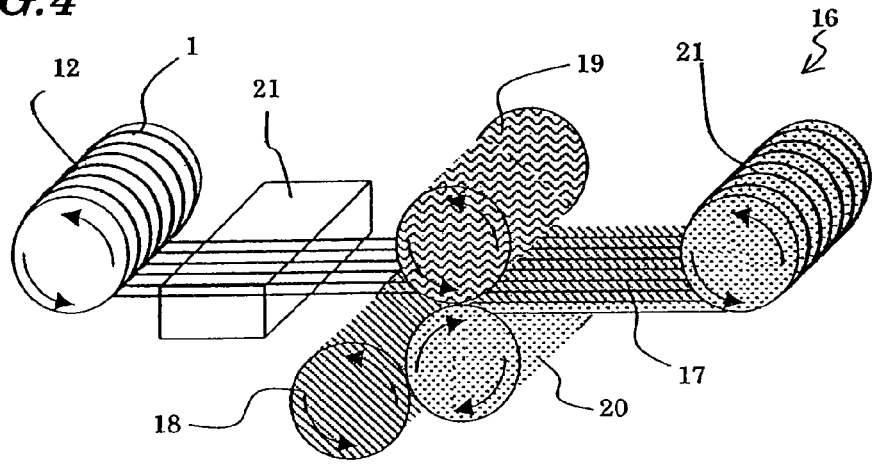
FIG. 4 is a schematic representation illustrating an apparatus for bonding a function line onto a film.
Figure 19:
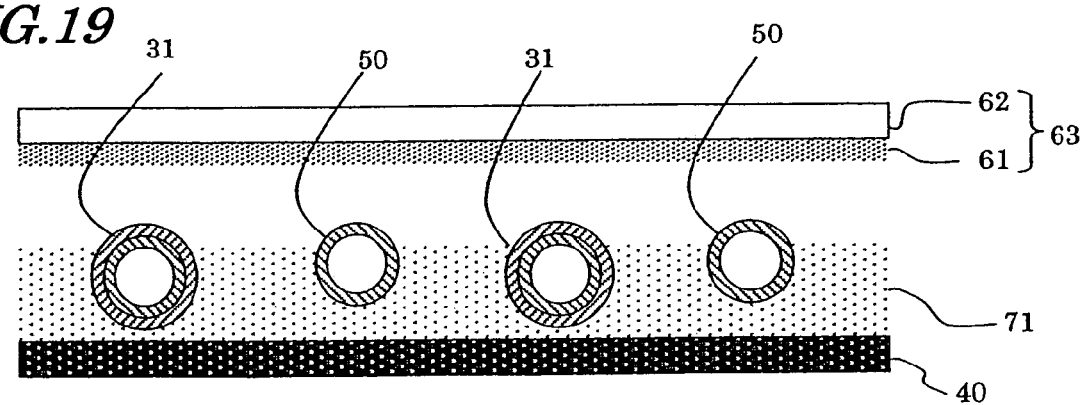
FIG. 19 is a cross-sectional view showing another process step for fabricating the active-matrix substrate illustrated in FIG. 6.

If the adhesive film 17 shown in FIG. 4 is made of a material, or has a structure, which is flexible enough to be reeled up on a roll and functions as the substrate 62 and cushion layer 61 described above, then the function lines 31 and storage capacitor lines 50 can be fixed onto the base substrate 40 by performing the process steps shown in FIGS. 17, 18 and 19.

In this manner, the structure shown in FIG. 16, in which the function line 31 and storage capacitor line 50 are fixed on the base substrate 40 with the planarizing layer 41 and/or adhesive layer 39, can be obtained. It should be noted that if the second insulating layer is provided as a protective coating to cover the semiconductor layer 38 of the function line 31 as described for the first preferred embodiment, then the second insulating layer may be removed by a wet etching process or any other suitable process after the structure shown in FIG. 16 has been obtained. For example, if a silicon nitride film is provided as the second insulating layer, then the second insulating layer may be removed with buffered hydrofluoric acid (BHF) with the damage on the semiconductor layer 38 minimized.

In this case, if the insulating layer 49 of the storage capacitor line 50 could also be etched unintentionally, then the thickness of the insulating layer 49 should be sufficiently greater than that of the second insulating layer of the function line 31. Alternatively, another insulating film made of some material that resists the etching process may be further provided so as to cover the insulating layer 49. It is naturally possible to etch the second insulating layer away after only the storage capacitor line 50 has been covered with, and protected by, a resist pattern.

Figure 20:
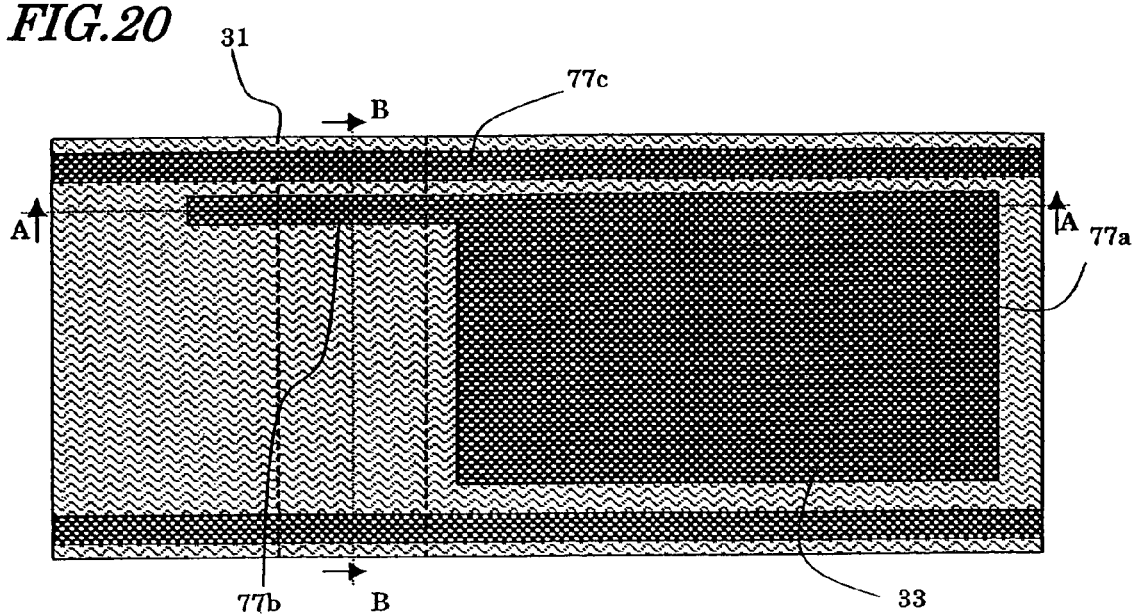
FIG. 20 is a plan view showing another process step for fabricating the active-matrix substrate illustrated in FIG. 6.
Figure 21:
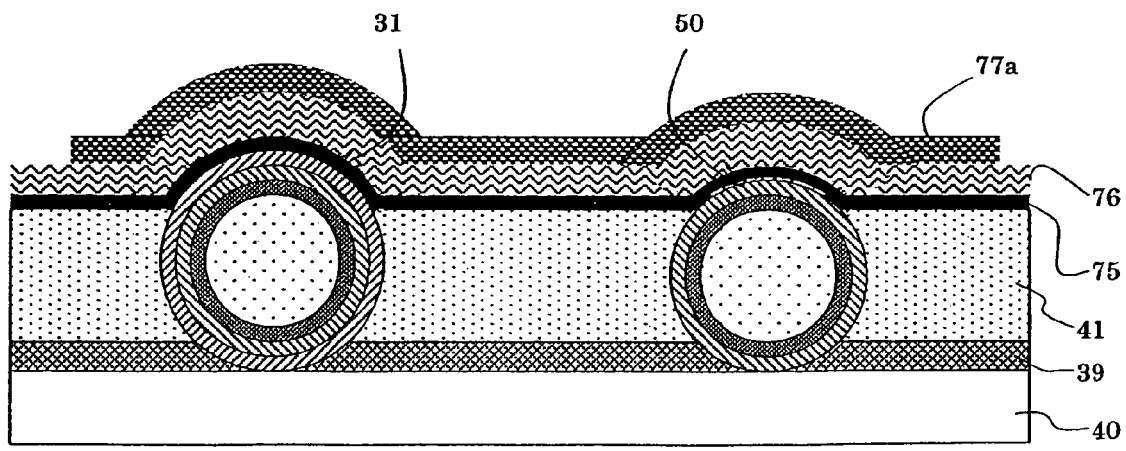
FIG. 21 is a cross-sectional view thereof taken on the plane A-A shown in FIG. 20.
Figure 22:
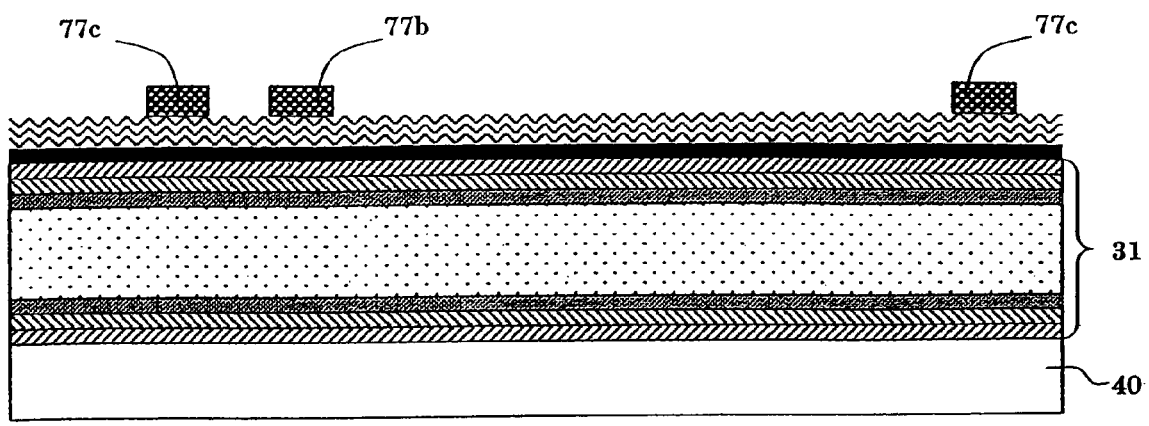
FIG. 22 is a cross-sectional view thereof taken on the plane B-B shown in FIG. 20.

Next, as shown in FIGS. 20, 21 and 22, an n$^+$ layer 75 (with a thickness of 50 nm) and a metal layer 76 (with a thickness of 300 nm) are provided on the planarizing layer 41 so as to cover the function line 31 and storage capacitor line 50. The n$^+$ layer 75 may be deposited by a PECVD process and the metal layer 76 may be formed by a sputtering process, for example.

Thereafter, the n$^+$ layer 75 and metal layer 76 are patterned by a photolithographic process, thereby forming the pixel electrode 33, drain electrode 43 and data line 42 shown in FIG. 6. For that purpose, as shown in FIG. 20, photoresist pattern elements 77a, 77b and 77c, corresponding to the pixel electrode 33, drain electrode 43 and data line 42, respectively, are defined on the metal layer 76. Then, the n$^+$ layer 75 and metal layer 76 are selectively etched by a dry etching process or any other etching technique using the pattern elements 77a, 77b and 77c as a mask, thereby forming the pixel electrode 33, drain electrode 43 and data line 42 shown in FIG. 6. In this process step, a channel region 44 is defined by the drain electrode 43 and data line 42 and the transistor 32 is formed as well. In this manner, an active-matrix substrate 30 including a transistor array is fabricated.

In this process step, no residues of the n$^+$ layer 75 or metal layer 76 are preferably left in the channel 44 of the transistor 32, in particular. This is because if any portions of the n$^+$ layer 75 or metal layer 76 were left in the channel, then leakage current would be generated to possibly interfere with normal operation of the transistor 32.

Japanese Laid-Open Publication No. 9-203910 proposes that a semiconductor layer and a conductor layer be provided so as to cover the outer surface of a metal line fully and then the conductor layer be patterned to form a transistor. In that case, however, it is extremely difficult to pattern the conductor layer just as intended such that no fractions of the conductor layer are left in a channel-to-be region around the entire fine wire.

In contrast, in the active-matrix substrate 30 of this preferred embodiment, the n$^+$ layer 75 and metal layer 76 are provided only on the planarizing layer 41 and are substantially flat. Accordingly, these layers can be etched just as intended by a conventional etching technique. In addition, the drain electrode 43 and data line 42 functioning as a source electrode can be formed by patterning the n$^+$ layer 75 and metal layer 76 simultaneously. Thus, there is no need to align the n$^+$ layer 75 with the drain electrode 43 or data line 42.

To prevent any residues of the n$^+$ layer 75 or metal layer 76 from being left in the channel 44 of the transistor 32, the n$^+$ layer 75 and metal layer 76 may also be etched so excessively as to remove even the semiconductor layer 38 partially.

When such a process is adopted in the prior art, the semiconductor layer is normally made thick enough (typically to 100 nm or more) in view of the depth of the portions to be etched away. In that case, however, the off-state current will increase and portions of the semiconductor layer over the channels will have significantly different thicknesses, thus causing non-negligible variations in transistor characteristics.

Figure 23:
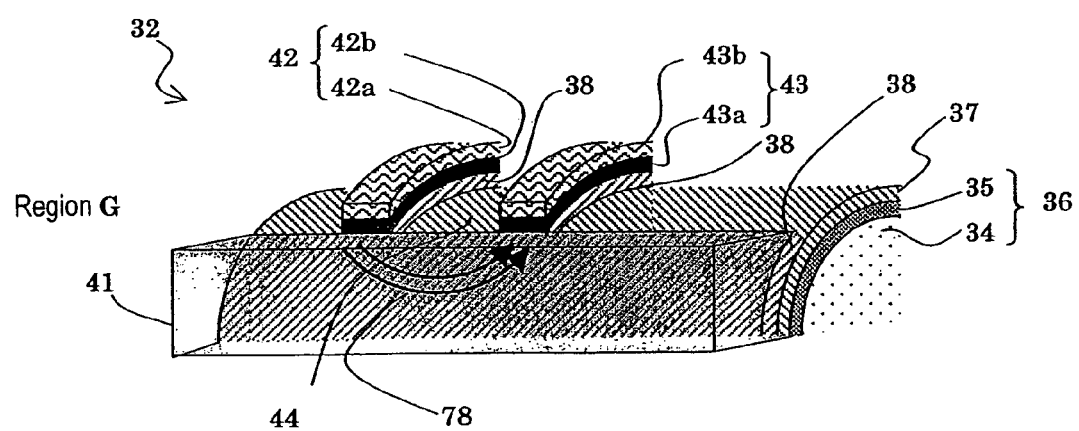
FIG. 23 is a perspective view showing where electrons flow in the active-matrix substrate illustrated in FIG. 6 with the semiconductor layer thereof removed.

In contrast, in the active-matrix substrate 30 of this preferred embodiment, there is no need to increase the thickness of the semiconductor layer 38 in advance. As shown in FIG. 23, even if the semiconductor layer 38 has been completely removed in the channel region 44, other portions of the semiconductor layer 38 are still left coated with the planarizing layer 41. Accordingly, those portions will function as the channels of the transistors 32 and can control the flow of electrons 78.

The preferred embodiment described above is an active-matrix substrate 30 for use in a reflective LCD including thin-film transistors. Accordingly, the pixel electrodes 33 are made of the same metal layer as the drain electrodes 43 and data lines 42. However, when an active-matrix substrate for use in a transmissive LCD including thin-film transistors is fabricated, the pixel electrodes 33 thereof may be made of a transparent electrode film.

Embodiment 3

An active-matrix substrate according to a third preferred embodiment includes a driver circuit for driving a pixel region made up of a plurality of pixels. The driver circuit includes CMOS devices that use function lines.

Figure 24:
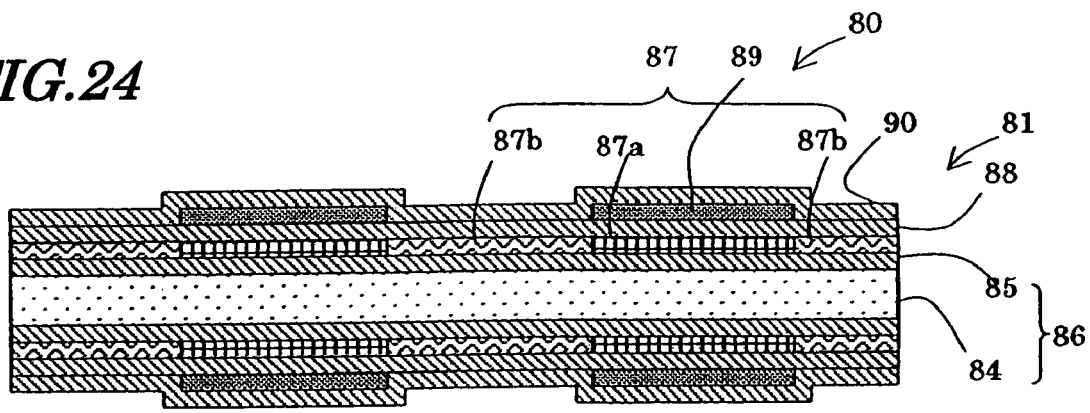
FIG. 24 is a cross-sectional view of an n-type function line for use in an active-matrix substrate according to a third preferred embodiment.
Figure 25:
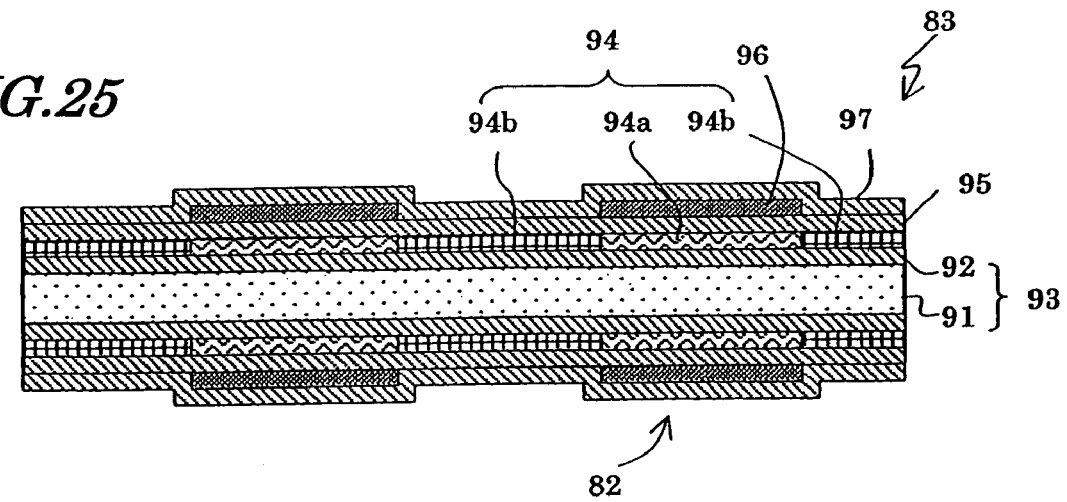
FIG. 25 is a cross-sectional view of a p-type function line for use in the active-matrix substrate of the third preferred embodiment.

Each CMOS device includes an n-type function line 81 with an NMOS transistor 80 as shown in FIG. 24 and a p-type function line 83 with a PMOS transistor 82 as shown in FIG. 25.

The n-type function line 81 includes a core 86, a semiconductor layer 87 covering the core 86, an insulating layer 88 covering the semiconductor layer 87, and a gate electrode 89 provided on the surface of the insulating layer 88. At least the surface of the core 86 needs to be electrically insulating. Thus, the core 86 may consist of an electrically conductive fine wire 84 and an insulating layer 85 that covers the fine wire 84.

The semiconductor layer 87 includes an n-channel 87a, which is defined by the gate electrode 89, and a pair of p-type regions 87b, which is provided so as to sandwich the n-channel 87a between them. The NMOS transistor 80 is made up of the n-channel 87a, p-type regions 87b, insulating layer 88 and gate electrode 89. A protective coating 90 is further provided so as to cover the outer surface of the n-type function line 81 entirely.

Likewise, the p-type function line 83 includes a core 93, a semiconductor layer 94 covering the core 93, an insulating layer 95 covering the semiconductor layer 94, and a gate electrode 96 provided on the surface of the insulating layer 95. At least the surface of the core 93 needs to be electrically insulating, too. In this preferred embodiment, the core 93 consists of a metal wire 91 and an insulating layer 92 that covers the metal wire 91.

The semiconductor layer 94 includes a p-channel 94a, which is defined by the gate electrode 96, and a pair of n-type regions 94b, which is provided so as to sandwich the p-channel 94a between them. The PMOS transistor 82 is made up of the p-channel 94a, n-type regions 94b, insulating layer 95 and gate electrode 96. A protective coating 97 is further provided so as to cover the outer surface of the p-type function line 83 entirely.

Figure 26:
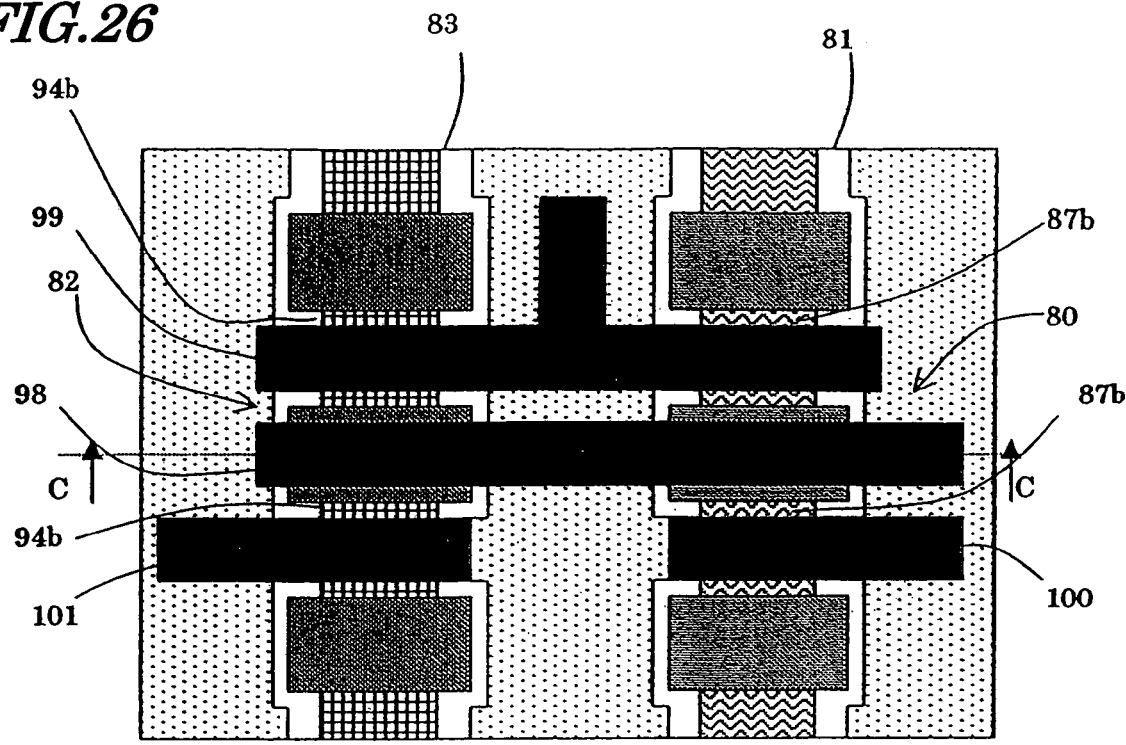
FIG. 26 is a plan view illustrating the active-matrix substrate of the third preferred embodiment.
Figure 27:
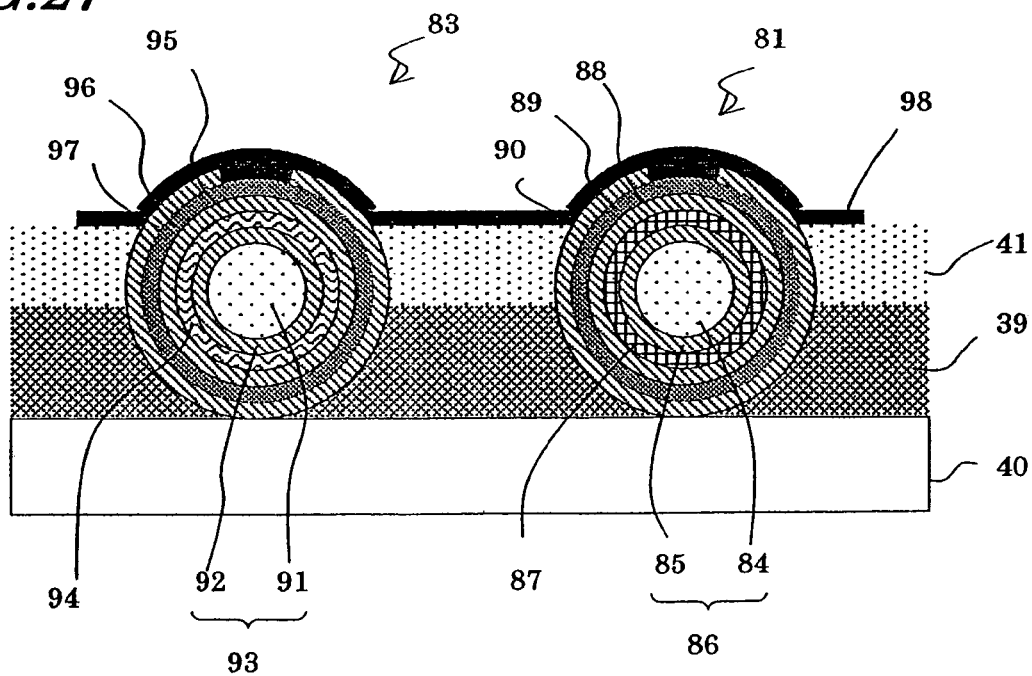
FIG. 27 is a cross-sectional view thereof taken on the plane C-C shown in FIG. 26.

As shown in FIGS. 26 and 27, the n-type function line 81 and p-type function line 83 are fixed to a base substrate 40 with an adhesive layer 39. A planarizing layer 41 is further provided so as to surround the n-type function line 81 and p-type function line 83.

The NMOS transistors 80 of the n-type function line 81 and the PMOS transistors 82 of the p-type function line 83 are connected together so as to make up various CMOS devices. For example, as shown in FIGS. 26 and 27, the gate electrodes 89 and 96 of the NMOS and PMOS transistors 80 and 82 may be connected together with an interconnect 98, one of the two p-type regions 87b and one of the two n-type regions 94b may be connected together with an interconnect 99, and interconnects 100 and 101 may be connected to the other p-type region 87b and the other n-type region 94b, respectively. In this manner, an inverter, which uses the interconnects 98, 99, 100 and 101 to receive an input voltage Vin, an output voltage Vout, a supply voltage Vss and another supply voltage Vdd, respectively, can be obtained.

In the active-matrix substrate of this preferred embodiment, the driver circuit is made up of CMOS devices that use the function lines. The semiconductor layers 87 and 94 of the function lines 81 and 83 to make the CMOS devices are made of polysilicon (p-Si) or crystalline silicon (c-Si), which has a far higher mobility than the material of the pixel electrode. These semiconductor layers 87 and 94 are formed before the function lines 81 and 83 are fixed onto the base substrate 40. For that reason, the semiconductor layers 87 and 94 can be formed at elevated temperatures that are high enough to produce polysilicon or crystalline silicon irrespective of the heat resistance temperature of the base substrate 40.

To make a CMOS device using the n-type and p-type function lines 81 and 83 in the active-matrix substrate of this preferred embodiment, after the n-type and p-type function lines 81 and 83 have been fixed onto the base substrate 40, the gate electrodes 89 and 96 and p-type and n-type regions 87b and 94b of the n-type and p-type function lines 81 and 83 need to be connected together by way of the interconnects 98, 99, 100 and 101. However, compared to connecting transistors for driving pixels, it is far easier to establish these connections just as intended using those interconnects.

For example, if the pixel driving transistors are made of the function lines, about 1,000 function lines will be needed a substrate and all have to be arranged accurately enough. This is because when just one of those 1,000 function lines is arranged inaccurately, a line defect will be created to make the overall substrate a no-go.

In contrast, if a CMOS device for a peripheral circuit is made of the function lines, only a small number of (e.g., on the order of 10 to 50) function lines are needed. That is to say, the number of the function lines to be aligned drastically decreases to about 1/20 to even 1/100, thus producing defects much less likely.

Also, in the pixel driving transistors, if the connecting portion is allowed a greater margin or the sizes of the transistors are increased to get the alignment done just as intended, then the aperture ratio of a pixel will decrease unintentionally, for example. Meanwhile, a peripheral circuit will have much smaller impact on the display quality. Accordingly, the devices of the peripheral circuit may have increased sizes and the connecting portion may be allowed a greater margin.

Hereinafter, a method for fabricating a driver circuit for an active-matrix substrate according to this preferred embodiment will be described.

Figure 28:
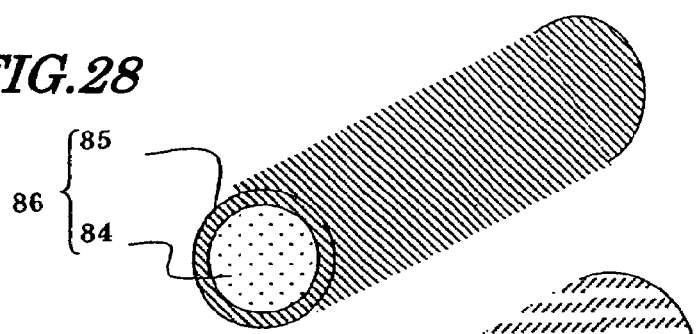
FIG. 28 is a perspective view showing a process step for making the n-type function line.

First, as shown in FIG. 28, a tungsten wire with a diameter of 20 μm is used as the fine wire 84 and a silicon dioxide film is deposited thereon as the insulating layer 85. The fine wire 84 preferably has some heat resistance and may be made of tantalum, a non-metallic material or any other suitable material. After the fine wire 84 has been cleaned if necessary, the insulating layer 85 of silicon dioxide is deposited thereon by a PECVD process, for example. The insulating layer 85 is preferably sufficiently thick (of about 1 μm, for example). The silicon dioxide film may be formed by the PECVD process using silane and dinitrogen monoxide or by a sputtering process. Alternatively, a silicon film may be once formed and then thermally oxidized into silicon dioxide. In any of these methods, the core 86 is obtained.

Figure 29:
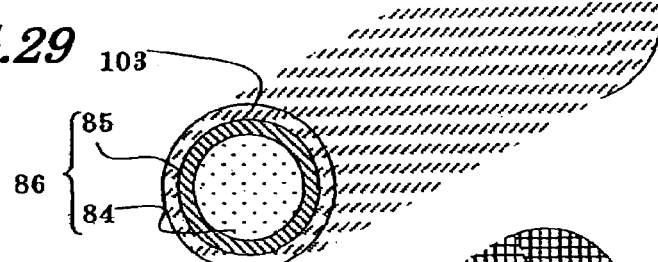
FIG. 29 is a perspective view showing another process step for making the n-type function line.

Next, as shown in FIG. 29, an amorphous silicon layer 103 is deposited (to a thickness of 50 nm) so as to cover the core 86. The amorphous silicon layer 103 may be formed by either a PECVD process or a low-pressure CVD (LPCVD) process. Alternatively, the amorphous silicon layer 103 may also be formed by dipping the core 86 in molten silicon just briefly and quickly. If there is a lot of hydrogen left in the semiconductor layer 87 (e.g., if the amorphous silicon layer 103 has been formed by a PECVD process), then a dehydrogenation process may be carried out.

Figure 30:
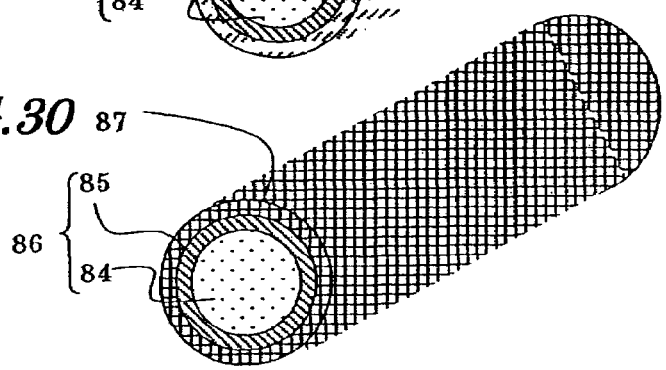
FIG. 30 is a perspective view showing another process step for making the n-type function line.

Subsequently, an n-type dopant such as phosphorus is added to the overall amorphous silicon layer 103 by an ion implantation or ion doping process, and then the doped amorphous silicon layer is annealed, thereby crystallizing the amorphous silicon and activating the dopant introduced simultaneously. As a result, the amorphous silicon layer 103 is turned into a semiconductor layer 87 of $n^+$-type polysilicon as shown in FIG. 30. The activation of the dopant and crystallization do not have to occur concurrently. Alternatively, after the amorphous silicon layer 103 has been heated and crystallized, the dopant may be introduced and then activated. Also, the semiconductor layer does not always have to be polycrystalline. If the CMOS device can exhibit desired characteristics according to an ideal combination of a dopant concentration and its mobility, then the semiconductor layer may be an $n^+$ layer just by introducing a dopant thereto.

Figure 31:
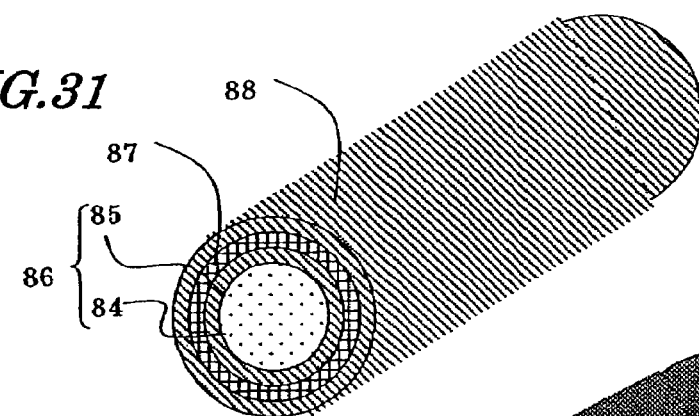
FIG. 31 is a perspective view showing another process step for making the n-type function line.

Thereafter, as shown in FIG. 31, an insulating layer 88 to be a gate insulating film is provided on the semiconductor layer 87. The insulating layer 88 may be a silicon dioxide film that has been deposited by a PECVD process, for example. Alternatively, a portion of the semiconductor layer 87 may be turned into silicon dioxide as the insulating layer 88 by oxidizing the surface of the semiconductor layer 87 by a thermal oxidation process, for example.

Figure 32:
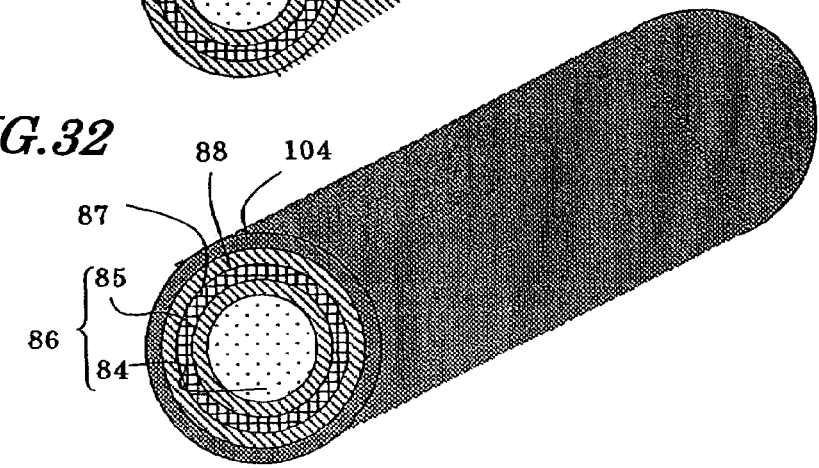
FIG. 32 is a perspective view showing another process step for making the n-type function line.

Subsequently, a gate electrode is formed. As shown in FIG. 32, a gate metal film 104 is deposited so as to cover the insulating layer 88. The gate metal is preferably a refractory metal such as tungsten or tantalum. In this preferred embodiment, tantalum is used.

Figure 33:
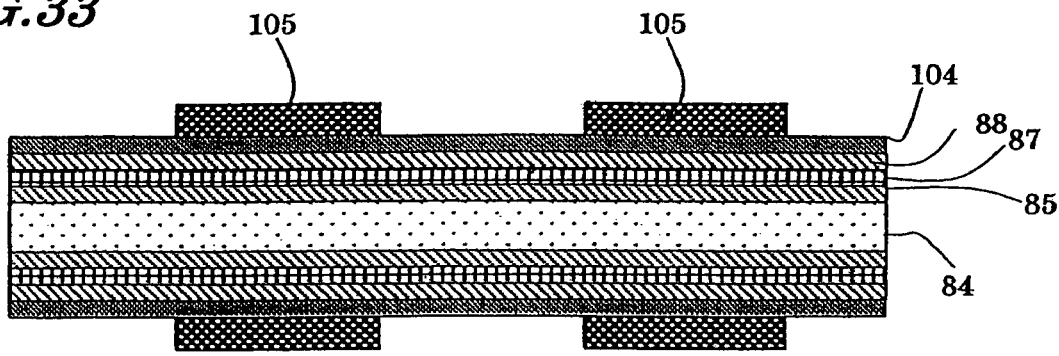
FIG. 33 is a cross-sectional view showing a process step for making the n-type function line.
Figure 34:
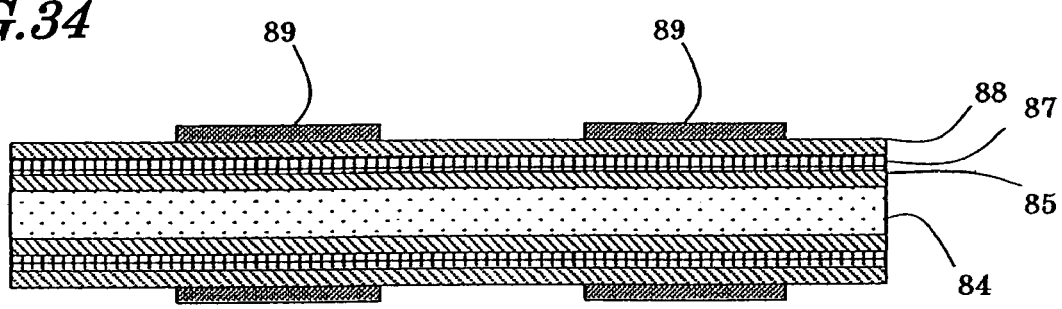
FIG. 34 is a cross-sectional view showing another process step for making the n-type function line.

Next, a resist pattern 105 representing gate electrodes is defined by a photolithographic process as shown in FIG. 33, and the gate metal film 104 is selectively etched using the resist pattern 105 as a mask, thereby forming the gate electrodes 89 as shown in FIG. 34.

Figure 35:
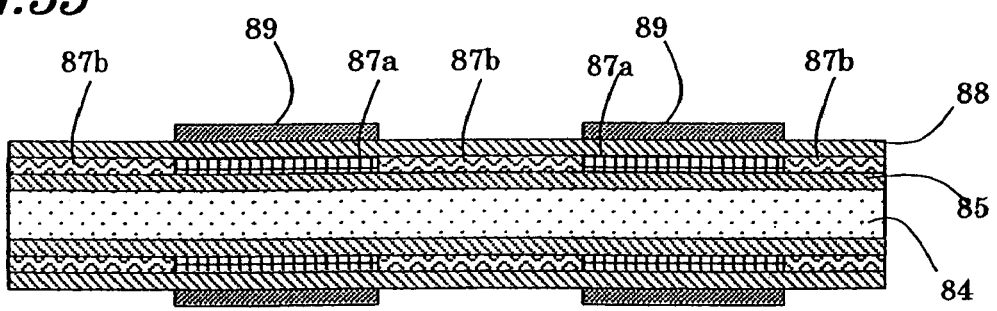
FIG. 35 is a cross-sectional view showing another process step for making the n-type function line.

Thereafter, the semiconductor layer 87 is subjected to a counter doping process. As shown in FIG. 35, boron is added to the semiconductor layer 87 using the gate electrodes 89 as a mask, thereby defining p-type regions 87b in the semiconductor layer 87. In the meantime, n-channels 87a are also defined under the gate electrodes 89. Each n-channel 87a is sandwiched between two p-type regions 87b. In this manner, a p-n-p junction is easily formed to complete an NMOS transistor 80.

Finally, a protective coating 90 is provided so as to cover the gate electrodes 89 and p-type regions 87b, thereby completing an n-type function line 81. A p-type function line 83 with PMOS transistors 82 is formed by a similar method. In that case, first, boron is added to amorphous silicon to obtain a semiconductor layer 94, which is then subjected to a counter doping process by implanting phosphorus thereto.

Figure 36:
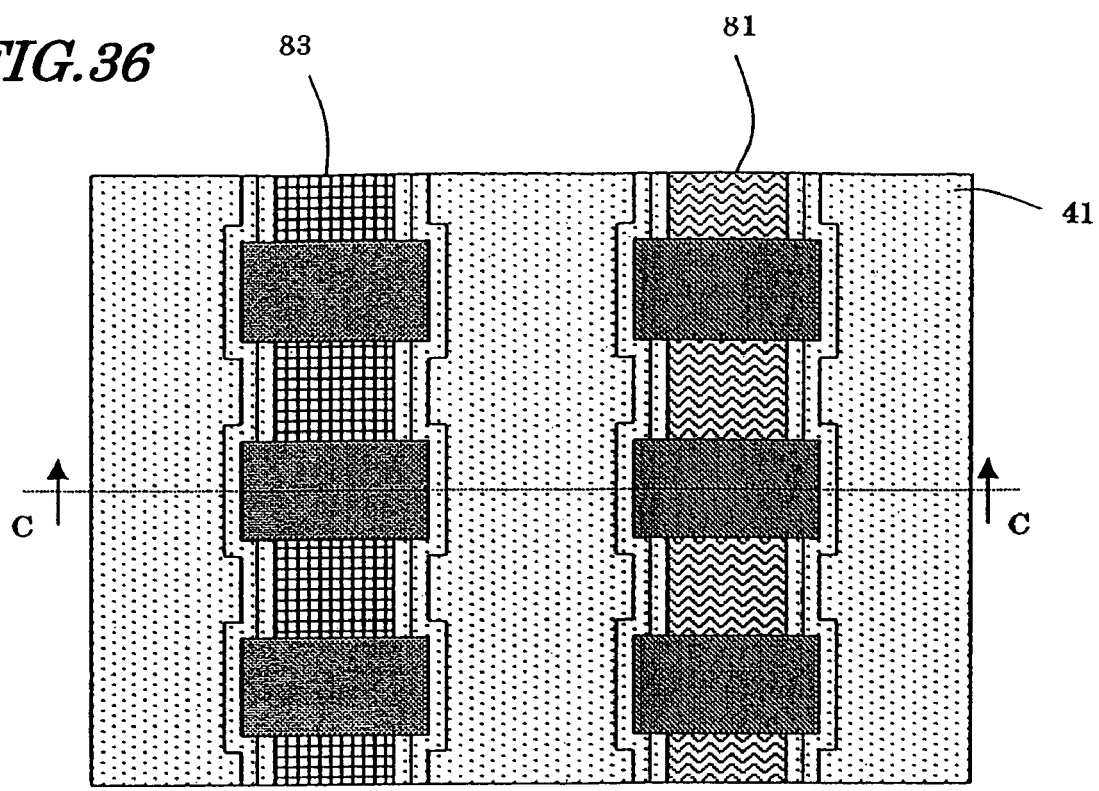
FIG. 36 is a plan view showing a process step for fabricating the active-matrix substrate shown in FIG. 26.
Figure 37:
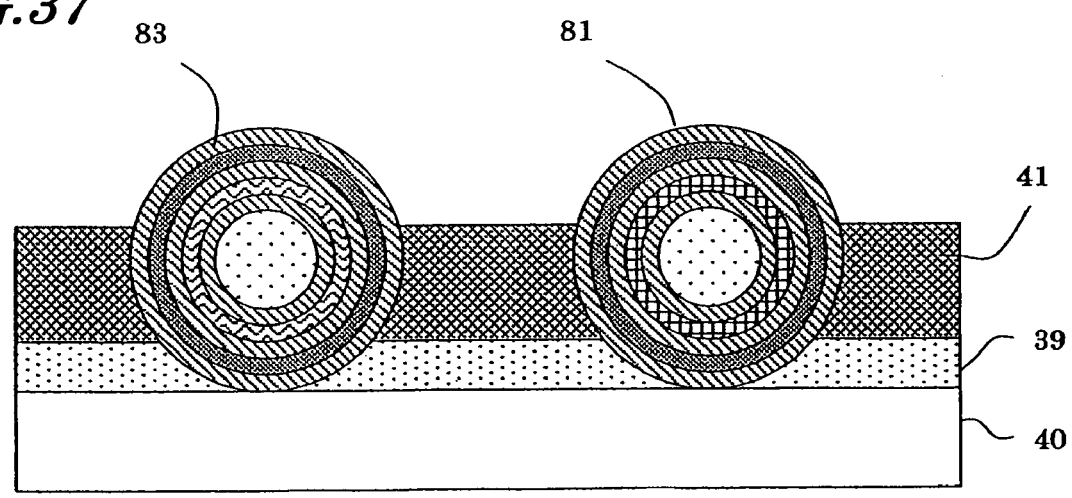
FIG. 37 is a cross-sectional view thereof taken on the plane C-C shown in FIG. 36.

The n-type and p-type function lines 81 and 83 obtained in this manner are fixed onto the base substrate 40 with the adhesive layer 39 by the method already described for the second preferred embodiment, and then the planarizing layer 41 is further provided, thereby obtaining the structure shown in FIGS. 36 and 37.

Figure 38:
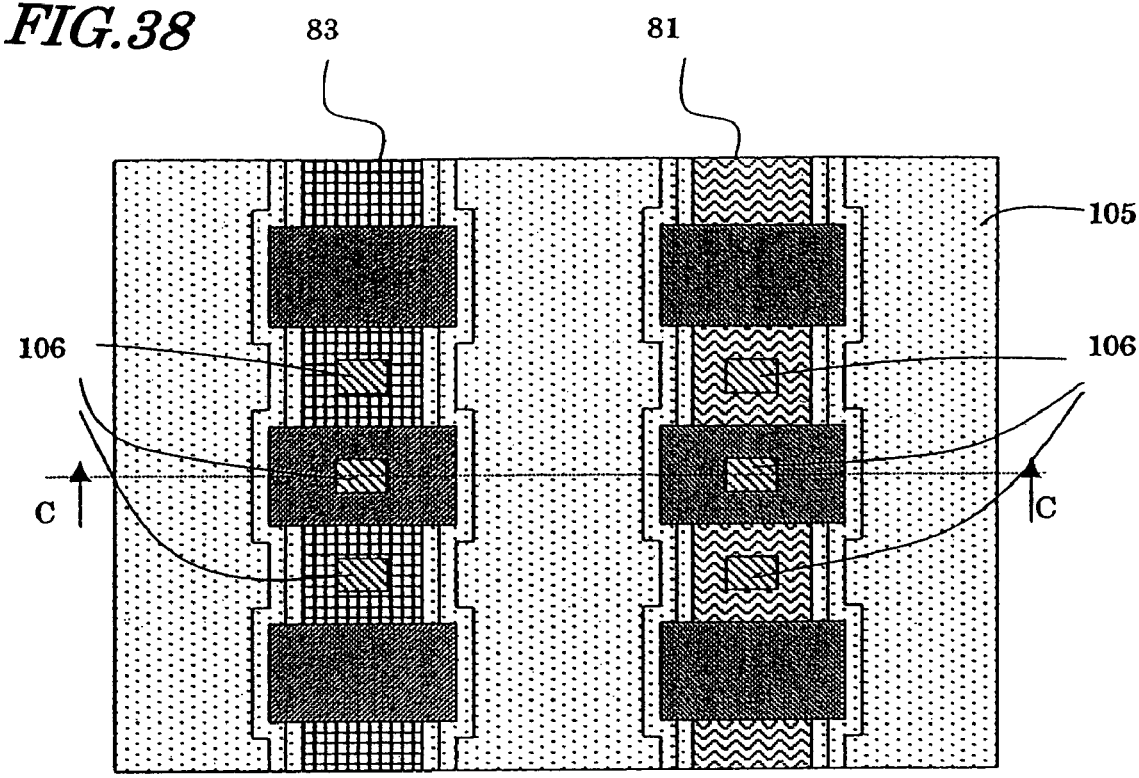
FIG. 38 is a plan view showing another process step for fabricating the active-matrix substrate shown in FIG. 26.
Figure 39:
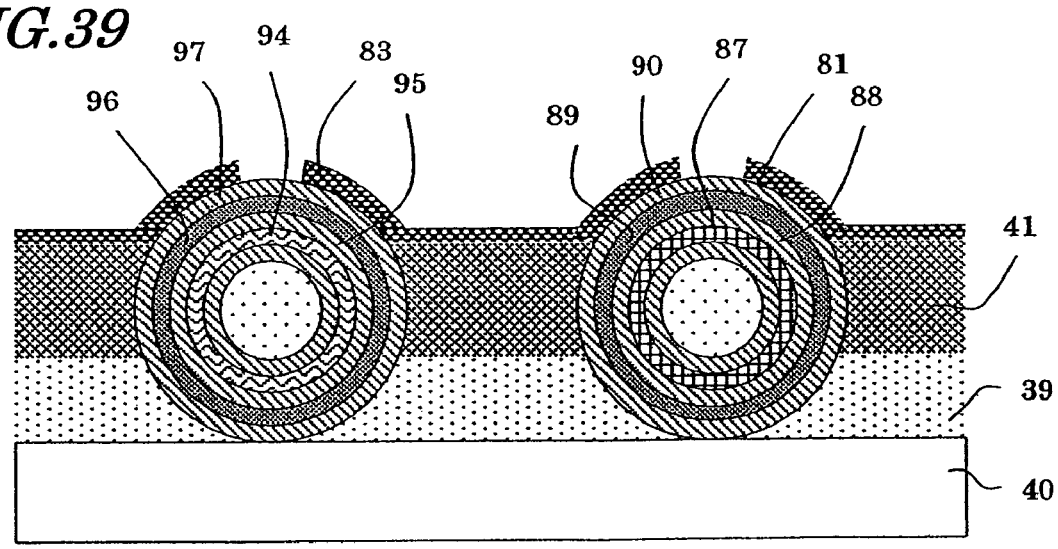
FIG. 39 is a cross-sectional view thereof taken on the plane C-C shown in FIG. 38.

Thereafter, the respective portions of the n-type and p-type function lines 81 and 83 are connected together to complete a CMOS device. Specifically, first, as shown in FIGS. 38 and 39, a photoresist is applied over the n-type function line 81, p-type function line 83 and planarizing layer 41, thereby defining a resist pattern 105 having pattern elements 106 representing contact holes. The contact hole pattern elements 106 are provided so as to expose the gate electrodes and source/drain regions of the transistors in the n-type and p-type function lines 81 and 83. Next, portions of the protective coatings 90 and 97 and portions of the insulating layers 88 and 95 are removed through the resist pattern 105. In this process step, these layers are preferably etched by such a method as doing little damage on the semiconductor layers 87 and 94 that are located under the insulating layers 88 and 95, respectively. In this preferred embodiment, BHF is carefully used so as not to etch the semiconductor layers 87 and 94.

Figure 40:
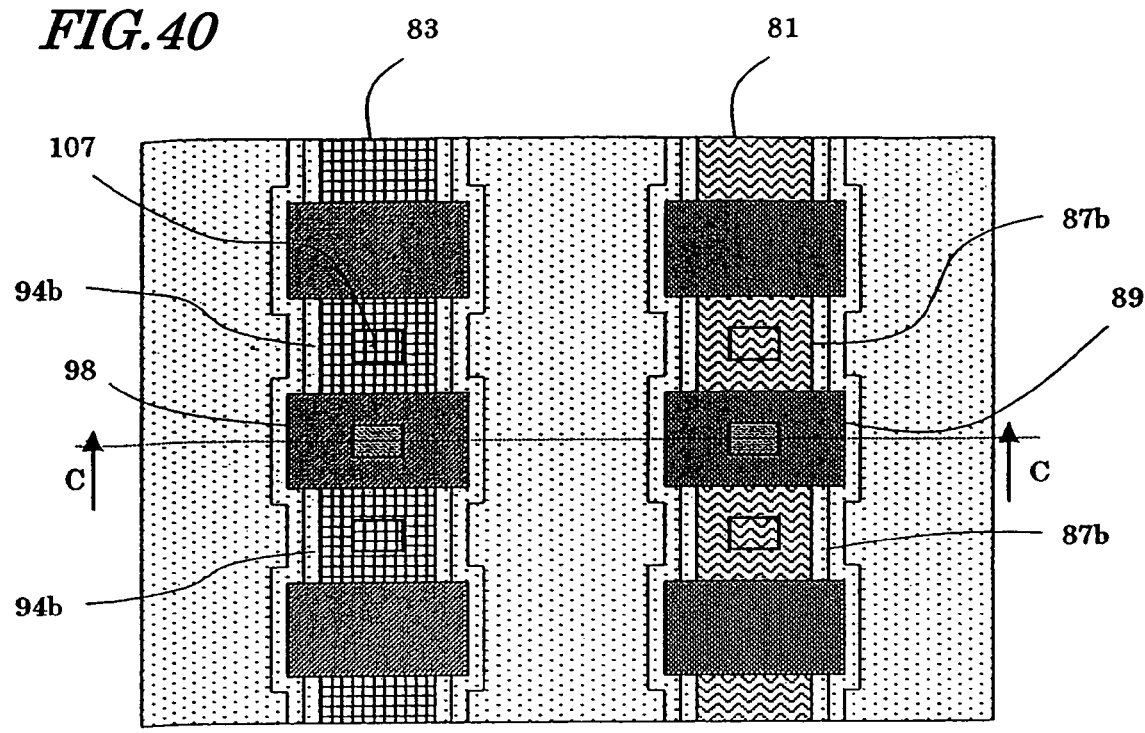
FIG. 40 is a plan view showing another process step for fabricating the active-matrix substrate shown in FIG. 26.
Figure 41:
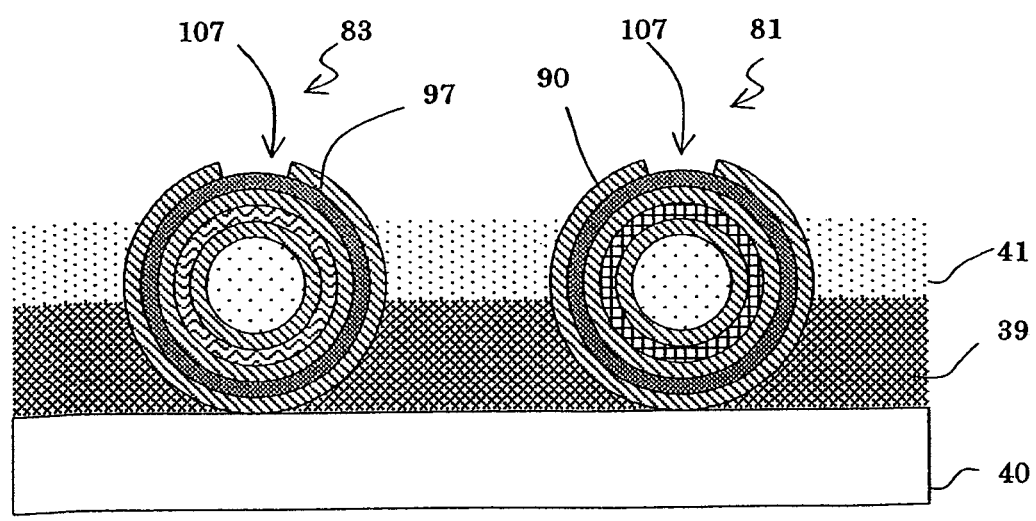
FIG. 41 is a cross-sectional view thereof taken on the plane C-C shown in FIG. 40.

As a result, contact holes 107 are formed in the protective coatings 90 and 97 as shown in FIGS. 40 and 41. The contact holes 107 expose portions of the p-type regions 87b and portions of the gate electrodes 89 in the n-type function line 81. The contact holes 107 also expose portions of the n-type regions 94b and portions of the gate electrodes 96 in the p-type function line 83.

Figure 42:
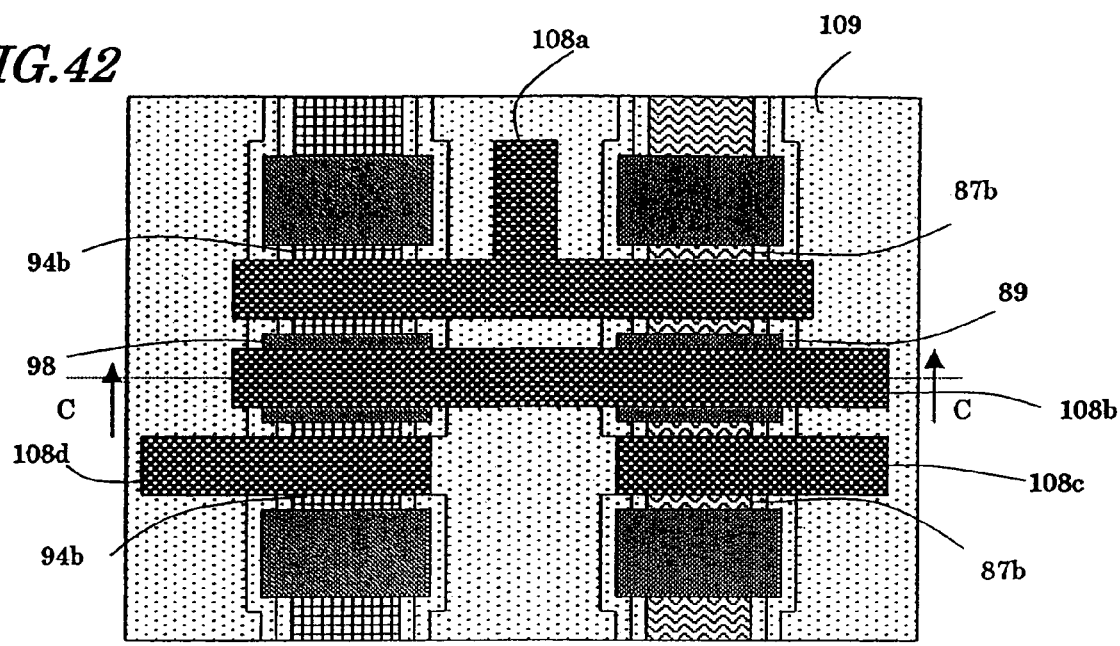
FIG. 42 is a plan view showing another process step for fabricating the active-matrix substrate shown in FIG. 26.
Figure 43:
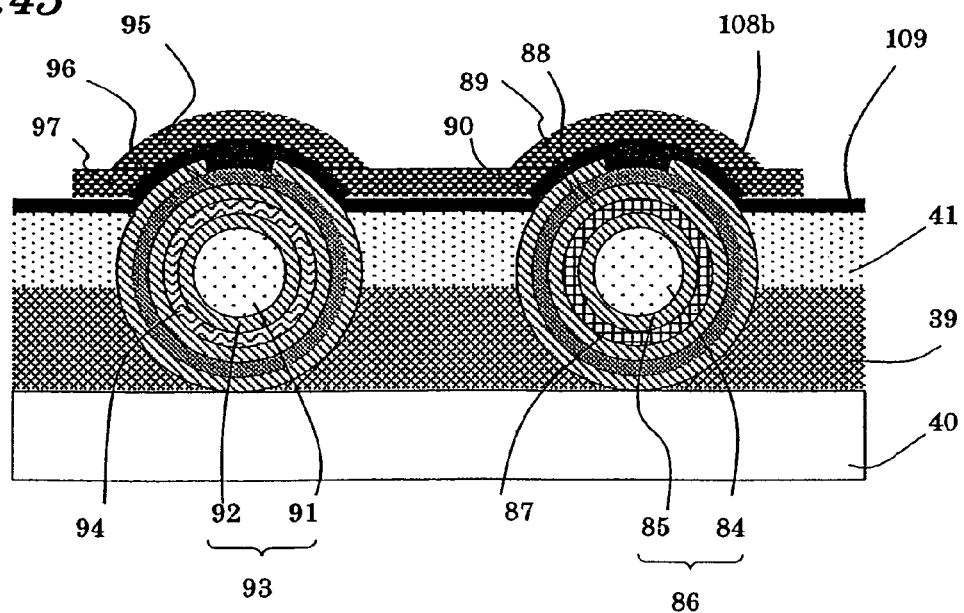
FIG. 43 is a cross-sectional view thereof taken on the plane C-C shown in FIG. 42.

Finally, as shown in FIGS. 42 and 43, a conductive thin film 109 is deposited over the planarizing layer 41, n-type function line 81 and p-type function line 83, and then resist pattern elements 108a, 108b, 108c and 108d are defined on the conductive thin film 109. The resist pattern elements 108a, 108b, 108c and 108d are provided so as to cover the p-type regions 87b, n-type regions 94b and gate electrodes 89 and 96, which have been exposed through the contact holes 107. Then, using the resist pattern elements 108a, 108b, 108c and 108d as a mask, the conductive thin film 109 is selectively etched, thereby forming the interconnects 98, 99, 100 and 101 shown in FIG. 26. In this manner, the transistors 80 and 82 are connected together to complete a CMOS device.

Embodiment 4

An active-matrix substrate according to a fourth preferred embodiment is obtained by combining the active-matrix substrate of the second preferred embodiment with the driver circuit of the third preferred embodiment.

Figure 44:
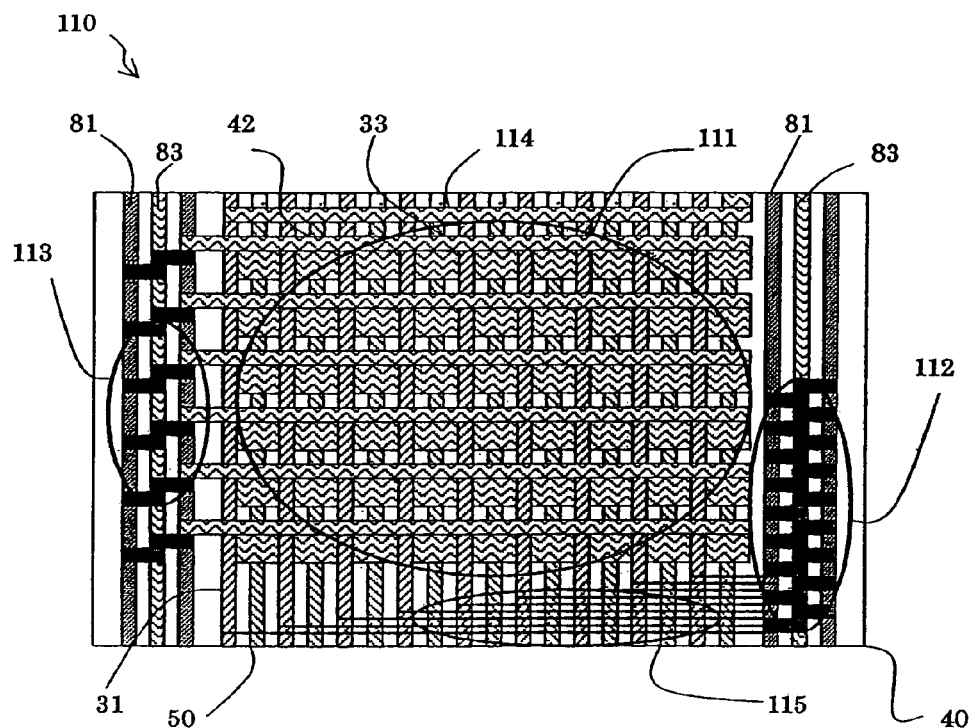
FIG. 44 is a plan view illustrating an active-matrix substrate according to a fourth preferred embodiment.

As shown in FIG. 44, the active-matrix substrate 110 includes a pixel region 111, a gate line driver 112, and a data line driver 113 on the base substrate 40.

The pixel region 111 includes the function lines 31, storage capacitor lines 50, pixel electrodes 33 and data lines 42 as described for the second preferred embodiment. The storage capacitor lines 50 are connected together by way of interconnects 114.

The gate line driver 112 includes the n-type and p-type function lines 81 and 83. The NMOS and PMOS transistors included in these function lines are connected together via interconnects so as to form this driver circuit including CMOS devices. The gate line driver 112 is connected to the cores (not shown) of the function lines 31 in the pixel region 111 through interconnects 115.

In the same way, the data line driver 113 also includes the n-type and p-type function lines 81 and 83. The NMOS and PMOS transistors included in these function lines are connected together via interconnects so as to form this driver circuit including CMOS devices. The data line driver 113 is connected to the data lines 42 in the pixel region 111.

Each of the function lines 31 in the pixel region 111 includes a huge number of transistors. Accordingly, each of those transistors preferably has a structure that is affected by any misalignment as little as possible. On the other hand, in the gate line driver 112 and data line driver 113, just a small number of transistors are included in each of the n-type function lines 81 and p-type function lines 83. However, since each of those transistors has a complicated structure, the transistor also preferably has its structure and sizes defined so as to be affected by any misalignment as little as possible.

In fabricating the active-matrix substrate 110, the function lines 31, n-type function lines 81 and p-type preferred embodiments 83 have best structures for their respective applications, and are made of their best materials by their best processes, as already described for the second and third preferred embodiments. That is to say, in selecting materials or setting process temperatures, no mutual restraints are imposed upon each other.

After the function lines 31, n-type function lines 81 and p-type function lines 83 have been fixed onto the base substrate 40, a planarizing process is carried out as needed. Thereafter, interconnects 115, etc. to define the data lines 42, pixel electrodes 33 and CMOS devices are appropriately formed by the same process. If the n$^+$ layer needs to be provided only in the pixel region 111, an n$^+$ layer is once deposited all over the base substrate 40 and then partially removed from the regions to provide the gate line driver 112 and data line driver 113. Thereafter, a conductive thin film is deposited over the base substrate 40 and the interconnects 115, etc. to define the data lines 42, pixel electrodes 33 and CMOS devices may be formed by a patterning process.

The active-matrix substrate 110 of this preferred embodiment is supposed to be used in a reflective LCD including thin-film transistors. However, the active-matrix substrate 110 is easily modifiable so as to be used in a transmissive LCD including thin-film transistors. In that case, the pixel electrodes 33 may be made of a transparent conductor such as an ITO, the data lines 42 may be made of a conductive resin, and the interconnects to define CMOS devices may be made of aluminum, for example. Also, the data lines 42 may be either metal wires or metal-coated non-metal wires.

The active-matrix substrate 110 described above can be used effectively in an LCD. For example, by preparing a counter substrate including a counter electrode and a color filter layer, providing alignment films for the active-matrix substrate and counter substrate, subjecting the alignment films to a rubbing treatment, bonding the two substrates together with a seal member so that the treated surfaces are opposed to each other, and then injecting a liquid crystal material into the gap between the substrates, an LCD according to the present invention can be obtained.

Furthermore, the present invention is applicable for use in not just LCDs. For example, by using a material, of which the optical properties change or which emit some light upon the application of a voltage, as a display medium layer and by interposing such a display medium layer between a counter substrate and the active-matrix substrate of the present invention, various other types of display devices can be obtained. Specifically, the active-matrix substrate of the present invention can also be used effectively in an organic EL display device, which uses an organic electroluminescent material as a display medium layer, and other types of display devices.

Embodiment 5

An active-matrix substrate according to a fifth preferred embodiment includes a driver circuit to drive a pixel region made up of multiple pixels, and the driver circuit is made up of CMOS devices that include a semiconductor layer held on a foil substrate.

Figure 45:
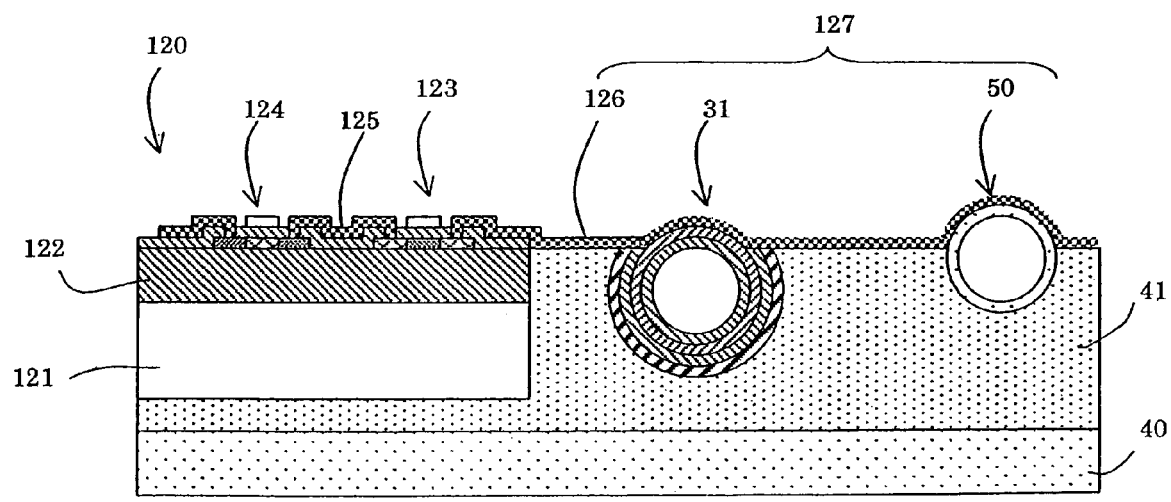
FIG. 45 is a cross-sectional view illustrating an active-matrix substrate according to a fifth preferred embodiment.

As shown in FIG. 45, the driver circuit 120 includes a foil substrate 121, an insulating film 122 provided on the foil substrate 121, and an NMOS transistor 123 and a PMOS transistor 124, which are provided on the insulating film 122. The NMOS and PMOS transistors 123 and 124 are connected together with an interconnect 125 so as to make up a CMOS device. Only these two transistors are illustrated in FIG. 45. Actually, though, a number of NMOS transistors 123 and a number of PMOS transistors 124 are arranged in the direction coming out of the paper.

The driver circuit 120 is embedded in a planarizing layer 41 on the base substrate 40 of the active-matrix substrate. A pixel region 127, in which a function line 31 and a storage capacitor line 50 are provided, and the driver circuit 120 are connected together by way of an interconnect 126. If there is a big level difference between the surface of the driver circuit 120 and that of the planarizing layer 41, then it is difficult to provide the interconnect 126. For that reason, the level difference between the surface of the driver circuit 120 and that of the planarizing layer 41 is preferably as small as possible.

In the active-matrix substrate of this preferred embodiment, the driver circuit 120 is fabricated before being fixed onto the base substrate 40. Accordingly, the driver circuit 120 can be made at the best temperature for the transistors, making up the driver circuit 120, irrespective of the heat resistance temperature of the base substrate 40.

Also, not all of the semiconductor devices making up the driver circuit have to be made of silicon but some of them may be made of any other semiconductor such as gallium arsenide. Various semiconductor materials may be selected according to the intended application and function. As a result, some functions, which should be unachievable by a single semiconductor material, can also be achieved.

In addition, as the driver circuit 120 is provided on the flat foil substrate 121, the driver circuit 120 can be made by substantially the same process as a conventional semiconductor device to be provided on a semiconductor substrate. Accordingly, the driver circuit 120 can be fabricated at an reasonable cost and a good yield.

Hereinafter, a method for fabricating this driver circuit 120 will be described.

Figure 46:
FIG. 46 is a cross-sectional view showing a process step for fabricating the active-matrix substrate shown in FIG. 45.
Figure 47:
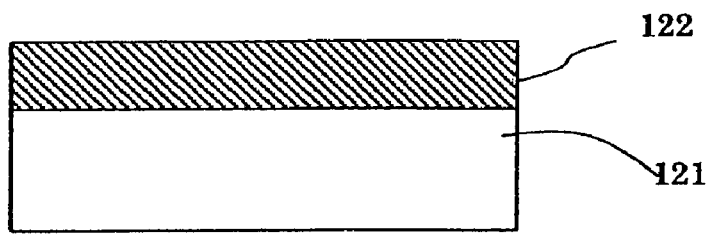
FIG. 47 is a cross-sectional view showing another process step for fabricating the active-matrix substrate shown in FIG. 45.

First, as shown in FIGS. 46 and 47, an insulating film 122 is deposited to a thickness of 1 μm on a foil substrate 121 made of tungsten, for example, and having a thickness of about 50 μm. The foil substrate 121 is preferably made of a material with a high melting point and high chemical resistance (e.g., tungsten, tantalum or molybdenum). If the insulating layer 122 is sufficiently thick and the process adopted should cause no corrosion or etching from the back surface of the foil substrate 121 or if another insulating film is provided on the back surface, then the foil substrate 121 may be made of a stainless steel, for example.

The insulating layer 122 may be formed by a PECVD process, for example. Alternatively, the insulating layer 122 may also be made by any other known thin film deposition technique such as a thermal CVD process, a vacuum evaporation process or an anodic oxidation process. As another alternative, a spin on glass (SOG) solution may be applied and then thermally treated. The insulating layer 122 preferably has a thickness of 1 μm to 10 μm.

The foil substrate 121 may be either a wafer with appropriate dimensions (e.g., 300 mm×300 mm) to be subjected to a single-wafer process or a continuously rolled foil substrate 121. For example, the driver circuits 120 may be formed continuously using a roll-to-roll semiconductor processing system such as that shown in FIG. 48.

Figure 48:
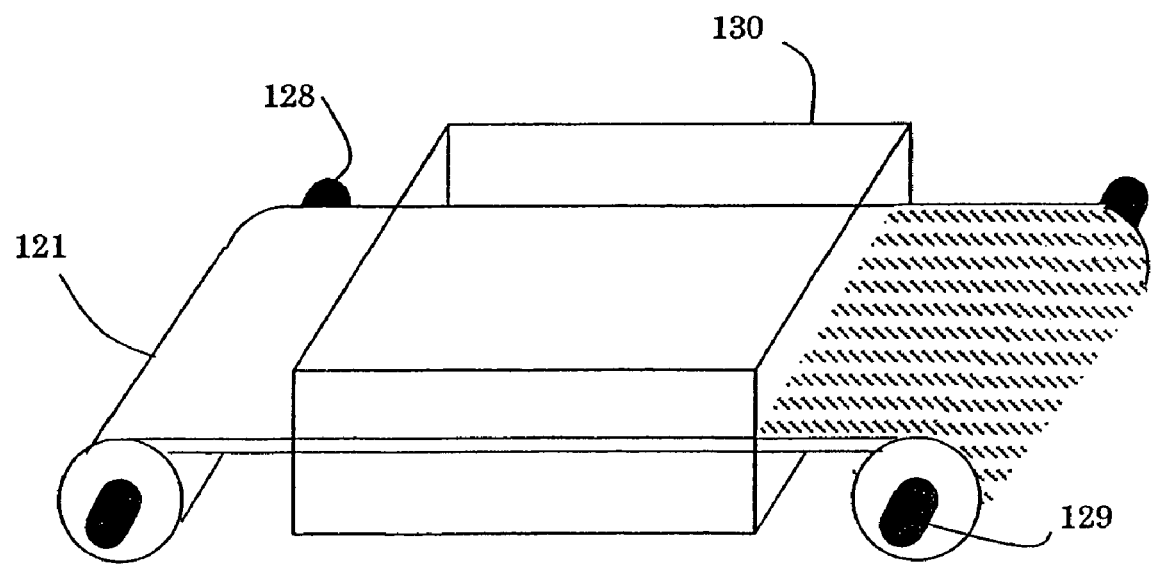
FIG. 48 is a schematic perspective view illustrating an apparatus for depositing a thin film on a foil substrate.

The system shown in FIG. 48 uses a rolled tungsten foil as the foil substrate 121. The foil substrate 121 wound around a roll 128 may have a width of 500 mm, for example, and is supposed to be reeled up on another roll 129 after various thin films have been deposited thereon in a film deposition chamber 130. Just one deposition chamber 130 is illustrated in FIG. 48. However, multiple deposition chambers may be provided and an annealing furnace may also be provided to carry out an annealing process. Although not shown in FIG. 48, boundary walls, doors, exhaust pumps and so on are appropriately connected to the deposition chamber 130.

Figure 49:
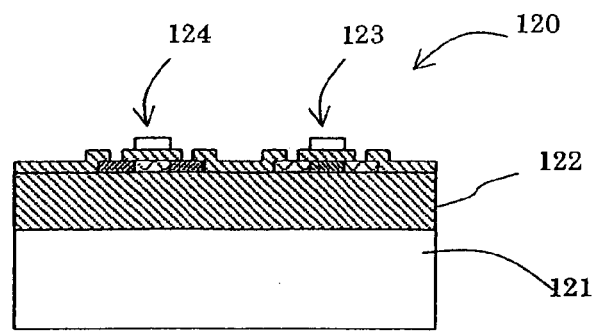
FIG. 49 is a cross-sectional view showing another process step for fabricating the active-matrix substrate shown in FIG. 45.

Next, as shown in FIG. 49, an NMOS transistor 123 and a PMOS transistor 124 are formed on the insulating layer 122 by a conventional semiconductor process. If the rolled tungsten foil is used as the foil substrate 121, then the NMOS and PMOS transistors 123 and 124 are fabricated using the apparatus shown in FIG. 50.

Figure 50:
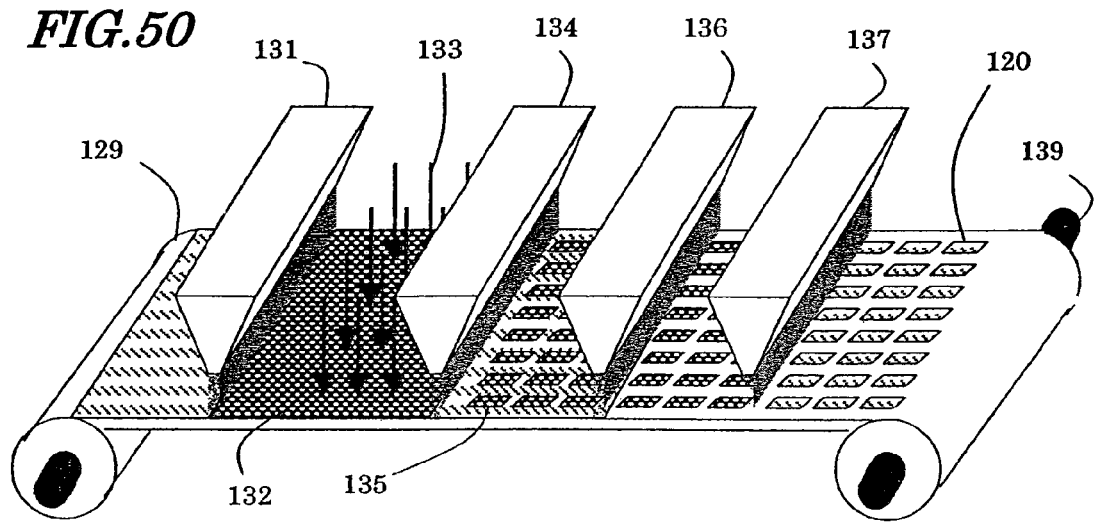
FIG. 50 is a schematic perspective view illustrating an apparatus for patterning the thin film that has been deposited on the foil substrate.
Figure 51:
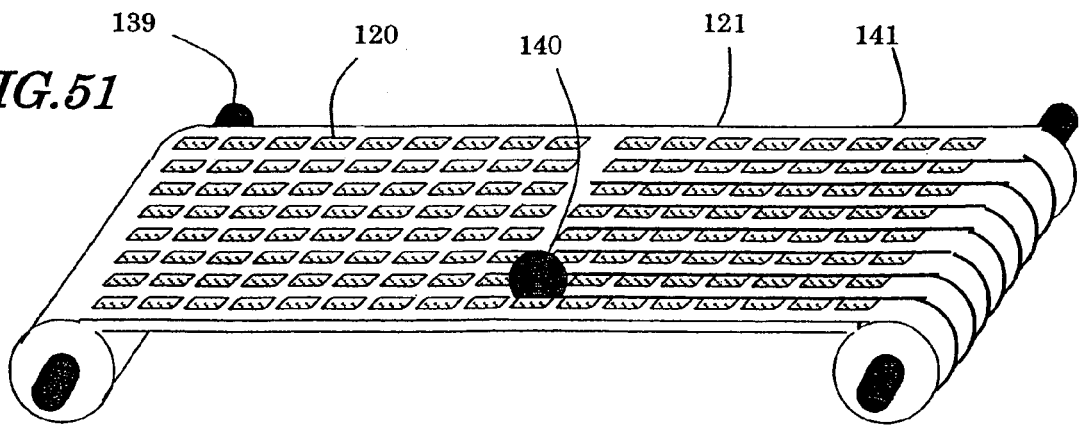
FIG. 51 is a schematic perspective view illustrating an apparatus for cutting the foil substrate.

The apparatus shown in FIG. 50 is used to do a patterning process on the thin film that has been deposited on the foil substrate 121. In the apparatus shown in FIG. 50, a resist is ejected from a resist application nozzle 131, thereby forming a resist layer 132 to a desired thickness on the foil substrate 121 that has been delivered from the roll 129. The resist layer 132 is exposed to ultraviolet rays 133 that have been transmitted through a photomask, and then a developer such as tetramethyl ammonium hydroxide (TMAH) is ejected from a development nozzle 134, thereby defining a resist pattern 135.

Subsequently, an etchant is ejected from a nozzle 136, thereby etching the thin film on the foil substrate 121 using the resist pattern 135 as a mask. For example, if the thin film is a silicon dioxide film, then BHF is used as the etchant. Finally, a stripping agent is ejected from a nozzle 137. In this manner, a desired pattern is defined on the foil substrate 121, which is then reeled up on a roll 139.

Although not shown for the apparatus of FIG. 50, a washer using pure water, a drier using nitrogen gas, an annealer using a lamp heater and so on may also be additionally provided. Also, the apparatus shown in FIG. 50 performs the process steps of defining a resist pattern, etching and stripping the resist in series by itself. However, if the etching is carried out as a dry etching process, then these process steps may be performed using respectively different apparatuses.

By appropriately using the apparatuses shown in FIGS. 48 and 50, various thin films are deposited on the tungsten foil 121 and then patterned. In this manner, a plurality of driver circuits 120 can be obtained by forming NMOS and PMOS transistors 123 and 124 on the foil substrate 121 by a conventional semiconductor process.

A number of driver circuits 120 that have been formed on the rolled foil substrate 121 are then cut and divided into individual circuits for respective foil substrates 121. In this preferred embodiment, each driver circuit 120 and a function line 31 are used in combination, thereby making up an active-matrix substrate. In this case, the driver circuits 120 are preferably separated into a number of tapes so as to be arranged on the substrate along the function lines 31. For example, as shown in FIG. 50, the rolled foil substrate 121 with a width of 500 mm may be cut by a dicer 140 into semiconductor tapes 141 with a width of 10 mm.

Figure 52:
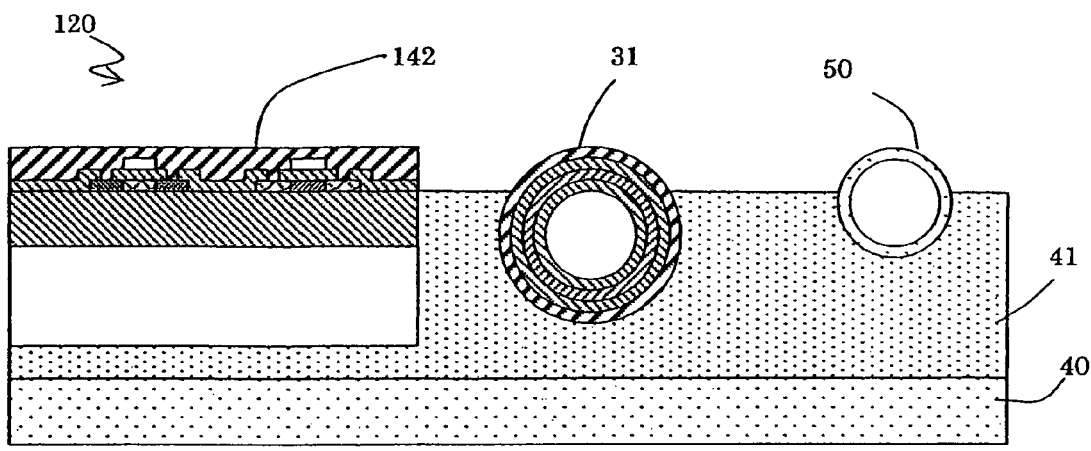
FIG. 52 is a cross-sectional view showing another process step for fabricating the active-matrix substrate shown in FIG. 45.
Figure 53:
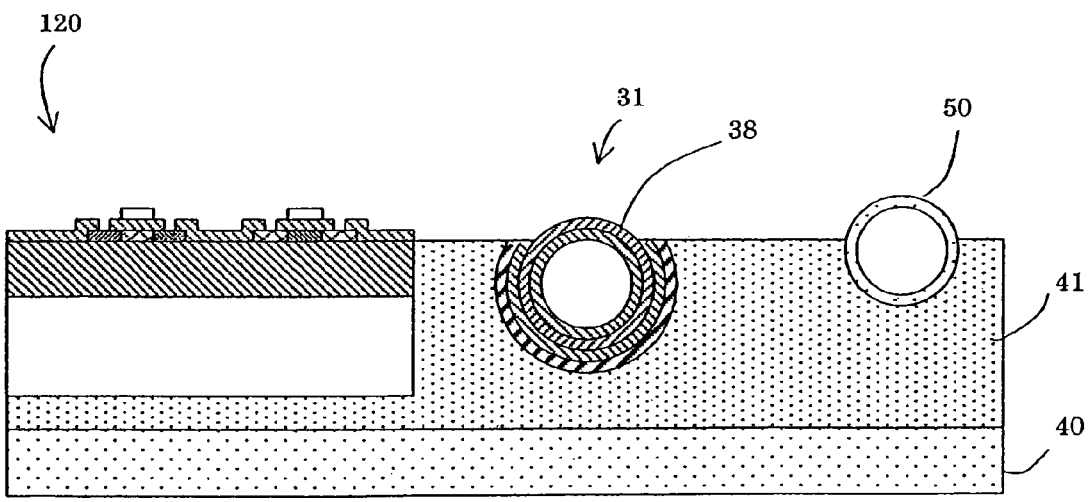
FIG. 53 is a cross-sectional view showing another process step for fabricating the active-matrix substrate shown in FIG. 45.

Subsequently, as shown in FIG. 52, a string of driver circuits 120 connected together just like a tape, as well as the function line 31 and storage capacitor line 50, are fixed onto the base substrate 40 and then the surface of the base substrate 40 is flattened with the planarizing layer 41. In this case, the top of the driver circuits 120 preferably has a height of at most 1 μm as measured from the surface of the planarizing layer 41. Thereafter, a resist pattern 142 is defined so as to cover the driver circuits 120 and then the semiconductor layer 38 of the function line 31 is exposed as shown in FIG. 53.

Finally, the interconnects 126 to connect the pixel region 127 to the driver circuits 120 and the interconnects 125, pixel electrodes and so on to connect the NMOS and PMOS transistors 123 and 124 together and make up CMOS devices are formed at the same time, thereby completing an active-matrix substrate.

Embodiment 6

Hereinafter, a counter matrix image display device using function lines according to a sixth preferred embodiment will be described.

In the active-matrix substrate of the second preferred embodiment described above, the semiconductor layer is provided on the entire outer surface of the function line and the multiple transistors defined by the function line are connected together by way of the semiconductor layer. Accordingly, not only current supplied from a data line by way of the channel but also leakage current from the data line of an adjacent transistor may flow into the drain electrode of each transistor.

This does not cause a serious problem if the gap between the drain electrode and the data line of the adjust transistor is sufficiently wide or if the channel defined in the semiconductor layer has sufficiently high resistance. However, if the present invention is applied to a high-definition image display device, then that leakage current may deteriorate the display quality. In that case, the present invention is preferably applied to a counter matrix image display device.

Figure 54:
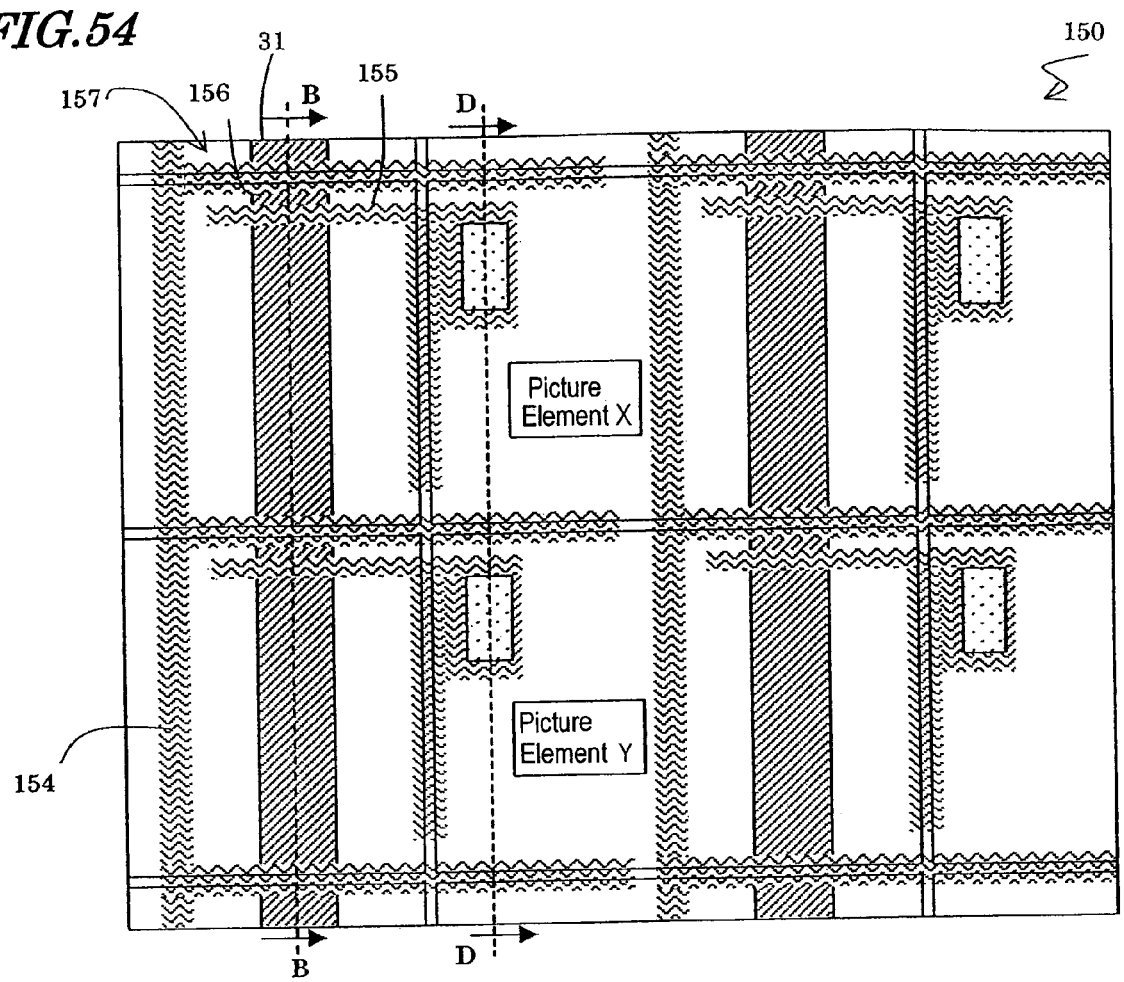
FIG. 54 is a plan view illustrating an image display device according to a sixth preferred embodiment.
Figure 55:
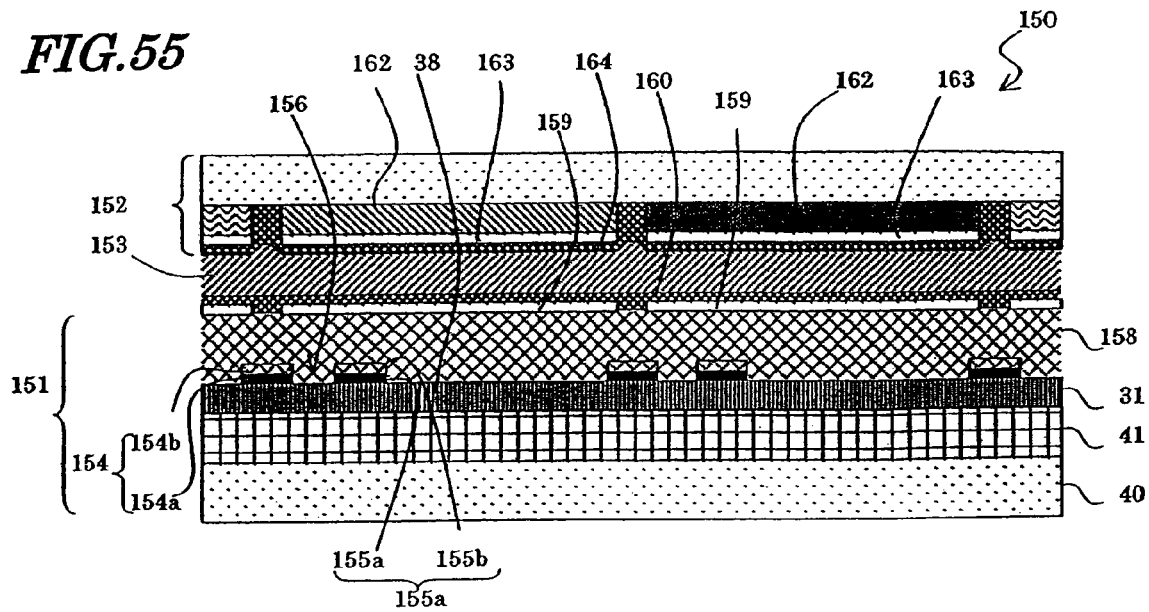
FIG. 55 is a cross-sectional view thereof taken on the plane B-B shown in FIG. 54.
Figure 56:
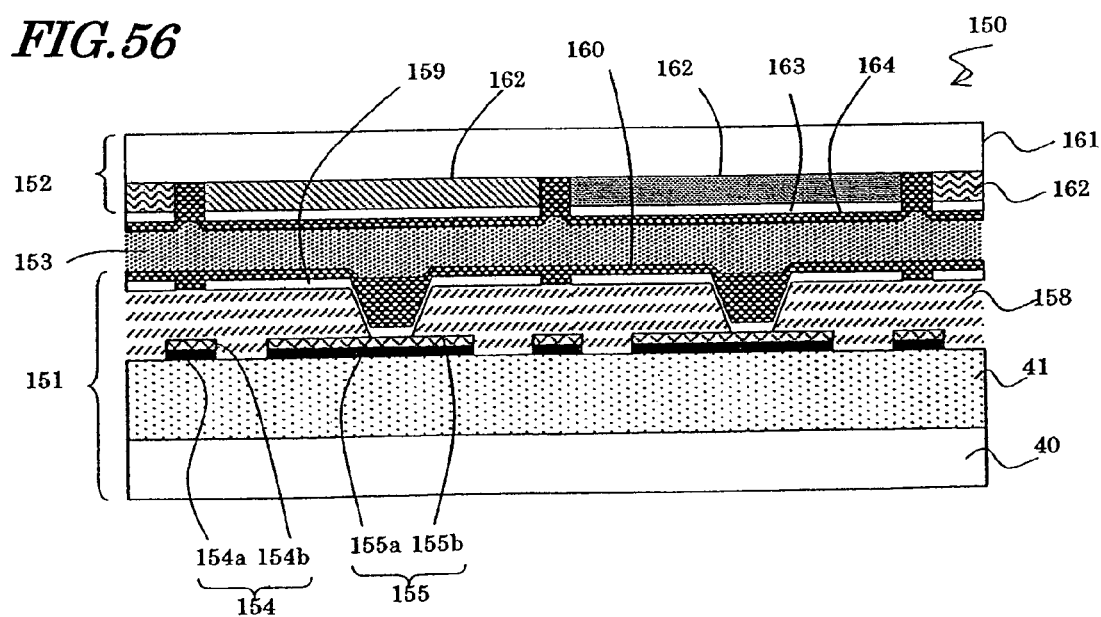
FIG. 56 is a cross-sectional view thereof taken on the plane D-D shown in FIG. 54.

FIG. 54 is a plan view illustrating a counter matrix image display device 150. FIGS. 55 and 56 are cross-sectional views thereof respectively taken on the planes B-B and D-D shown in FIG. 54.

The image display device 150 includes an active-matrix substrate 151, a counter substrate 152, and a liquid crystal layer 153 sandwiched between these two substrates 151 and 152. In the active-matrix substrate 151, the function line 31 is fixed onto the base substrate 40 with the planarizing layer 41 as shown in FIG. 55. The active-matrix substrate 151 includes reference potential supply lines 154, each consisting of an n$^+$ layer 154a and a metal layer 154b, and drain electrodes 155, each also consisting of an n$^+$ layer 155a and a metal layer 155b.

A portion of each drain electrode 155 and a portion of each reference potential supply line 154 overlap with the semiconductor layer 38, which is exposed on the outer surface of the function line 31, as first and second conductive layers, respectively, while the other portions thereof do not overlap with the semiconductor layer 38 but are supported by the planarizing layer 41. A region 156, defined by the reference potential supply line 154 and drain electrode 155 in the semiconductor layer 38, serves as a channel, thereby making a transistor 157. The portion of the reference potential supply line 154 overlapping with the semiconductor layer 38 functions as the source electrode of the transistor. The core (not shown) of the function line 31 functions as a gate electrode and is also used as a gate line.

As shown in FIG. 56, an interlevel dielectric film 158 is provided so as to cover the reference potential supply lines 154 and drain electrodes 155. Pixel electrodes 159, made of a transparent electrode film, are arranged on the interlevel dielectric film 158 and are connected to the drain electrodes 155 by way of contact holes extending through the interlevel dielectric film 158. An alignment film 156 of polyimide, for example, is further provided so as to cover the pixel electrodes 159.

The counter substrate 152 includes a base substrate 161, and color filters 162 and data lines 163 that are provided on the base substrate 161. The data lines 163 are arranged so as to cross the function lines 31 at right angles.

Such a counter matrix image display device is disclosed as a display technique for preventing DC level shifting in Japanese Laid-Open Publication No. 4-219735, for example. In the counter matrix image display device 150, the reference potential supply lines 154 are provided parallel to the gate lines (i.e., the cores of the function lines 31) and the pixel electrodes 159 are connected to the reference potential supply lines 154 by way of the semiconductor layer 38. The data lines 163 are provided on the counter substrate 152. And the liquid crystal layer 153 is driven with a potential difference created between the pixel electrodes 159 and data lines 163.

In such a structure, the same signal is input to multiple pixel electrodes 159 that are arranged along the same function line 31. For example, the pixels X and Y shown in FIG. 54 are maintained at the same potential level. Accordingly, even if the semiconductor layer surrounds the outer surface of the function line entirely, the inflow of the leakage current can be minimized because each pair of adjust pixel electrodes 159 has the same potential level. As a result, a high-definition image display device ensuring good image quality is realized.

Embodiment 7

Hereinafter, an active-matrix substrate 201 according to a seventh preferred embodiment will be described with reference to FIG. 57. The active-matrix substrate 201 is different from the active-matrix substrate 30 of the second preferred embodiment in that the base substrate 210 thereof has grooves 211 and 212 to receive and embed the function line 31 and storage capacitor line 50, respectively.

Figure 57:
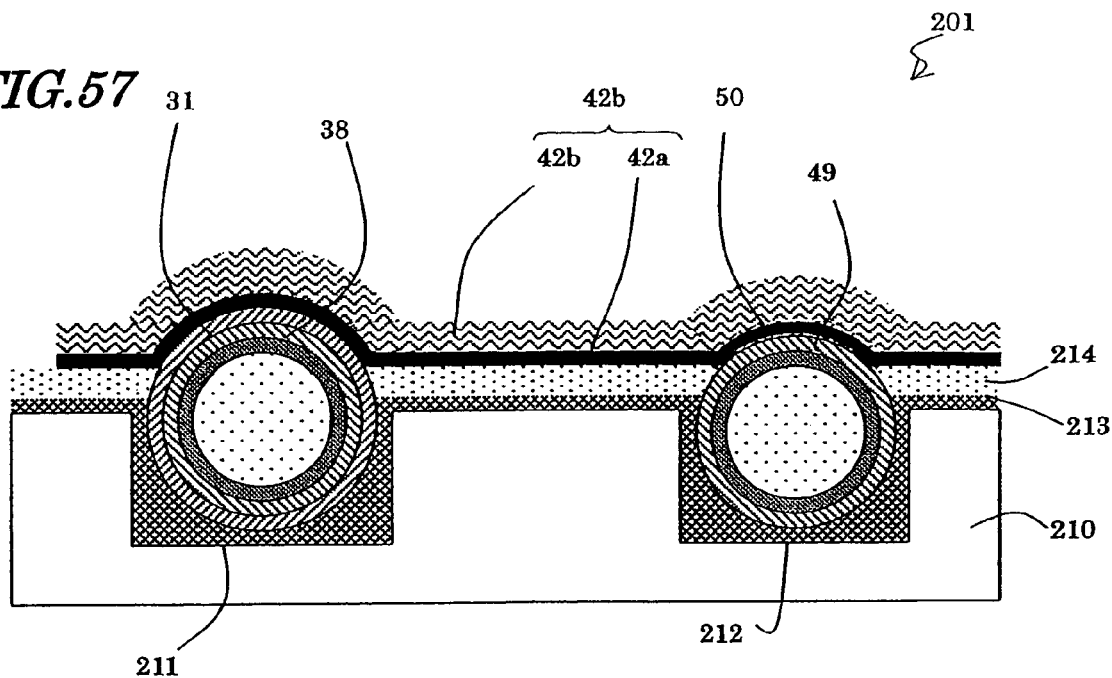
FIG. 57 is a cross-sectional view illustrating a portion of an active-matrix substrate according to a seventh preferred embodiment.

As shown in FIG. 57, the base substrate 210 of the active-matrix substrate 201 includes the groove 211 to embed a portion of the function line 31 therein and the groove 212 to embed a portion of the storage capacitor line 50 therein. The function line 31 and storage capacitor line 50 are put in the grooves 211 and 212, respectively, and the gap between the groove 211 and the function line 31 and the gap between the groove 212 and the storage capacitor line 50 are closed with an adhesive layer 213, thereby fixing the function line 31 and storage capacitor line 50 onto the base substrate 210. A planarizing layer 214 is further provided on the surface of the base substrate 210.

The grooves 211 and 212 may have the same size. However, if the function line 31 and storage capacitor line 50 have different diameters, then the grooves 211 and 212 preferably have different sizes corresponding to the respective diameters. For example, if the function line 31 and storage capacitor line 50 have diameters of 30 µm and 20 µm, respectively, then the groove 211 preferably has a width of 32 µm and a depth of 29 µm and the groove 212 preferably has a width of 22 µm and a depth of 19 µm. When these sizes are adopted, the function line 31 and storage capacitor line 50 will protrude just 1 µm each over the base substrate 40. In that case, even if the planarizing layer 214 is not so thick, the surface of the base substrate 40 can be flattened.

As in the second preferred embodiment described above, the data lines 42, each consisting of the $n^+$ layer 42a and metal layer 42b, the pixel electrodes and so on are provided on the planarizing layer 214.

In this active-matrix substrate 201, the function line 31 and storage capacitor line 50 can be easily fixed onto the base substrate 210 and the surface of the base substrate 210 can be flattened easily, too.

The active-matrix substrate 201 may be fabricated as in the second preferred embodiment described above except the process step of preparing the base substrate 210 with the grooves 211 and 212. If a plastic substrate is used as the base substrate 210, then the grooves may be shaped by pressing dies onto the plastic substrate being formed. On the other hand, if a glass substrate or a metal foil substrate is used as the base substrate 210, then the grooves 211 and 212 may be shaped by an etching process. Alternatively, a sufficiently thick resin layer may be deposited on the glass substrate or metal foil substrate and then pressed against dies, for example, so as to shape the grooves 211 and 212.

In any case, after the base substrate 210 with the grooves 211 and 212 has been prepared, the adhesive layer 213 may be formed on the surface of the base substrate 210 and inside the grooves 211 and 212 by a spin coating technique, for example, and then the function line 31 and storage capacitor line 50 may be arranged and bonded thereto.

Embodiment 8

Hereinafter, an active-matrix substrate 202 according to an eighth preferred embodiment will be described with reference to FIG. 58. The active-matrix substrate 202 is different from the active-matrix substrate 201 of the seventh preferred embodiment described above in that an adhesive layer 215 for fixing the function line 31 and storage capacitor line 50 onto the base substrate 210 has light blocking ability.

Figure 58:
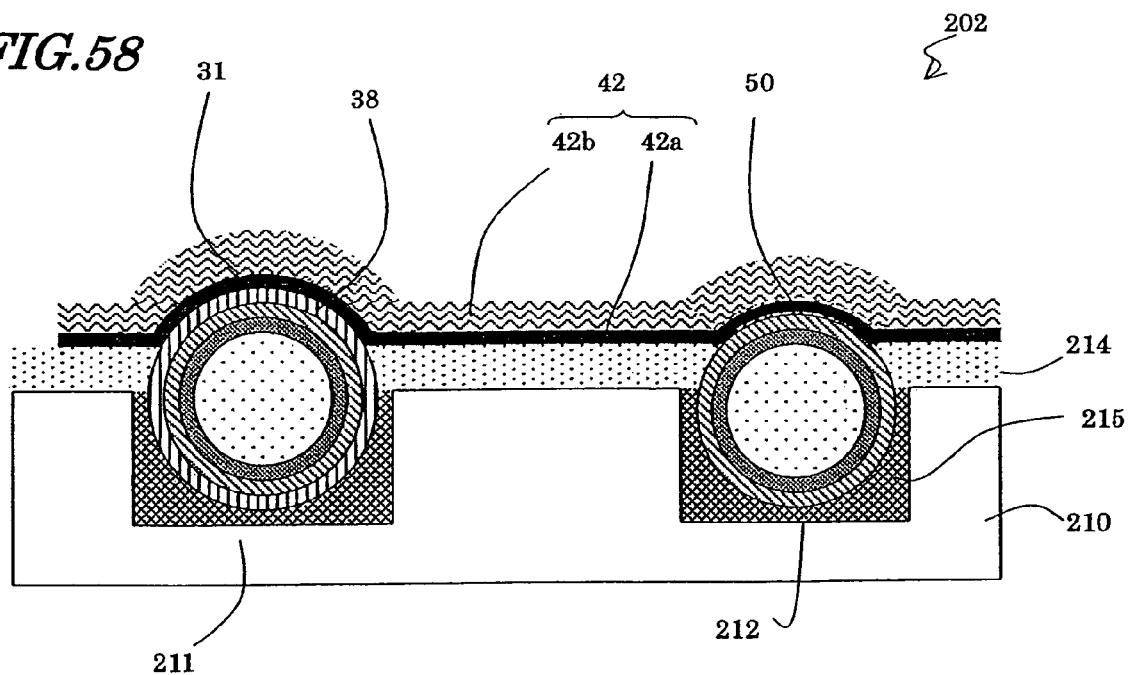
FIG. 58 is a cross-sectional view illustrating a portion of an active-matrix substrate according to an eighth preferred embodiment.

In the active-matrix substrate 202, the adhesive layer 215 for filling the grooves 211 and 212 in the base substrate 210 and fixing the function line 31 and storage capacitor line 50 into the grooves 211 and 212, respectively, have light blocking ability as shown in FIG. 58.

By using such an adhesive layer 215 with light blocking ability, it is possible to prevent the semiconductor layer 38 of the function line 31 from being exposed to light coming from under the base substrate 210. Thus, an optically induced leakage current, which would otherwise be produced due to a decrease in electrical resistance of the semiconductor layer when the channel of a transistor in the function line 31 is exposed to light, can be minimized.

As the adhesive layer 215, a black matrix (BM) resin, in which a black pigment is dispersed, may be used, for example.

The adhesive layer 215 with light blocking ability may be replaced with an adhesive layer with no light blocking ability (e.g., the adhesive layer 213 for the seventh preferred embodiment described above) by providing an opaque thin film inside the grooves 211 and 212. In that case, the opaque thin film may be an amorphous SiGe thin film, an amorphous SiSn thin film or any other suitable thin film. Optionally, a metal thin film of Cr may be used or a thin film of a BM resin may be applied as well. If the opaque thin film has electrical conductivity, then the adhesive layer and planarizing layer 214 should be made of insulating materials such that the function line 31 and opaque thin film will not be electrically continuous with each other.

Embodiment 9

Hereinafter, an active-matrix substrate 203 according to a ninth preferred embodiment will be described with reference to FIGS. 59 through 62. The active-matrix substrate 203 is different from the active-matrix substrate 30 of the second preferred embodiment described above in that the function line 216 is covered with an insulating protective coating 217 and an opaque layer 218.

Figure 59:
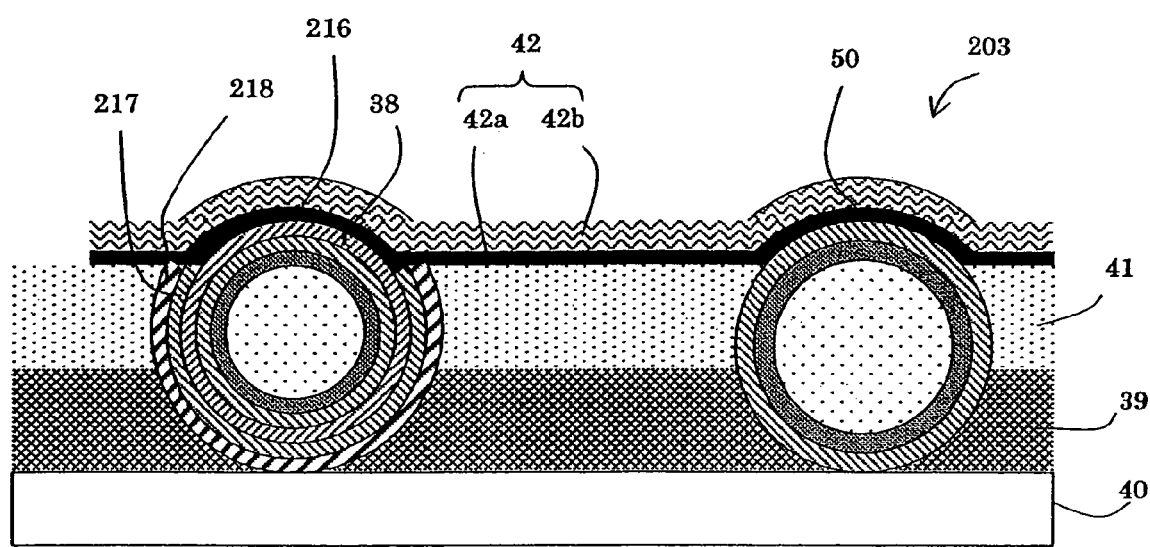
FIG. 59 is a cross-sectional view illustrating a portion of an active-matrix substrate according to a ninth preferred embodiment.

In the active-matrix substrate 203, the insulating protective coating 217 covers the semiconductor layer 38 of the function line 216 and the opaque layer 218 further covers the insulating protective coating 217 as shown in FIG. 59.

The data line 42 and drain electrode (not shown) need to overlap with, and make electrical contact with, the semiconductor layer 38. Accordingly, the insulating protective coating 217 and opaque layer 218 are partially etched away in the exposed portion of the function line 216 on the planarizing layer 41. As a result, a portion of the semiconductor layer 38 is exposed and connected to the data line 42 and drain electrode.

The insulating protective coating 217 may be made of silicon nitride or silicon dioxide. As the opaque layer 218, an amorphous SiGe thin film, an amorphous SiSn thin film, a chromium thin film or a BM thin film may be used. The insulating protective coating 217 is not always necessary. However, by providing the insulating protective coating 217, it is possible to prevent the semiconductor layer 38 from being contaminated with the material of the opaque layer 218. On the other hand, if the opaque layer 218 has electrical conductivity, the insulating protective coating 217 needs to be provided. The opaque layer 218 is preferably made of a material that can be easily patterned by an etching process.

In the active-matrix substrate 203, even if the base substrate 40, adhesive layer 39 and planarizing layer 41 have no light blocking ability, most of the semiconductor layer 38 can still be shielded from light. Accordingly, even if the active-matrix substrate 203 has been exposed to some light that has come from under the base substrate 40, no light will enter the semiconductor layer 38. Consequently, it is possible to prevent any leakage current from being induced optically in the transistors to be defined by the function line 216.

Figure 60:
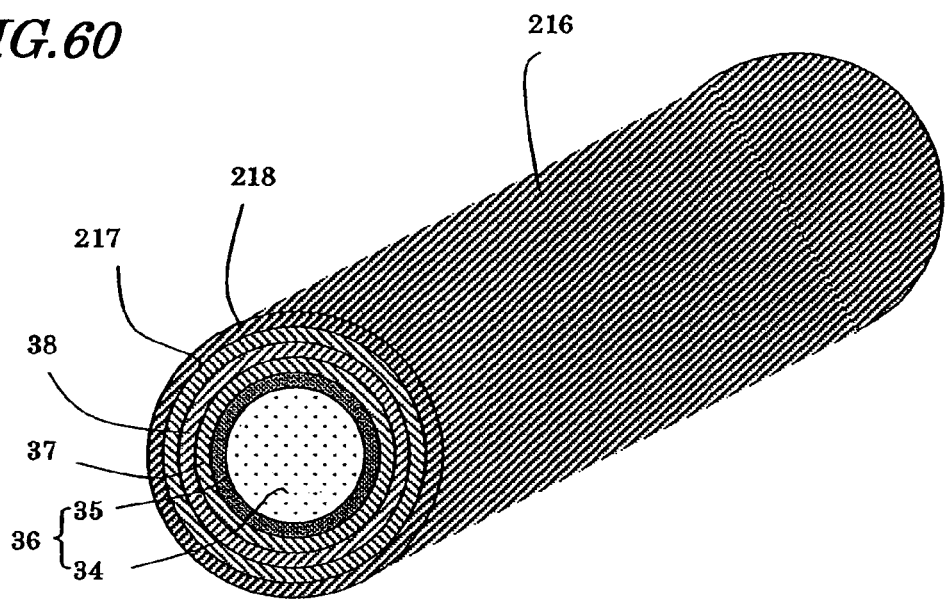
FIG. 60 is a perspective view illustrating a function line for use in the active-matrix substrate shown in FIG. 59.

The active-matrix substrate 203 may be fabricated in the following manner, for example. First, as shown in FIG. 60, the respective layers of the function line 216 are sequentially deposited according to the first or second preferred embodiment described above until the semiconductor layer 38 is formed. Next, an insulating protective coating 217 and an opaque layer 218 made of the materials described above are deposited thereon.

Figure 61:
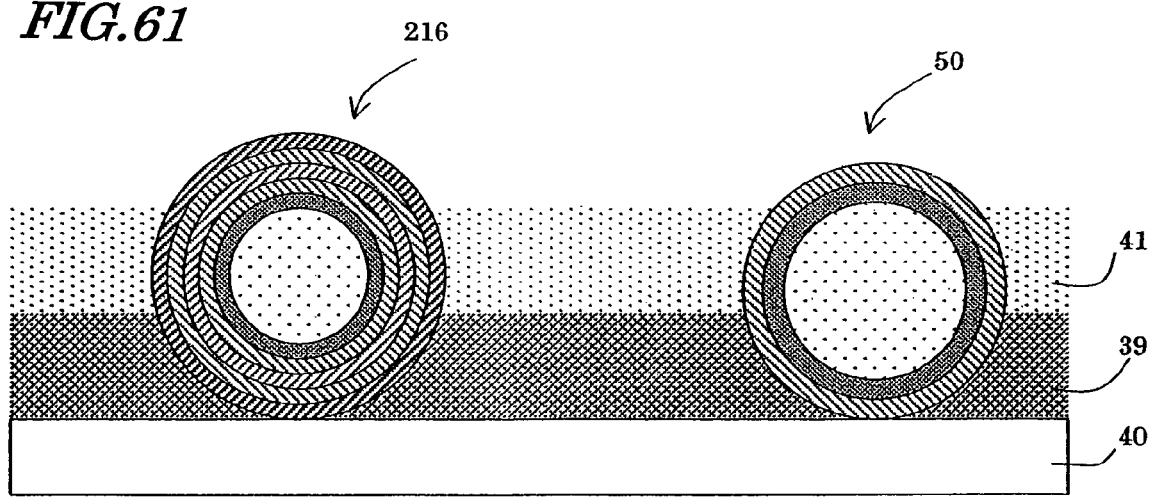
FIG. 61 is a cross-sectional view showing a process step for fabricating the active-matrix substrate shown in FIG. 59.
Figure 62:
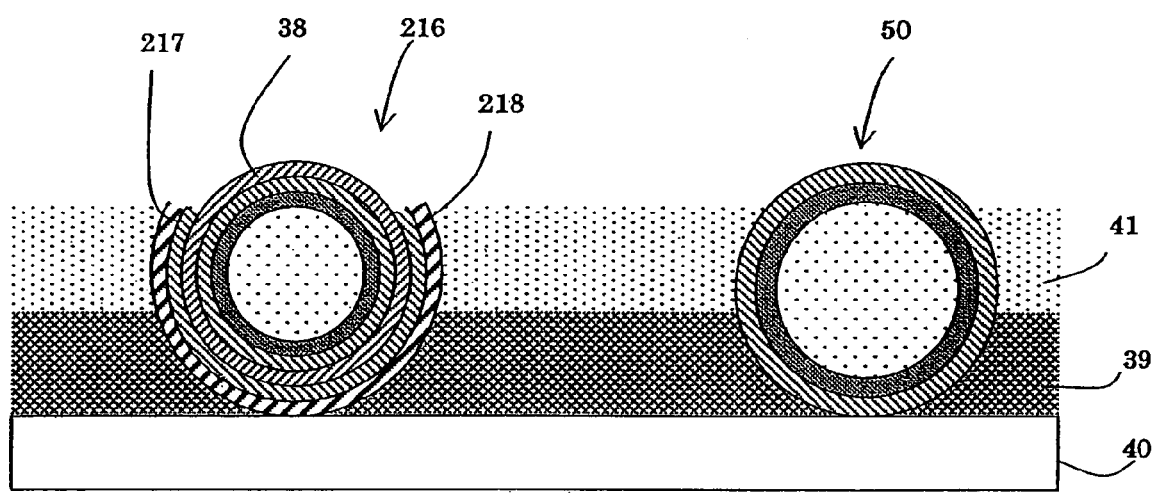
FIG. 62 is a cross-sectional view showing another process step for fabricating the active-matrix substrate shown in FIG. 59.
Figure 63:
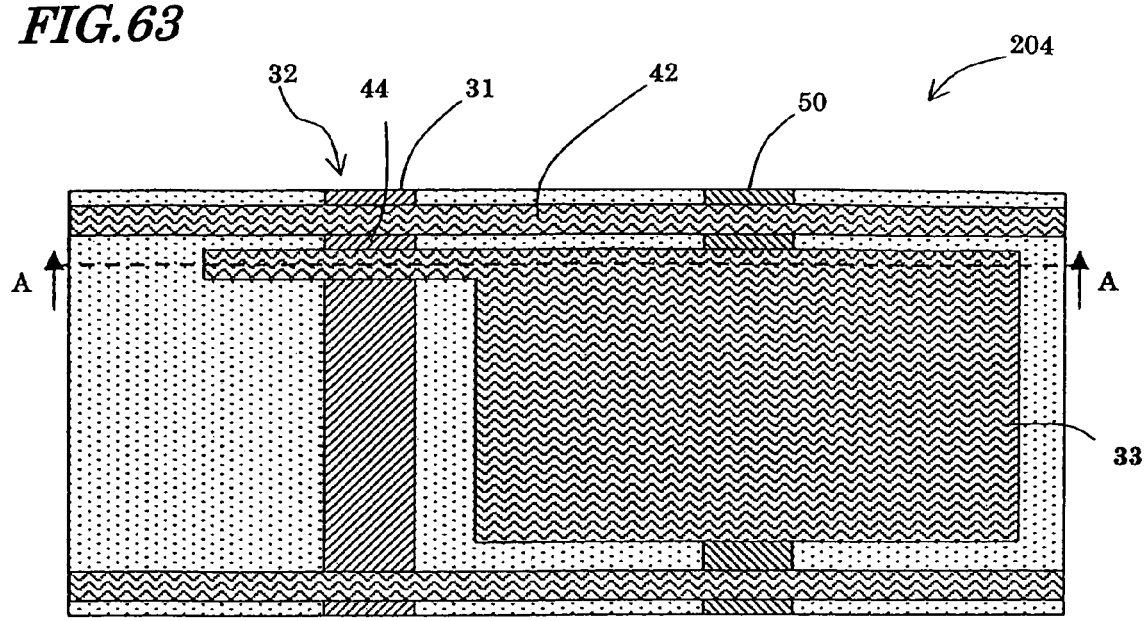
FIG. 63 is a plan view illustrating an active-matrix substrate according to a tenth preferred embodiment.

Thereafter, as shown in FIG. 61, the function line 216 and storage capacitor line 50 are fixed onto the base substrate 40 with the adhesive layer 39 and then a planarizing layer 41 is deposited thereon by the same methods as those adopted in the second preferred embodiment. Subsequently, as shown in FIG. 62, portions of the function line 216, which are exposed on the planarizing layer 41 (i.e., a portion of the insulating protective coating 217 and a portion of the opaque layer 218), are etched away, thereby exposing the semiconductor layer 38.

Finally, data lines 42 consisting of an n$^+$ layer 42*a* and a metal layer 42*b*, drain electrodes, pixel electrodes and so on (not shown) are formed, thereby completing the active-matrix substrate 203.

Embodiment 10

Hereinafter, an active-matrix substrate 204 according to a tenth preferred embodiment will be described with reference to FIGS. 63 through 66. The active-matrix substrate 204 of the tenth preferred embodiment is different from the active-matrix substrate 30 of the second preferred embodiment in that the active-matrix substrate 204 includes an adhesive layer 220 with light blocking ability and a planarizing layer 221 with light blocking ability.

Figure 64:
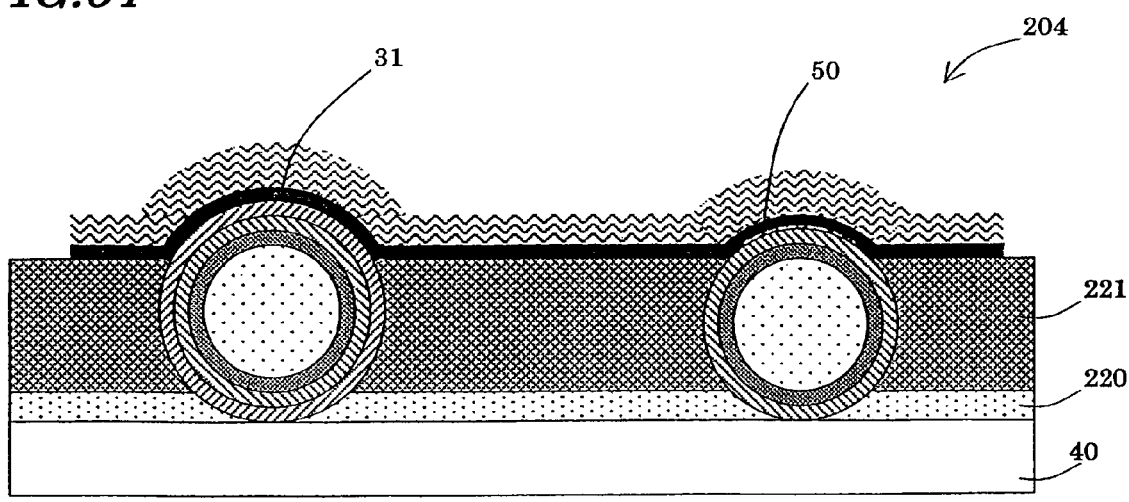
FIG. 64 is a cross-sectional view thereof taken on the plane A-A shown in FIG. 63.

In the active-matrix substrate 204 shown in FIG. 64, the adhesive layer 220 is made of an epoxy resin in which a black pigment is dispersed and the planarizing layer, 221 is made of an acrylic resin in which a black pigment is dispersed. The adhesive layer 220 and planarizing layer 221 are made light blocking by the black pigments dispersed therein.

Accordingly, even if the active-matrix substrate 204 is exposed to light that has come from under the base substrate 40, the light is blocked by the adhesive layer 220 and planarizing layer 221 so as not to enter the semiconductor layer 38 of the function line 31. As a result, it is possible to prevent any leakage current from being induced optically in the channel 44 of transistors to be defined by the function line 31.

Figure 65:
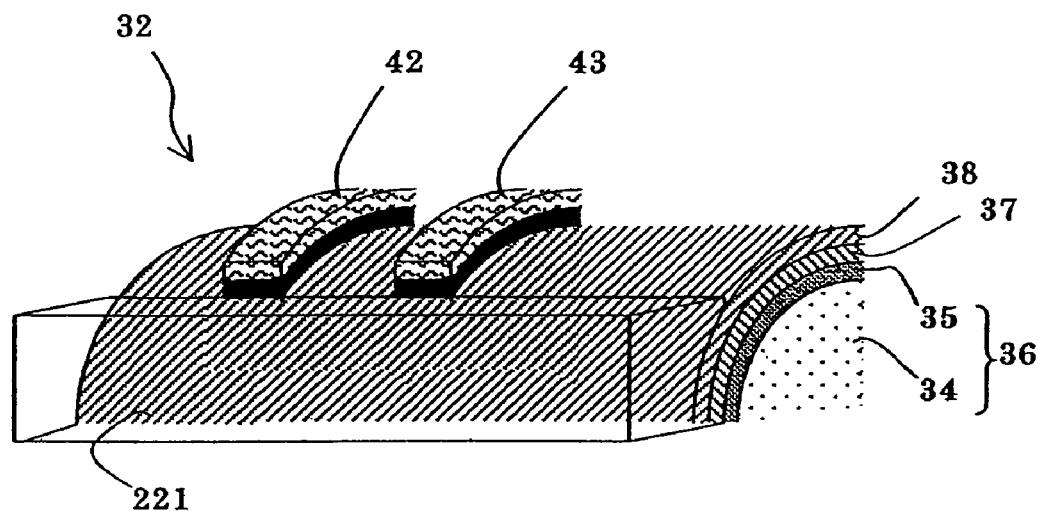
FIG. 65 is a perspective view illustrating a transistor and its surrounding portion of the active-matrix substrate shown in FIG. 59.

To prevent any leakage current from being induced optically due to the light coming through the counter substrate (i.e., the side of the active-matrix substrate 204 including the pixel electrodes 33), the exposed portions of the semiconductor layer 38 on the planarizing layer 221 may be removed. For example, by etching the semiconductor layer 38 with the data line 42 and drain electrode 43 used as a mask as shown in FIG. 65, exposed portions of the semiconductor layer 38 on the planarizing layer 221 can be removed as shown in FIG. 66.

In such a structure, even if the active-matrix substrate 204 is exposed to light that has come through the counter substrate, no portions of the semiconductor layer 38 are exposed on the planarizing layer 221, and therefore, no leakage current will be induced optically.

Meanwhile, other portions 38*c* of the semiconductor layer 38, remaining under the planarizing layer 221, are not exposed to light, but are electrically connected to the data line 42 and drain electrode 43 by way of other portions 38*a* and 38*b* of the semiconductor layer 38 remaining under the data line 42 and drain electrode 43, respectively. Accordingly, a channel is defined by the data line 42 and drain electrode 43 in a region 38*d* near the end of the semiconductor layer 38*c* and between the data line 42 and drain electrode 43. As a result, the transistor 32 can operate without being affected by the incoming light.

Figure 66:
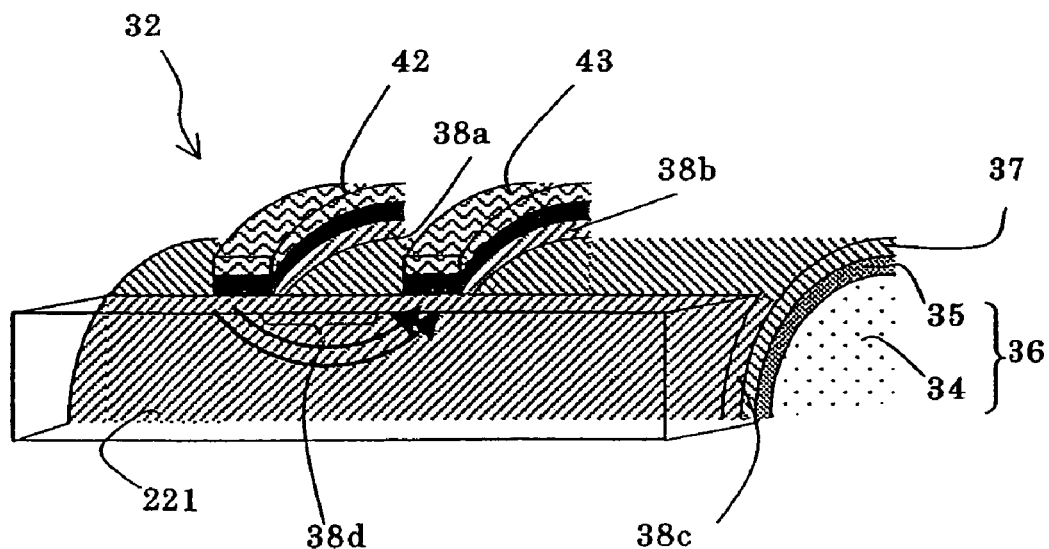
FIG. 66 is a perspective view showing where electrons flow in the structure illustrated in FIG. 65 with the semiconductor layer thereof removed.

In the preferred embodiment described above, the exposed portions of the semiconductor layer 38 on the planarizing layer 221 are removed entirely as shown in FIG. 66. However, a portion of the semiconductor layer 38 located between the data line 42 and drain electrode 43 may be left without being removed and only other portions of the semiconductor layer 38 may be removed from between adjacent transistors. Even in such a structure, the exposed portions of the semiconductor layer 38 on the planarizing layer 221 still have a significantly reduced total area and the unwanted effects of the optically induced leakage current can be minimized.

Embodiment 11

Figure 67:
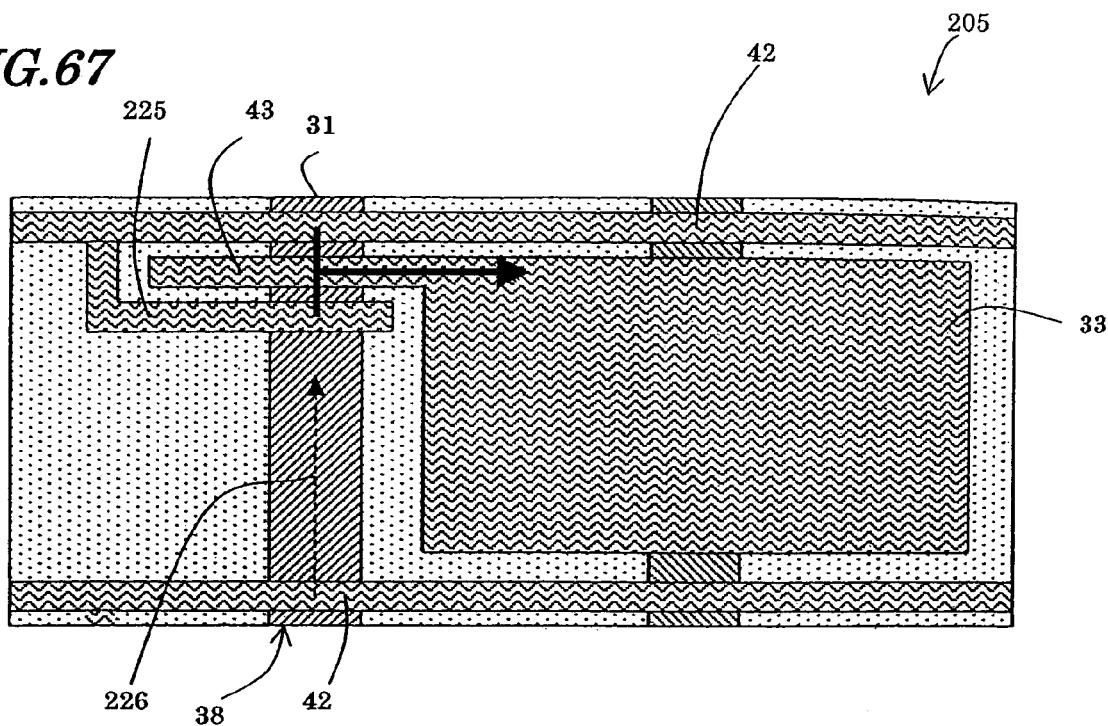
FIG. 67 is a plan view illustrating an active-matrix substrate according to an eleventh preferred embodiment.

Hereinafter, an active-matrix substrate 205 according to an eleventh preferred embodiment will be described with reference to FIGS. 67 and 68. The active-matrix substrate 205 is different from the active-matrix substrate 30 of the second preferred embodiment in that the data line 42 has a branch 225.

Figure 68:
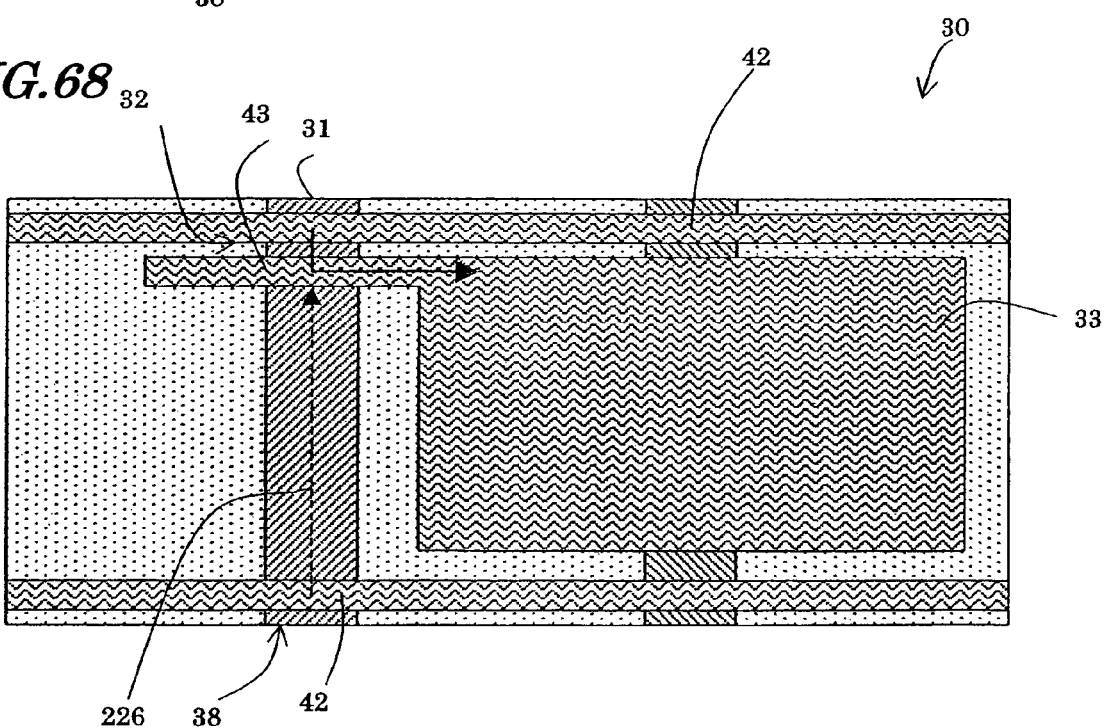
FIG. 68 is a plan view illustrating an active-matrix substrate according to the eleventh preferred embodiment.

In the active-matrix substrate 30 of the second preferred embodiment, the semiconductor layer 38 is left over the entire surface of the function line 31 as shown in FIG. 68. If the transistors 32 are arranged on the function line 31 at a sufficiently broad interval, then only a negligible amount of leakage current flows between the pixel electrode 33 and the data line 42 of an adjacent pixel (i.e., the lower data line in FIG. 68). In making a display device with a very high definition, however, the drain electrode 43 of the transistor 32 may be affected by the potential on the adjacent data line 42 as indicated by the dashed line 226. In that case, the display quality may deteriorate.

To overcome this problem, the data line 42 includes a branch 225 as a third conductive layer in the active-matrix substrate 205 of this preferred embodiment. The branch 225 is connected to the data line 42, and extends substantially parallel to the data line 42 such that the drain electrode 43 is sandwiched between the data line 42 and the branch 225. Just like the data line, a portion of the branch 225 overlaps with the semiconductor layer 38 of the function line and the other portions thereof are provided over the planarizing layer (not shown). It should be noted that the semiconductor layer 38 only needs to be provided between the adjacent data line 42 and the branch 225 and does not have to be provided over the entire surface of the function line 31.

In such a structure, the branch 225 can eliminate the unwanted effects that might be caused by the potential on the adjacent data line 42 (as indicated by the dashed line 226). Accordingly, even a semiconductor layer 38 with a relatively low resistance is no longer affected by the adjacent data line 42. As a result, a high-definition display device is realized.

Embodiment 12

Hereinafter, an active-matrix substrate 206 according to a twelfth preferred embodiment will be described with reference to FIGS. 69 through 72. The active-matrix substrate 206 of the twelfth preferred embodiment is different from the active-matrix substrate 205 of the eleventh preferred embodiment in that the semiconductor layer 231 of-the function line 230 is provided with a plurality of grooves 232 so as to be divided into a number of regions.

Figure 69:
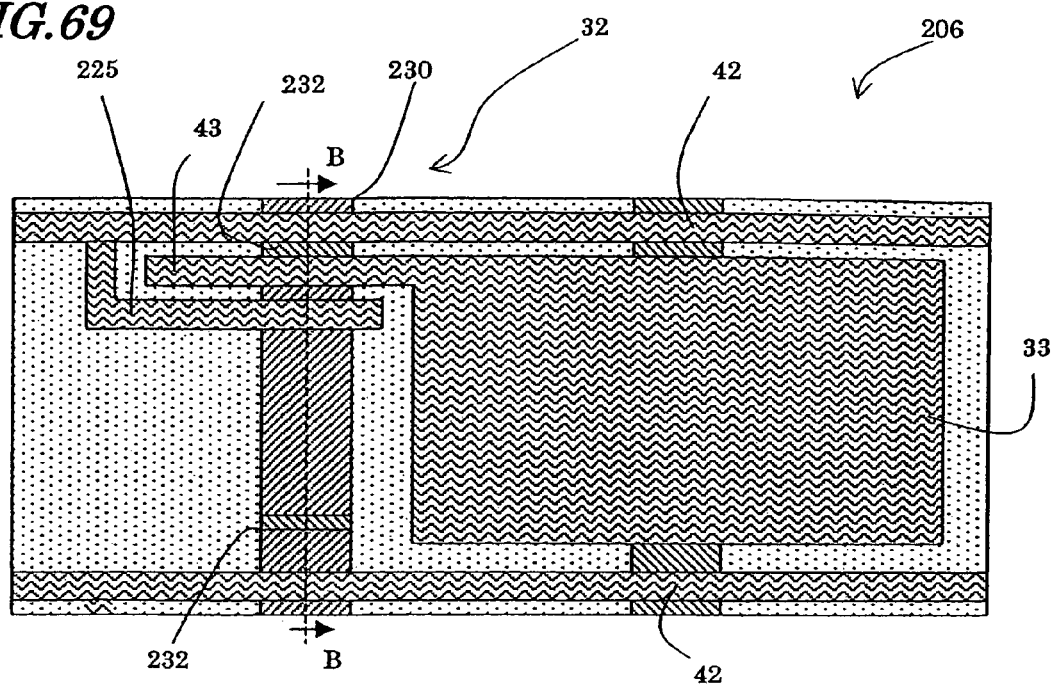
FIG. 69 is a plan view illustrating another active-matrix substrate according to the eleventh preferred embodiment.
Figure 70:
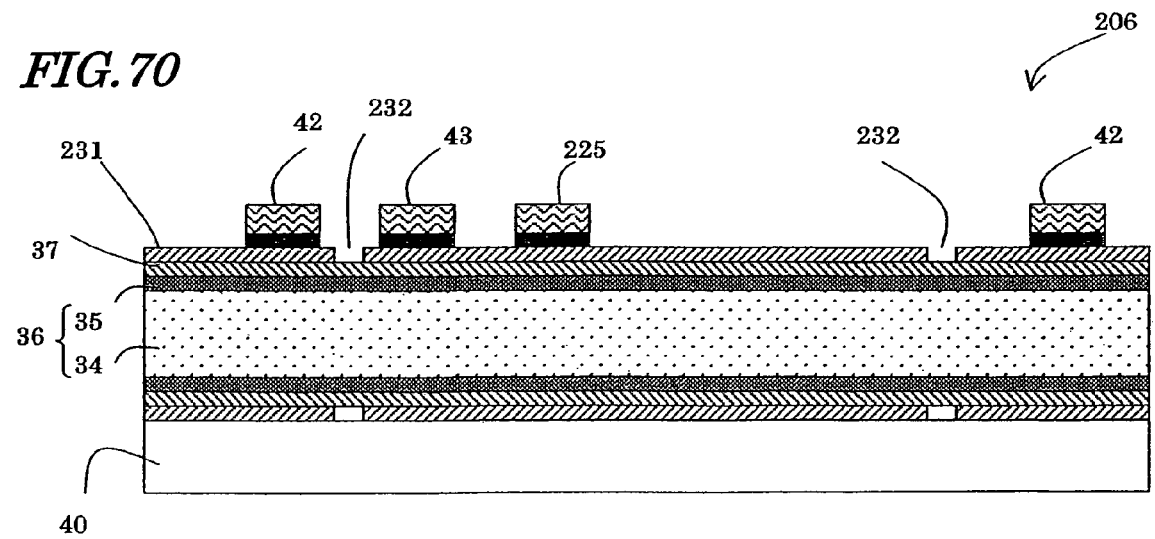
FIG. 70 is a cross-sectional view thereof taken on the plane B-B shown in FIG. 69.
Figure 71:
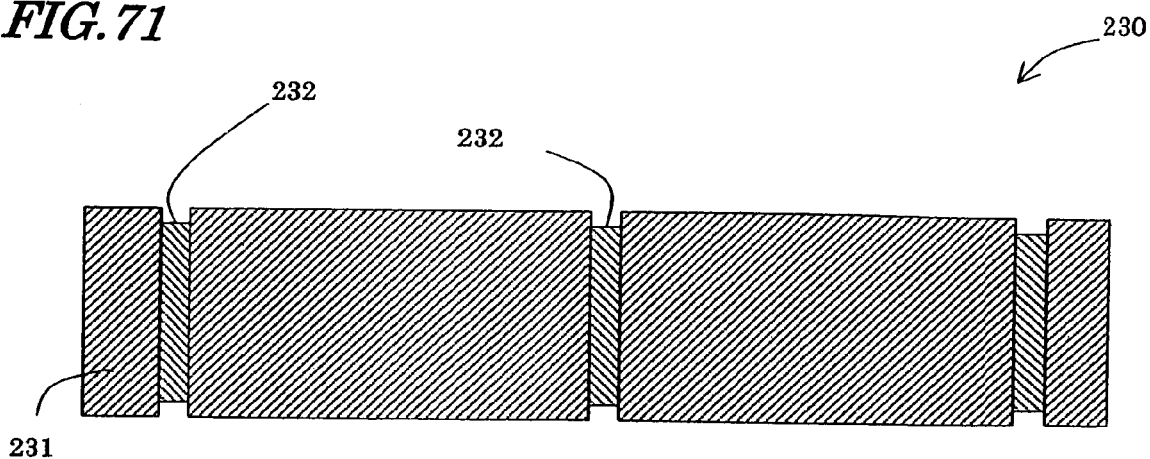
FIG. 71 is a plan view illustrating a function line for use in the active-matrix substrate shown in FIG. 69.

As shown in FIG. 71, the semiconductor layer 231 of the function line 230 is provided with a plurality of grooves 232. Each of those grooves 232 extends around the outer surface of the function line 231 perpendicularly to the length direction so as to expose the insulating layer 37 inside of the semiconductor layer 231. The semiconductor layer 231 is divided into a number of regions by the grooves 232. In FIGS. 69 and 70, one groove 232 is located between the data line 42 and the drain electrode 43 and another groove 232 is located between the branch 225 and the data line 42 of the adjacent pixel (i.e., the lower data line in FIG. 69). By providing the groove 232 between the adjacent data line 42 and the branch 225, the unwanted effects that might be caused by the potential on the data line 42 of the adjacent pixel upon the transistor 32 can be totally eliminated.

If the groove 232 is located between the data line 42 and the drain electrode 43, then the channel between the data line 42 and drain electrode 43 is cut off and the transistor 32 does not work in this portion. However, since no groove 232 is provided between the drain electrode 43 and the branch 225, the transistor 32 does work in this portion.

Figure 72:
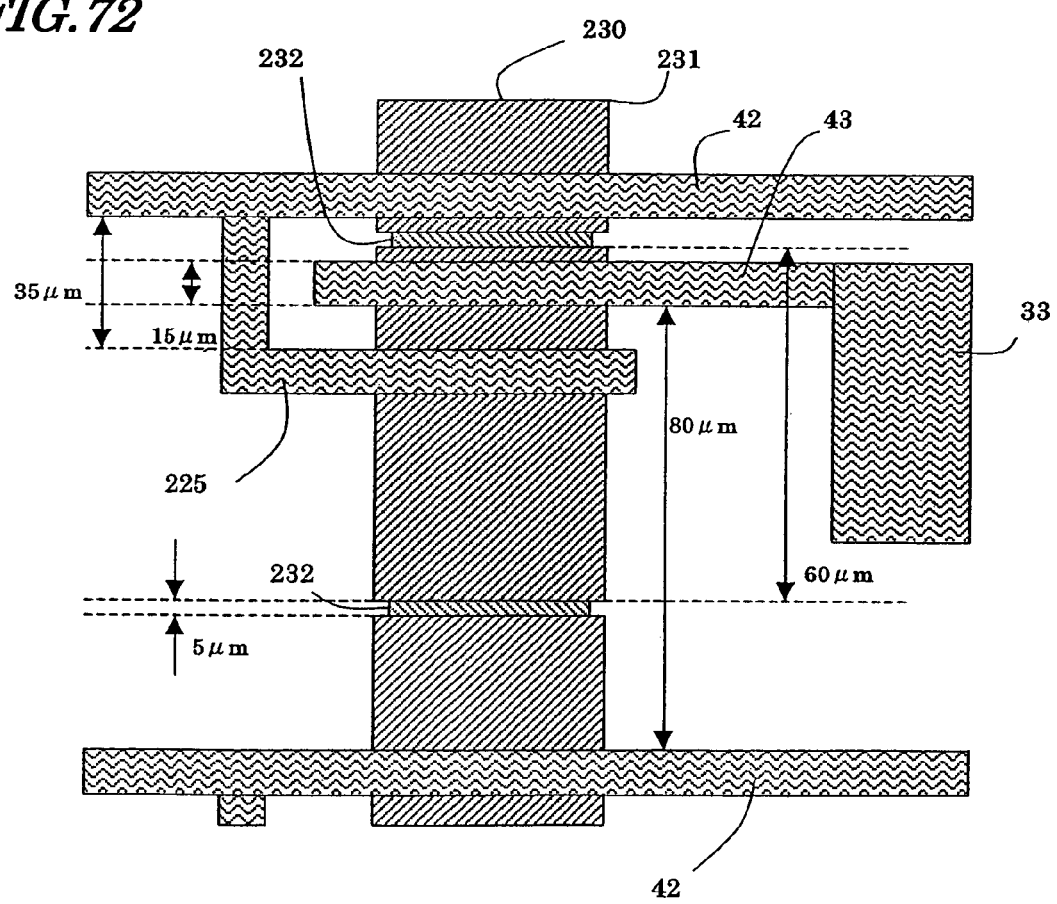
FIG. 72 is a plan view showing the arrangement of respective components in the active-matrix substrate shown in FIG. 69.
Figure 73:
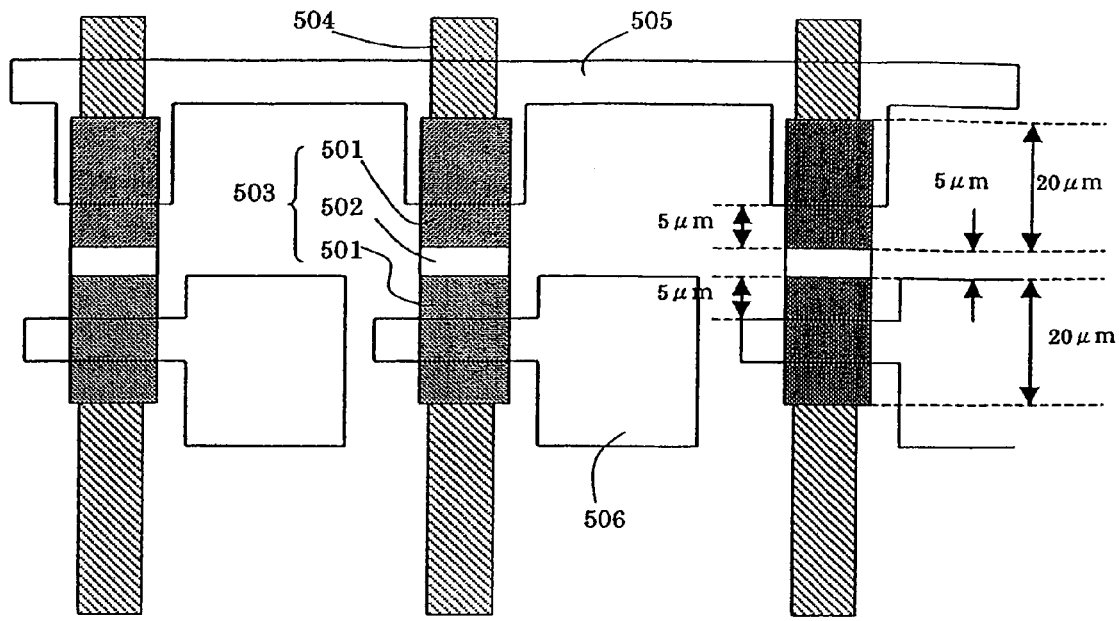
FIG. 73 is a plan view illustrating a conventional active-matrix substrate.
Figure 74:
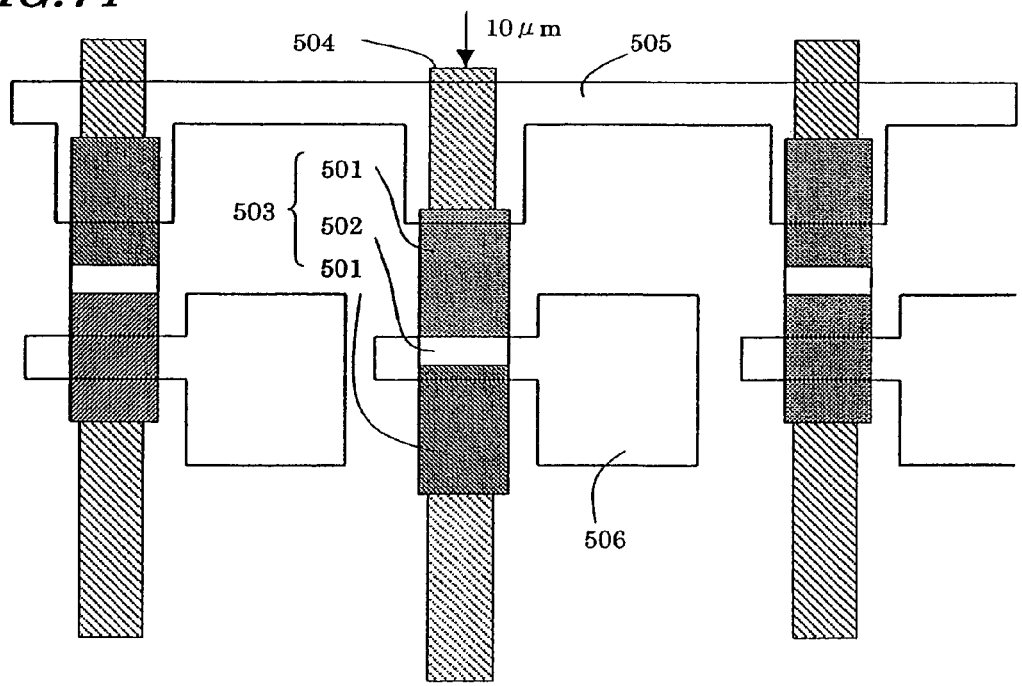
FIG. 74 is a plan view illustrating a situation where some components have been misaligned with each other in the active-matrix substrate shown in FIG. 73.
Figure 75:
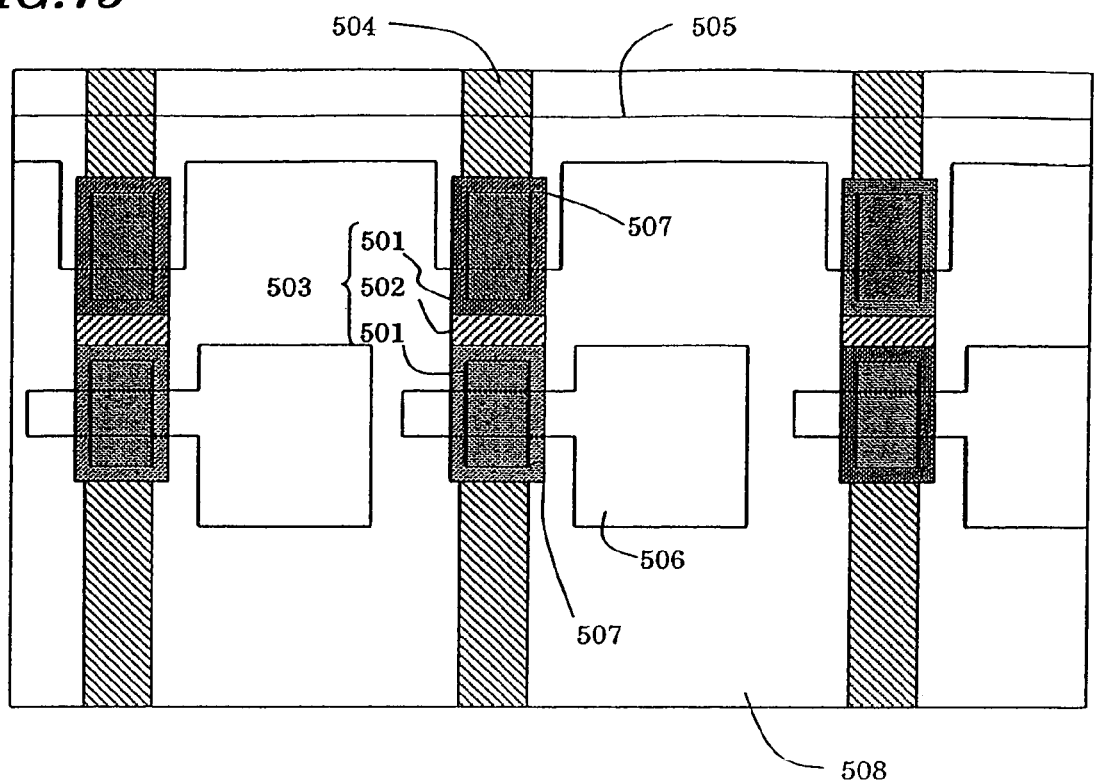
FIG. 75 is a plan view illustrating another conventional active-matrix substrate.
Figure 76:
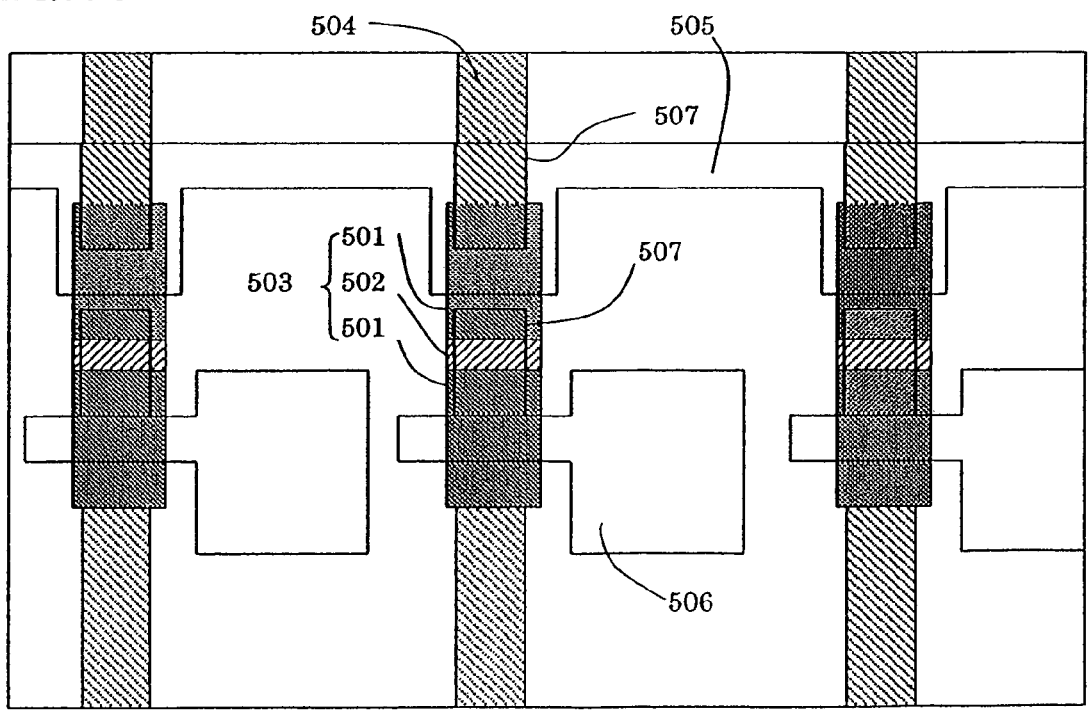
FIG. 76 is a plan view illustrating a situation where some components have been misaligned with each other in the active-matrix substrate shown in FIG. 75.

The width and interval of the grooves 232 are defined such that even if the data lines 42, branches 225 and drain electrodes 43 have shifted with respect to the function line 230 in the length direction thereof, no transistors 32 will become defective but the unwanted effects of the adjacent data lines 42 are eliminated. The width and interval of the grooves 232 may be defined in the following manner. In this case, suppose the drain electrode 43 and branch 225 have a width of 15 µm, the gap between the data line 42 and drain electrode 43 and the gap between the drain electrode 43 and branch 225 are 10 µm, and the gap between the drain electrode 43 and the data line 42 of the adjacent pixel is 80 µm as shown in FIG. 72.

First of all, the width of the grooves 232 needs to be smaller than that of the drain electrode 43. This is because if the width of the grooves 232 was greater than that of the drain electrode 43, then one of the grooves 232 could have its ends located on both sides of the drain electrode 43 so as to be separated from both the data line 42 and branch 225 alike.

The interval between the grooves 232 (not including the width of the grooves 232 themselves) needs to be smaller than the gap between the drain electrode 43 and the data line 42 of the adjacent pixel. Otherwise, there would be no grooves 232 between the drain electrode 43 and the data line 42 of the adjacent pixel and the leakage could not be eliminated. Furthermore, the interval between the grooves 232 needs to be greater than the gap between the data line 42 and the branch 225 (not including the respective line widths thereof). Otherwise, one of the grooves 232 could be located between the drain electrode 43 and the data line 42 and another groove 232 between the drain electrode 43 and the branch 225, respectively, thus possibly making the transistor 32 completely inoperative.

In view of these considerations, the interval between the grooves 232 is set to 60 µm in this preferred embodiment. By adopting this value, even if the branch 225 and drain electrode 43 have shifted with respect to the function line 230 in the length direction thereof, no transistors 32 will become defective and the unwanted effects of the adjacent data line 42 can be eliminated.

The first through twelfth preferred embodiments of the present invention described above may be implemented in various combinations. For example, the sixth and seventh preferred embodiments may be combined with each other or the seventh and twelfth preferred embodiments may be combined with each other as well. Also, a preferred embodiment of the active-matrix substrate is applicable for use in an image display device such as a liquid crystal display device or an organic EL display device, for instance.

In the transistor arrays and active-matrix substrates of the second through twelfth preferred embodiments described above, the function lines are fixed onto the base substrate and the gap between the function lines is filled with the planarizing layer, for example. However, if the planarizing layer, filling the gap between the function lines, has hardness and flexibility that are appropriately adjusted to the intended application and can support various thin film circuits to be provided on the function lines and planarizing layer, then the transistor array or active-matrix substrate may have no base substrate. In that case, the base substrate may be removed after the gap between the function lines or between the storage capacitor lines has been filled with the planarizing layer, for example.

Furthermore, in the second through twelfth preferred embodiments described above, the drain electrode and data line to be the first and second conductive layers, respectively, are provided such that portions thereof overlap with the semiconductor layer of the function line and that other portions thereof are located on the planarizing layer. However, the stacking order of the first and second conductive layers and the semiconductor layer may also be reversed. That is to say, the first and second conductive layers may be provided on the base substrate first, and then the function lines may be fixed on the base substrate so as to overlap with them with the surface of the semiconductor exposed. Even so, a transistor array including the first and second conductive layers, some portions of which are overlapped by the semiconductor layer and other portions not, can be obtained. In that case, when the function lines are fixed onto the base substrate so as to make contact with the first and second conductive layers, the transistor channels are also defined in the semiconductor layer of the function lines. Accordingly, even in such a structure, there is no need to align the function lines with the base substrate in the length direction of the function lines and the various effects as already described for the second preferred embodiment are also achieved.

In the first through twelfth preferred embodiments, the description of the present invention is mainly focused on preferred embodiments of function lines and active-matrix substrates. However, as already described for the second preferred embodiment, the present invention also relates to a transistor array and is applicable for use in a semiconductor device including any of various transistor arrays other than. the active-matrix substrate.

For example, the transistor array of the present invention may be used as a cell amplifier for a CMOS image sensor. The transistor array according to the present invention may also be used in any of numerous types of semiconductor devices including an array of transistors as either switching elements or amplifiers.

Furthermore, function lines functioning as solar cells or CCD sensors may also be formed. Thus, a brand new type of semiconductor device may be obtained by combining these function lines with the transistor array or active-matrix substrate according to the present invention. For example, an image pickup device may be obtained by arranging function lines, functioning as CCD sensors, adjacent to an image display device that uses the active-matrix substrate according to the present invention. Furthermore, driver circuits as described for the third preferred embodiment and function lines functioning as solar cells are arranged around the image display device and the image pickup device. A semiconductor device having such a structure realizes an image display and image pickup device that can operate for a long time without using any external batteries. It has been difficult to realize such a composite semiconductor device, having two totally different structures and using two completely different types of thin films (e.g., semiconductor layers, in particular), by the conventional process. However, such a composite semiconductor device is also easily realizable by using the function lines, transistor array and active-matrix substrate according to the present invention.

In the semiconductor layer of the function line of the present invention, no semiconductor device active regions to operate the semiconductor layer as devices are defined. Accordingly, the semiconductor device active regions may be defined in the semiconductor layer after the function line has been fixed onto a substrate, for example. In other words, in fixing the function line onto the substrate, there is almost no concern about misalignment. Also, the semiconductor layer of the function line is coated with the insulating layer, and therefore, there is no need to worry about the oxidation or corrosion of the semiconductor layer. Thus, the function line can also be stored in the air. As a result, a semiconductor device can be easily fabricated with the function lines of the present invention.

In the transistor array, active-matrix substrate and methods for fabricating the transistor array and active-matrix substrate according to the present invention, a transistor including a highly electrically insulating layer and a semiconductor layer with a high electron mobility, which have been formed at high temperatures, may be provided on a substrate of which the heat resistance temperature is relatively low. Accordingly, by using a substrate of a plastic, for example, for the transistor array or active-matrix substrate, a flexible transistor array or active-matrix substrate is realizable.

Also, some portions of the first and second conductive layers, defining the channel of transistors, overlap with the semiconductor layer, but the others not. Such a structure can be obtained by forming the first and second conductive layers after the function lines, in which no semiconductor device active regions to operate the semiconductor layer as devices have been defined yet, have been fixed onto the base substrate. Accordingly, in fixing the function lines onto the base substrate, there is no need to align the function lines with the base substrate. As a result, a transistor array and an active-matrix substrate, in which multiple transistors are arranged on the base substrate without causing any misalignment, can be obtained.

Also, by using either function lines with NMOS and PMOS transistors or a foil substrate with NMOS and PMOS transistors in a driver circuit, it is possible to provide a driver circuit, made up of CMOS devices, on a substrate with a low heat resistance temperature. As a result, a flexible active-matrix substrate, including peripheral circuits such as the driver circuit, is realized.

The invention claimed is:

1. A function line comprising:
   a core, at least the surface of which has electrical conductivity;
   a first insulating layer covering the surface of the core;
   a semiconductor layer covering the first insulating layer; and
   a second insulating layer covering the semiconductor layer; wherein
   the core includes an electrically insulating fine wire and a conductive layer covering the fine wire.

2. The function line of claim 1, wherein the first insulating layer, the semiconductor layer and the second insulating layer cover substantially the entire core.

3. The function line of claim 1, wherein the core has a diameter of 5 µm to 1,000 µm.

4. The function line of claim 1, wherein the semiconductor layer is made of a transparent semiconductor.

5. The function line of claim 1, further comprising an opaque layer, which is provided to cover the second insulating layer.

6. The function line of claim 1, wherein the second insulating layer has light blocking ability.

7. The function line of claim 1, wherein the second insulating layer has a thickness of at least 10 nm.

8. A transistor array comprising:
   a plurality of function lines, each including a core, an insulating layer covering the surface of the core, and a semiconductor layer covering the insulating layer;
   a fixing structure for fixing the relative arrangement of the function lines; and
   a plurality of transistors, each including a first conductive layer and a second conductive layer; wherein
   some portions of the first and second conductive layers overlap with the respective semiconductor layers of the function lines but not other portions;
   the transistors are provided to have their channel defined as a region in the semiconductor layer by the first and second conductive layers; and
   the core includes an electrically insulating fine wire and a conductive layer covering the fine wire.

9. The transistor array of claim 8, wherein the insulating layer and the semiconductor layer cover substantially the entire core.

10. The transistor array of claim 8, wherein the core has a diameter of 5 µm to 1,000 µm.

11. The transistor array of claim 8, wherein the semiconductor layer is made of a transparent semiconductor.

12. The transistor array of claim 8, further comprising an opaque layer, which is provided to cover the semiconductor layer.

13. The transistor array of claim 8, wherein the fixing structure includes a planarizing layer that fills in gaps between the function lines.

14. The transistor array of claim 8, wherein the core has a tensile strength of 100 MPa to 1,000 MPa along its length.

15. The transistor array of claim 8, wherein after the insulating layer and the semiconductor layer have been deposited to cover the core, the function lines are fixed with the fixing structure.

16. The transistor array of claim 15, wherein each of the function lines has a plurality of grooves that divide the semiconductor layer into multiple sections such that each of the plurality of grooves cross the length of the function line.

17. A transistor array comprising:
a plurality of function lines, each including a core, an insulating layer covering the surface of the core, and a semiconductor layer covering the insulating layer;
a fixing structure for fixing the relative arrangement of the function lines; and
a plurality of transistors, each including a first conductive layer and a second conductive layer; wherein
at least the surface of the core is electrically conductive;
some portions of the first and second conductive layers overlap with the respective semiconductor layers of the function lines but not other portions;
the transistors are provided to have their channel defined as a region in the semiconductor layer by the first and second conductive layers; and
each said transistor further includes a third conductive layer, which is connected to the second conductive layer;
some portions of the third conductive layer overlap with the semiconductor layer but not other portions; and
the first conductive layer is sandwiched between the second and third conductive layers.

18. An active-matrix substrate comprising:
a plurality of function lines, each including a core, an insulating layer covering the surface of the core, and a semiconductor layer covering the insulating layer;
a fixing structure for fixing the relative arrangement of the function lines;
a plurality of transistors, each including a first conductive layer and a second conductive layer; wherein
some portions of the first and second conductive layers overlap with the respective semiconductor layers of the function lines but not other portions;
the transistors are provided to have their channel defined as a region in the semiconductor layer by the first and second conductive layers;
a plurality of pixel electrodes are electrically connected to the first conductive layer; and
the core includes an electrically insulating fine wire and a conductive layer covering the fine wire.

19. An active-matrix substrate comprising:
a plurality of function lines, each including a core, an insulating layer covering the surface of the core, and a semiconductor layer covering the insulating layer;
a fixing structure for fixing the relative arrangement of the function lines;
a plurality of transistors, each including a first conductive layer and a second conductive layer; wherein
at least the surface of the core is electrically conductive;
some portions of the first and second conductive layers overlap with the respective semiconductor layers of the function lines but not other portions;
the transistors are provided to have their channel defined as a region in the semiconductor layer by the first and second conductive layers;
a plurality of pixel electrodes are electrically connected to the first conductive layer;
each said transistor further includes a third conductive layer, which is connected to the second conductive layer;
some portions of the third conductive layer overlap with the semiconductor layer but not other portions; and
the first conductive layer is sandwiched between the second and third conductive layers.

20. The active-matrix substrate of claim 19, wherein each of the function lines has a plurality of grooves that divide the semiconductor layer into multiple sections such that each of the plurality of grooves crosses the length of the function line.

21. An active-matrix substrate comprising:
a plurality of function lines, each including a core, an insulating layer covering the surface of the core, and a semiconductor layer covering the insulating layer;
a fixing structure for fixing the relative arrangement of the function lines;
a plurality of transistors, each including a first conductive layer and a second conductive layer; wherein
at least the surface of the core is electrically conductive;
some portions of the first and second conductive layers overlap with the respective semiconductor layers of the function lines but not other portions;
the transistors are provided to have their channel defined as a region in the semiconductor layer by the first and second conductive layers;
a plurality of pixel electrodes are electrically connected to the first conductive layer; and
a plurality of storage capacitor lines, each including a core, the surface of which is electrically conductive, and an insulating layer covering the surface of the core, the storage capacitor lines overlapping with each other under the pixel electrodes.

22. The active-matrix substrate of claim 21, wherein the insulating layer and the semiconductor layer cover substantially the entire core.

23. The active-matrix substrate of claim 21, wherein the core is made of a metal.

24. The active-matrix substrate of claim 21, wherein the core has a diameter of 5 μm to 1,000 μm.

25. The active-matrix substrate of claim 21, wherein the semiconductor layer is made of a transparent semiconductor.

26. The active-matrix substrate of claim 21, wherein the core has a tensile strength of 100 MPa to 1,000 MPa along its length.

27. The active-matrix substrate of claim 21, wherein after the insulating layer and the semiconductor layer have been deposited to cover the core, the function lines are fixed with the fixing structure.

28. The active-matrix substrate of claim 21, wherein the fixing structure includes a planarizing layer that fills in gaps between the function lines.

29. The active-matrix substrate of claim 21, wherein the fixing structure includes a base substrate and an adhesive layer, the function lines being bonded onto the base substrate with the adhesive layer.

30. The active-matrix substrate of claim 29, wherein the base substrate has a plurality of grooves on the surface thereof, at least some of the function lines being bonded onto the base substrate with the adhesive layer to be embedded in the grooves.

31. The active-matrix substrate of claim 30, wherein the adhesive layer includes a light blocking substance.

32. The active-matrix substrate of claim 28, wherein the planarizing layer includes a light blocking substance.

33. The active-matrix substrate of claim 21, wherein the base substrate is made of a plastic with elasticity.

34. The active-matrix substrate of claim 21, wherein the second conductive layer is a data line.

35. The active-matrix substrate of claim 21, wherein the second conductive layer is a reference potential supply line.

36. A display device comprising: the active-matrix substrate of claim 21; a counter substrate; and a display medium layer sandwiched between the substrates.

37. A method for fabricating an active-matrix substrate, the method comprising the steps of:
- preparing a plurality of function lines, each including a core, an insulating layer covering the surface of the core, and a semiconductor layer covering the insulating layer;
- fixing the relative arrangement of the function lines with a fixing structure;
- providing a first conductive layer and a second conductive layer where some portions of the first and second conductive layers overlap with the respective semiconductor layers of the function lines but not other portions, thereby forming a plurality of transistors having their channel defined as a region in the semiconductor layer by the first and second conductive layers; and
- forming a plurality of pixel electrodes that are electrically connected to the first conductive layer of the transistors; wherein
- at least the surface of the core is electrically conductive; and
- the step of fixing the relative arrangement includes the steps of:
  - bonding the function lines onto the fixing structure with an adhesive layer; and
  - at least partially filling in gaps between the function lines with a planarizing layer.

38. The active-matrix substrate fabricating method of claim 37, wherein the first conductive layer of the transistors and the pixel electrodes are formed simultaneously.

39. A method for fabricating an active-matrix substrate, the method comprising the steps of:
- preparing a plurality of function lines, each including a core, an insulating layer covering the surface of the core, and a semiconductor layer covering the insulating layer;
- fixing the relative arrangement of the function lines with a fixing structure;
- providing a first conductive layer and a second conductive layer where some portions of the first and second conductive layers overlap with the respective semiconductor layers of the function lines but not other portions, thereby forming a plurality of transistors having their channel defined as a region in the semiconductor layer by the first and second conductive layers; and
- forming a plurality of pixel electrodes that are electrically connected to the first conductive layer of the transistors; wherein
- at least the surface of the core is electrically conductive; and
- the step of fixing the relative arrangement includes the steps of:
  - pressing the function lines and a plurality of storage capacitor lines onto a plastically deformable layer, thereby embedding the function lines and the storage capacitor lines to a predetermined depth in the plastically deformable layer;
  - burying the exposed portions of the function lines and the storage capacitor lines in a curable resin on the base substrate; and
  - curing the curable resin and then removing the plastically deformable layer.

* * * * *